US012593509B2

(12) United States Patent
Yamazaki

(10) Patent No.: US 12,593,509 B2
(45) Date of Patent: Mar. 31, 2026

(54) TRANSISTOR AND METHOD FOR MANUFACTURING THE SAME

(71) Applicant: SEMICONDUCTOR ENERGY LABORATORY CO., LTD., Atsugi (JP)

(72) Inventor: Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 15 days.

(21) Appl. No.: 18/367,508

(22) Filed: Sep. 13, 2023

(65) Prior Publication Data

US 2024/0006418 A1     Jan. 4, 2024

Related U.S. Application Data

(60) Continuation of application No. 17/696,988, filed on Mar. 17, 2022, now abandoned, which is a division of
(Continued)

(30) Foreign Application Priority Data

Apr. 8, 2016    (JP) ................................. 2016-078286
Apr. 8, 2016    (JP) ................................. 2016-078347

(51) Int. Cl.
*H01L 27/12*         (2006.01)
*H10D 30/67*         (2025.01)
(Continued)

(52) U.S. Cl.
CPC ......... *H10D 86/60* (2025.01); *H10D 30/6723* (2025.01); *H10D 30/6734* (2025.01);
(Continued)

(58) Field of Classification Search
CPC ..... H01L 27/1225; H01L 29/24; H01L 29/45; H01L 29/518; H01L 29/66969;
(Continued)

(56) References Cited

U.S. PATENT DOCUMENTS 5,610,082 A    3/1997  Oh
7,229,862 B2   6/2007  Yamazaki et al.
(Continued)

FOREIGN PATENT DOCUMENTS

EP      1453088 A      9/2004
JP      2004-282050 A  10/2004
(Continued)

*Primary Examiner* — Jay C Kim
(74) *Attorney, Agent, or Firm* — Fish & Richardson P.C.

(57) ABSTRACT

An object is to provide a highly reliable transistor. In a bottom-gate transistor including an oxide semiconductor layer as a semiconductor layer where a channel is formed, an insulating layer containing excess oxygen is formed over the oxide semiconductor layer, and then an insulating layer through which impurities do not easily pass is formed without exposure to the air. As the insulating layer through which impurities do not easily pass, an aluminum oxide layer or the like can be used. When a conductive layer with a function of absorbing hydrogen is used for a source electrode and a drain electrode, the amount of hydrogen in the oxide semiconductor layer can be reduced.

16 Claims, 42 Drawing Sheets

<u>100A</u>

Related U.S. Application Data application No. 15/477,446, filed on Apr. 3, 2017, now Pat. No. 11,302,717.

(51) Int. Cl.
| | |
|---|---|
| *H10D 62/80* | (2025.01) |
| *H10D 64/62* | (2025.01) |
| *H10D 64/68* | (2025.01) |
| *H10D 86/40* | (2025.01) |
| *H10D 86/60* | (2025.01) |
| *H10D 99/00* | (2025.01) |
| *H10K 59/121* | (2023.01) |

(52) U.S. Cl.
CPC ..... *H10D 30/6755* (2025.01); *H10D 30/6757* (2025.01); *H10D 62/80* (2025.01); *H10D 64/62* (2025.01); *H10D 64/693* (2025.01); *H10D 86/423* (2025.01); *H10D 86/425* (2025.01); *H10D 99/00* (2025.01); *H10K 59/1213* (2023.02)

(58) Field of Classification Search
CPC ......... H01L 29/78633; H01L 29/78648; H01L 29/7869; H01L 29/78696; H10K 59/1213; H10D 86/60; H10D 30/6723; H10D 30/6734; H10D 30/6755; H10D 30/6757; H10D 62/80; H10D 64/62; H10D 64/693; H10D 86/423; H10D 86/425; H10D 99/00

See application file for complete search history.

(56) References Cited

U.S. PATENT DOCUMENTS

| | | | |
|---|---|---|---|
| 7,592,207 | B2 | 9/2009 | Nakamura et al. |
| 7,709,843 | B2 | 5/2010 | Yamazaki et al. |
| 7,791,072 | B2 | 9/2010 | Kumomi et al. |
| 7,915,075 | B2 | 3/2011 | Suzawa et al. |
| 7,923,722 | B2 | 4/2011 | Ryu et al. |
| 7,973,313 | B2 | 7/2011 | Arai et al. |
| 8,093,589 | B2 | 1/2012 | Sugihara et al. |
| 8,101,467 | B2 | 1/2012 | Yamazaki et al. |
| 8,129,717 | B2 | 3/2012 | Yamazaki et al. |
| 8,148,779 | B2 | 4/2012 | Jeong et al. |
| 8,193,532 | B2 | 6/2012 | Arai et al. |
| 8,237,166 | B2 | 8/2012 | Kumomi et al. |
| 8,242,496 | B2 | 8/2012 | Yamazaki et al. |
| 8,293,595 | B2 | 10/2012 | Yamazaki et al. |
| 8,304,765 | B2 | 11/2012 | Yamazaki et al. |
| 8,324,018 | B2 | 12/2012 | Isa et al. |
| 8,389,991 | B2 | 3/2013 | Morosawa et al. |
| 8,400,817 | B2 | 3/2013 | Yamazaki et al. |
| 8,410,002 | B2 * | 4/2013 | Yamazaki ............... H01L 29/24 |
| | | | 438/153 |
| 8,415,667 | B2 | 4/2013 | Yamazaki et al. |
| 8,432,187 | B2 | 4/2013 | Kato et al. |
| 8,445,905 | B2 | 5/2013 | Yamazaki et al. |
| 8,461,594 | B2 | 6/2013 | Morosawa et al. |
| 8,466,462 | B2 | 6/2013 | Chung et al. |
| 8,541,780 | B2 | 9/2013 | Yamazaki et al. |
| 8,547,771 | B2 | 10/2013 | Koyama |
| 8,629,438 | B2 | 1/2014 | Yamazaki |
| 8,704,216 | B2 | 4/2014 | Godo et al. |
| 8,742,418 | B2 * | 6/2014 | Morosawa .......... H01L 29/7869 |
| | | | 257/E29.299 |
| 8,766,269 | B2 | 7/2014 | Yamazaki et al. |
| 8,900,970 | B2 | 12/2014 | Maruyama et al. |
| 8,901,557 | B2 | 12/2014 | Yamazaki |
| 8,916,865 | B2 | 12/2014 | Yamazaki |
| 8,945,981 | B2 | 2/2015 | Yamazaki et al. |
| 8,952,381 | B2 | 2/2015 | Yamazaki |
| 8,995,174 | B2 | 3/2015 | Koyama |
| 9,006,024 | B2 | 4/2015 | Akimoto |

| | | | |
|---|---|---|---|
| 9,059,295 | B2 | 6/2015 | Yamazaki |
| 9,082,863 | B2 | 7/2015 | Yamazaki |
| 9,130,041 | B2 | 9/2015 | Yamazaki et al. |
| 9,147,768 | B2 | 9/2015 | Yamazaki |
| 9,153,699 | B2 | 10/2015 | Yamazaki |
| 9,171,803 | B2 | 10/2015 | Koezuka et al. |
| 9,190,420 | B2 * | 11/2015 | Nagayama ............. H10D 99/00 |
| 9,190,525 | B2 | 11/2015 | Yamazaki |
| 9,209,256 | B2 | 12/2015 | Tokunaga et al. |
| 9,236,408 | B2 | 1/2016 | Yamazaki |
| 9,240,525 | B2 | 1/2016 | Yamazaki et al. |
| 9,252,279 | B2 | 2/2016 | Watanabe et al. |
| 9,276,121 | B2 | 3/2016 | Yamazaki |
| 9,281,408 | B2 | 3/2016 | Yamazaki et al. |
| 9,293,589 | B2 | 3/2016 | Yamazaki et al. |
| 9,293,599 | B2 | 3/2016 | Hondo et al. |
| 9,293,602 | B2 | 3/2016 | Yamazaki |
| 9,318,618 | B2 | 4/2016 | Endo et al. |
| 9,331,207 | B2 | 5/2016 | Yamazaki et al. |
| 9,356,054 | B2 * | 5/2016 | Miyairi ............... H01L 27/1251 |
| 9,406,760 | B2 * | 8/2016 | Shimomura ........ H01L 29/7869 |
| 9,437,748 | B2 | 9/2016 | Miyairi et al. |
| 9,443,872 | B2 | 9/2016 | Miyairi |
| 9,466,615 | B2 | 10/2016 | Miyairi et al. |
| 9,496,408 | B2 | 11/2016 | Yamazaki et al. |
| 9,502,434 | B2 | 11/2016 | Tanaka et al. |
| 9,502,572 | B2 | 11/2016 | Yamazaki |
| 9,530,892 | B2 | 12/2016 | Koezuka et al. |
| 9,530,894 | B2 | 12/2016 | Koezuka et al. |
| 9,537,012 | B2 | 1/2017 | Yamazaki et al. |
| 9,589,988 | B2 | 3/2017 | Yamazaki et al. |
| 9,590,111 | B2 | 3/2017 | Yamazaki |
| 9,627,413 | B2 | 4/2017 | Okazaki et al. |
| 9,640,555 | B2 | 5/2017 | Okazaki et al. |
| 9,653,479 | B2 | 5/2017 | Miyairi et al. |
| 9,666,719 | B2 | 5/2017 | Yamazaki et al. |
| 9,666,721 | B2 | 5/2017 | Yamazaki |
| 9,709,865 | B2 | 7/2017 | Son et al. |
| 9,768,314 | B2 | 9/2017 | Koezuka et al. |
| 9,768,410 | B2 | 9/2017 | Yamazaki et al. |
| 9,780,226 | B2 | 10/2017 | Koezuka et al. |
| 9,799,685 | B2 | 10/2017 | Miyairi |
| 9,806,202 | B2 * | 10/2017 | Yamazaki ............. H10F 39/809 |
| 9,812,585 | B2 | 11/2017 | Yamazaki |
| 9,837,546 | B2 * | 12/2017 | Yamazaki ......... H01L 29/42392 |
| 9,847,358 | B2 | 12/2017 | Koezuka et al. |
| 9,853,164 | B2 * | 12/2017 | Hara ................. G02F 1/136286 |
| 9,972,718 | B2 | 5/2018 | Koezuka et al. |
| 10,050,153 | B2 | 8/2018 | Koezuka et al. |
| 10,056,497 | B2 | 8/2018 | Tanaka et al. |
| 10,249,764 | B2 | 4/2019 | Yamazaki |
| 10,367,013 | B2 | 7/2019 | Koezuka et al. |
| 10,418,586 | B2 | 9/2019 | Yamazaki et al. |
| 10,424,673 | B2 | 9/2019 | Yamazaki |
| 10,490,572 | B2 | 11/2019 | Okazaki et al. |
| 10,566,455 | B2 | 2/2020 | Yamazaki et al. |
| 10,763,282 | B2 | 9/2020 | Koezuka et al. |
| 11,355,529 | B2 | 6/2022 | Koezuka et al. |
| 2009/0278120 | A1 | 11/2009 | Lee et al. |
| 2012/0248450 | A1 | 10/2012 | Yaneda et al. |
| 2012/0256179 | A1 | 10/2012 | Yamazaki et al. |
| 2013/0188110 | A1 * | 7/2013 | Miyamoto .......... H01L 27/1251 |
| | | | 438/157 |
| 2013/0207111 | A1 | 8/2013 | Yamazaki |
| 2013/0270563 | A1 | 10/2013 | Yamazaki |
| 2013/0285046 | A1 | 10/2013 | Yamazaki |
| 2014/0001467 | A1 | 1/2014 | Yamazaki et al. |
| 2014/0008647 | A1 | 1/2014 | Yamazaki |
| 2014/0042435 | A1 | 2/2014 | Yamazaki |
| 2014/0042438 | A1 | 2/2014 | Yamazaki |
| 2014/0124776 | A1 | 5/2014 | Takahashi et al. |
| 2014/0264518 | A1 | 9/2014 | Matsuzaki |
| 2014/0299873 | A1 | 10/2014 | Yamazaki |
| 2014/0339560 | A1 | 11/2014 | Yamazaki et al. |
| 2014/0374908 | A1 | 12/2014 | Koezuka et al. |
| 2015/0280691 | A1 | 10/2015 | Koyama |
| 2016/0079433 | A1 | 3/2016 | Watanabe et al. |
| 2018/0350996 | A1 | 12/2018 | Koezuka et al. |

(56)  References Cited

U.S. PATENT DOCUMENTS

| | | |
|---|---|---|
| 2019/0067486 A1 | 2/2019 | Yamazaki et al. |
| 2020/0135773 A1 | 4/2020 | Okazaki et al. |
| 2022/0293641 A1 | 9/2022 | Koezuka et al. |

FOREIGN PATENT DOCUMENTS

| | | |
|---|---|---|
| JP | 2006-165528 A | 6/2006 |
| JP | 2011-029176 A | 2/2011 |
| JP | 2011-139049 A | 7/2011 |
| JP | 2012-257187 A | 12/2012 |
| JP | 2013-065843 A | 4/2013 |
| JP | 2013-179290 A | 9/2013 |
| JP | 2013-201428 A | 10/2013 |
| JP | 2014-030001 A | 2/2014 |
| JP | 2014-030003 A | 2/2014 |
| JP | 2014-103389 A | 6/2014 |
| JP | 2014-199918 A | 10/2014 |
| JP | 2014-210702 A | 11/2014 |
| JP | 2015-005732 A | 1/2015 |
| JP | 2015-012131 A | 1/2015 |
| JP | 2015-026830 A | 2/2015 |
| JP | 2015-133484 A | 7/2015 |
| JP | 2015-144266 A | 8/2015 |
| JP | 2015-144271 A | 8/2015 |
| JP | 2015-188062 A | 10/2015 |
| JP | 2015-188070 A | 10/2015 |
| JP | 2015-213164 A | 11/2015 |
| JP | 2016-021563 A | 2/2016 |
| WO | WO-2011/068016 | 6/2011 |
| WO | WO-2014/003086 | 1/2014 |
| WO | WO-2015/097589 | 7/2015 |
| WO | WO-2015/118472 | 8/2015 |
| WO | WO-2015/159179 | 10/2015 |
| WO | WO-2015/193766 | 12/2015 |

* cited by examiner

131

132

<u>100</u>

<u>100</u>

100

100

100

<u>100A</u>

<u>100A</u>

<u>100A</u>

131B 110
107a_3
107a ⎰ 107a_2
107a_1
107a
109
108
106_2
106_1
106
105

132B 109
108
110
105
104
103
102
106_2
106_1
106

<u>131C</u>

<u>132C</u>

100D

100D

100D

131D

132D

200

105

X1                               X2

106_2 ⎫ 106
106_1 ⎭

200

105

X1                               X2

106_2 ⎫
106_1 ⎬ 106
106_3 ⎭

231B

232B

200D

200D

200D

500

<u>511</u>

<u>521a</u>

9500

9512     9502     9503     9511     9512

9501     9501     9501     9501

9500

9512     9502     9503     9511     9512

9501→

9501→

9501     9501     9501     9501

TRANSISTOR AND METHOD FOR MANUFACTURING THE SAME

CROSS-REFERENCE TO RELATED APPLICATIONS

This application is a continuation of U.S. application Ser. No. 17/696,988, filed Mar. 17, 2022, now pending, which is a divisional of U.S. application Ser. No. 15/477,446, filed Apr. 3, 2017, now U.S. Pat. No. 11,302,717, which claims the benefit of foreign priority applications filed in Japan as Serial No. 2016-078286 on Apr. 8, 2016, and Serial No. 2016-078347 on Apr. 8, 2016, all of which are incorporated by reference.

BACKGROUND OF THE INVENTION

1. Field of the Invention

The present invention relates to an object, a method, or a manufacturing method. The present invention relates to a process, a machine, manufacture, or a composition of matter. One embodiment of the present invention relates to a semiconductor device, a display device, a light-emitting device, a lighting device, a power storage device, a memory device, a processor, or a driving method or manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

Silicon is known as a material used for a semiconductor layer of a transistor; either amorphous silicon or polycrystalline silicon is used depending on the purpose. For example, when silicon is used for a semiconductor layer of a transistor included in a large-sized display device, it is preferable to use amorphous silicon, which can be formed using the established technique for forming a film on a large-sized substrate. On the other hand, when silicon is used for a semiconductor layer of a transistor included in a high-performance display device in which driver circuits and a pixel portion are formed over one substrate, it is preferable to use polycrystalline silicon, which can achieve a transistor with high field-effect mobility.

Meanwhile, an oxide semiconductor has attracted attention recently as a material used for a semiconductor layer of a transistor. For example, a transistor using an amorphous oxide semiconductor containing indium, gallium, and zinc is known (see Patent Document 1).

An oxide semiconductor can be formed by a sputtering method or the like, and thus can be used for a semiconductor layer of a transistor in a large display device. In addition, there is an advantage that capital investment can be reduced because part of production equipment for a transistor including amorphous silicon can be retrofitted and utilized. A transistor including an oxide semiconductor has high field-effect mobility; therefore, a high-performance display device where driver circuits are formed over the same substrate can be obtained.

It is also known that a transistor using an oxide semiconductor for a semiconductor layer has an extremely low leakage current in an off state. For example, a low-power CPU utilizing the feature of low leakage current of the transistor including an oxide semiconductor is disclosed (see Patent Document 2).

PATENT DOCUMENT

Patent Document 1: Japanese Published Patent Application No. 2006-165528
Patent Document 2: Japanese Published Patent Application No. 2012-257187

SUMMARY OF THE INVENTION

An object is to provide a transistor with favorable electrical characteristics. Another object is to provide a transistor with stable electrical characteristics. Another object is to provide a transistor with low power consumption. Another object is to provide a transistor with high reliability. Another object is to provide a novel transistor. Another object is to provide a semiconductor device including at least one of these transistors.

Note that the descriptions of these objects do not preclude the existence of other objects. In one embodiment of the present invention, there is no need to achieve all the objects. Other objects will be apparent from and can be derived from the description of the specification, the drawings, the claims, and the like.

In a bottom-gate transistor including an oxide semiconductor layer as a semiconductor layer where a channel is formed, an insulating layer containing excess oxygen is formed over the oxide semiconductor layer, and then an insulating layer through which impurities do not easily pass is formed without exposure to the air. As the insulating layer through which impurities do not easily pass, an aluminum oxide layer or the like can be used. When a conductive layer with a function of absorbing hydrogen is used for a source electrode and a drain electrode, the hydrogen concentration in the oxide semiconductor layer can be reduced.

In a top-gate transistor including an oxide semiconductor layer as a semiconductor layer where a channel is formed, after formation of a gate electrode, impurities are introduced into the oxide semiconductor layer using the gate electrode as a mask. Alternatively, plasma treatment using an inert gas or a nitrogen gas is performed, for example. Next, heat treatment is performed, and then an insulating layer through which impurities do not easily pass is formed without exposure to the air.

One embodiment of the present invention is a transistor including first to third electrodes, first to fifth insulating layers, and first and second oxide semiconductor layers. The first insulating layer is over the first electrode. The second insulating layer is over the first insulating layer. The third insulating layer is over the second insulating layer. The first oxide semiconductor layer is over the third insulating layer. The second oxide semiconductor layer is over the first oxide semiconductor layer. The first electrode, the first insulating layer, the second insulating layer, the third insulating layer, the first oxide semiconductor layer, and the second oxide semiconductor layer partly overlap each other. The second electrode includes a region that is over the second oxide semiconductor layer and overlaps the second oxide semiconductor layer, and a region that is over the second insulating layer and overlaps the second insulating layer. The third electrode includes a region that is over the second oxide semiconductor layer and overlaps the second oxide semiconductor layer, and a region that is over the second insulating layer and overlaps the second insulating layer. The fourth insulating layer includes a region overlapping the second oxide semiconductor layer. The fifth insulating layer is over the fourth insulating layer. The second oxide semiconductor layer has crystallinity.

Another embodiment of the present invention is a method for manufacturing a transistor, including the steps of forming a first electrode; forming a first insulating layer covering the first electrode; forming a second insulating layer over the first insulating layer; forming a third insulating layer over the second insulating layer; forming a first oxide semiconductor layer over the third insulating layer; forming a second oxide semiconductor layer over the first oxide semiconductor layer; processing the first oxide semiconductor layer and the second oxide semiconductor layer into an island shape; forming a second electrode partly overlapping a part of the second oxide semiconductor layer, and a third electrode partly overlapping another part of the second oxide semiconductor layer; forming a fourth insulating layer covering the second oxide semiconductor layer; performing heat treatment; and forming a fifth insulating layer over the fourth insulating layer. The step of performing the heat treatment and the step of forming the fifth insulating layer are performed without exposure to air.

The second insulating layer preferably contains aluminum and oxygen. The fifth insulating layer preferably contains aluminum and oxygen.

The heat treatment conducted after formation of the fourth insulating layer is preferably performed at a temperature from 200° C. to 500° C.

The heat treatment may be performed in an inert atmosphere or an oxidizing atmosphere. The heat treatment may be performed in an inert atmosphere and then performed in an oxidizing atmosphere.

Another embodiment of the present invention is a transistor including a first electrode, a second electrode, first to fifth insulating layers, and an oxide semiconductor layer. The first insulating layer is over the first electrode. The second insulating layer is over the first insulating layer. The third insulating layer is over the second insulating layer. The oxide semiconductor layer is over the third insulating layer. The fourth insulating layer is over the oxide semiconductor layer. The second electrode is over the fourth insulating layer. The first electrode, the second electrode, and the first to fourth insulating layers partly overlap each other. The fifth insulating layer includes a region covering the second electrode and a region in contact with the oxide semiconductor layer.

Another embodiment of the present invention is a method for manufacturing a transistor, including the steps of forming a first electrode; forming a first insulating layer covering the first electrode; forming a second insulating layer over the first insulating layer; forming a third insulating layer over the second insulating layer; forming an oxide semiconductor layer over the third insulating layer; processing the oxide semiconductor layer into an island shape; forming a fourth insulating layer over the oxide semiconductor layer; forming a second electrode over the fourth insulating layer; processing the fourth insulating layer into an island shape with the use of the second electrode as a mask; introducing impurities into part of the oxide semiconductor layer; performing heat treatment; and forming a fifth insulating layer covering the second electrode and the oxide semiconductor layer. The step of performing the heat treatment and the step of forming the fifth insulating layer are conducted without exposure to the air.

A transistor with favorable electrical characteristics can be provided. A transistor with stable electrical characteristics can be provided. A transistor with low power consumption can be provided. A transistor with high reliability can be provided. A novel transistor can be provided. A semiconductor device including at least one of these transistors can be provided.

Note that the description of these effects does not preclude the existence of other effects. One embodiment of the present invention does not have to achieve all the effects listed above. Other effects will be apparent from and can be derived from the description of the specification, the drawings, the claims, and the like.

BRIEF DESCRIPTION OF THE DRAWINGS

In the accompanying drawings.

DETAILED DESCRIPTION OF THE INVENTION

Figure 1A:
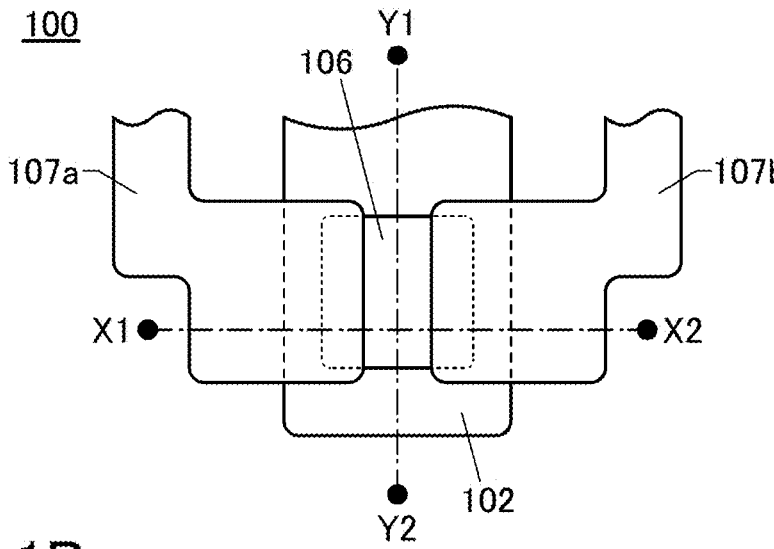
FIGS. 1A to 1C illustrate a transistor.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the present invention is not necessarily limited to the position, size, range, or the like disclosed in the drawings and the like. For example, in the actual manufacturing process, a layer, a resist mask, or the like may be unintentionally reduced in size by treatment such as etching, which is not illustrated in some cases for easy understanding.

Especially in a top view (also referred to as "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order, such as the order of steps or the stacking order. A term without an ordinal number in this specification and the like may be provided with an ordinal number in a claim in order to avoid confusion among components. A term with an ordinal number in this specification and the like may be provided with a different ordinal number in a claim. Moreover, a term with an ordinal number in this specification and the like may not be provided with any ordinal number in a claim.

In this specification and the like, the term such as an "electrode" or a "wiring" does not limit a function of the component. For example, an "electrode" is used as part of a "wiring" in some cases, and vice versa. Furthermore, the term "electrode" or "wiring" can also mean that a plurality of "electrodes" or "wirings" are provided in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean that another component is provided between the insulating layer A and the electrode B.

Functions of a source and a drain might be switched depending on operation conditions, for example, when a transistor having opposite polarity is employed or the direction of current flow is changed in circuit operation. Thus, it is difficult to define which is a source or a drain. Accordingly, the terms "source" and "drain" can be used to denote the drain and the source, respectively, in this specification.

Furthermore, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or texts, another connection relation is included in the drawings or the texts.

In this specification and the like, the term "electrically connected" includes the case where components are connected through an object having any electric function. There is no particular limitation on the object having any electric function as long as electric signals can be transmitted and received between components that are connected through the object. Accordingly, even when the expression "electrically connected" is used in this specification, there is a case in which no physical connection is made and a wiring is just extended in an actual circuit.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap each other or a region where a channel is formed in a plan view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as "effective channel width") is sometimes different from a channel width shown in a top view of a transistor (hereinafter referred to as "apparent channel width"). For example, in a transistor having a gate electrode covering a side surface of a semiconductor layer, an effective channel width is greater than an apparent channel width, and its influence cannot be ignored in some cases. For example, in a miniaturized transistor having a gate electrode covering a side surface of a semiconductor, the proportion of a channel region formed on a side surface of a semiconductor is sometimes increased. In that case, an effective channel width is greater than an apparent channel width.

In such a case, an effective channel width is difficult to measure in some cases. For example, estimation of the effective channel width from a design value requires an assumption that the shape of a semiconductor is known. Accordingly, when the shape of a semiconductor is not known accurately, it is difficult to measure the effective channel width accurately.

Therefore, in this specification, an apparent channel width is referred to as a surrounded channel width (SCW) in some cases. Furthermore, when the term "channel width" is simply used in this specification, it may represent a surrounded channel width or an apparent channel width. Alternatively, when the term "channel width" is simply used in this specification, it may represent an effective channel width in some cases. Note that a channel length, a channel width, an effective channel width, an apparent channel width, a surrounded channel width, and the like can be determined by analyzing a cross-sectional TEM image and the like.

Note that when field-effect mobility, a current per channel width, and the like of a transistor are obtained by calculation, a surrounded channel width may be used for the calculation. In that case, the obtained value is sometimes different from the value obtained by using an effective channel width for the calculation.

Note that the term "impurity" in a semiconductor refers to, for example, an element other than the main components of the semiconductor. For example, an element with a concentration lower than 0.1 atomic % can be regarded as an impurity. Inclusion of impurities may cause an increase in density of states (DOS) in a semiconductor and/or a decrease in the carrier mobility or the crystallinity. In the case where the semiconductor is an oxide semiconductor, examples of impurities that change the characteristics of the semiconductor include Group 1 elements, Group 2 elements, Group 13 elements, Group 14 elements, Group 15 elements, and transition metals other than the main components of the oxide semiconductor; specific examples are hydrogen, lithium, sodium, silicon, boron, phosphorus, carbon, and nitrogen.

For an oxide semiconductor, water also serves as an impurity in some cases. In the case of an oxide semiconductor, oxygen vacancies may be formed by entry of impurities. Furthermore, when the semiconductor is silicon, examples of impurities that change the characteristics of the semiconductor include oxygen, Group 1 elements except hydrogen, Group 2 elements, Group 13 elements, and Group 15 elements.

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The terms "perpendicular" and "orthogonal" indicate that the angle formed between two straight lines ranges from 800 to 100°, and accordingly also include the case where the angle ranges from 85° to 95°. The term "substantially perpendicular" indicates that the angle formed between two straight lines ranges from 600 to 120°.

In this specification, trigonal and rhombohedral crystal systems are included in a hexagonal crystal system.

In the specification and the like, the terms used in describing calculation values and actual measurement values, such as "identical," "same," "equal," and "uniform," (including synonyms thereof) allow for a margin of error of ±20% unless otherwise specified.

In this specification and the like, when an etching step (a removing step) is performed after a resist mask is formed by a photolithography method, the resist mask is removed after the etching step unless otherwise specified.

In this specification and the like, a high power supply potential VDD (also referred to as VDD or H potential) is a power supply potential higher than a low power supply potential VSS. The low power supply potential VSS (also referred to as VSS or L potential) is a power supply potential lower than the high power supply potential VDD. A ground potential (also referred to as GND or GND potential) can be used as VDD or VSS. For example, when the ground potential is used as VDD, VSS is lower than the ground potential, and when the ground potential is used as VSS, VDD is higher than the ground potential.

Note that the terms "film" and "layer" can be interchanged with each other depending on the case or circumstances. For example, in some cases, the term "conductive film" can be used instead of the term "conductive layer," or the term "insulating film" can be used instead of the term "insulating layer."

In this specification and the like, a transistor is an element having at least three terminals of a gate, a drain, and a source. A transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

A transistor shown in this specification and the like refers to an enhancement-mode (normally-off) field-effect transistor, unless otherwise specified. Moreover, a transistor shown in this specification and the like is an n-channel transistor, unless otherwise specified. Therefore, the threshold voltage (also referred to as Vth) of a transistor is higher than 0 V, unless otherwise specified.

Note that Vth of a transistor having a backgate in this specification and the like refers to Vth obtained when the potential of the backgate is set equal to that of a source or a gate, unless otherwise specified.

Unless otherwise specified, the off-state current in this specification and the like refers to a drain current of a transistor in an off state (also referred to as non-conducting state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, the expression "the off-state current of a transistor is lower than or equal to I" may mean that there is Vgs with which the off-state current of the transistor becomes lower than or equal to I. Moreover, the off-state current of a transistor sometimes means the off-state current at given Vgs, at Vgs in a given range, or at Vgs with which sufficiently low off-state current is obtained, for example.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1 \times 10^{-19}$ A at Vgs of –0.5 V, and $1 \times 10^{-22}$ A at Vgs of –0.8 V. The drain current of the transistor is $1 \times 10^{-19}$ A or lower at Vgs of –0.5 V or at Vgs in the range of –0.8 V to –0.5 V; thus, it can be said that the off-state current of the transistor is $1 \times 10^{-19}$ A or lower. Since there is Vgs at which the drain current of the transistor is $1 \times 10^{-22}$ A or lower, it may be said that the off-state current of the transistor is $1 \times 10^{-22}$ A or lower.

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which a semiconductor device or the like including the transistor is used (e.g., temperature in the range of 5° C. to 35° C.). The description "the off-state current of a transistor is lower than or equal to I" may mean that there is Vgs at which the off-state current of the transistor is lower than or equal to I at room temperature, 60° C., 85° C., 95° C., 125° C., a temperature at which the reliability required in a semiconductor device or the like including the transistor is ensured, or a temperature at which a semiconductor device or the like including the transistor is used (e.g., temperature in the range of 5° C. to 35° C.).

The off-state current of a transistor sometimes depends on a voltage Vds between its drain and source. Unless otherwise specified, the off-state current in this specification may be an off-state current at Vds of 0.1V, 0.8V, 1V, 1.2V, 1.8V, 2.5V, 3V, 3.3V, 10V, 12V, 16V, or 20V. Alternatively, the off-state current may be an off-state current at Vds at which the required reliability of a semiconductor device or the like including the transistor is ensured or Vds at which a semiconductor device or the like including the transistor is used. The description "the off-state current of a transistor is lower than or equal to I" may mean that there is Vgs at which the off-state current of the transistor is lower than or equal to the current I at Vds of 0.1 V, 0.8 V, 1 V, 1.2 V, 1.8 V, 2.5 V, 3 V, 3.3 V, 10 V, 12 V, 16 V, or 20 V, Vds at which the reliability of a semiconductor device or the like including the transistor is ensured, or Vds at which a semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to current that flows between a source and a drain of a transistor in the off state, for example.

Embodiment 1

A transistor 100 of one embodiment of the present invention will be described with reference to drawings.

Structure Example of Transistor 100

Figure 1B:
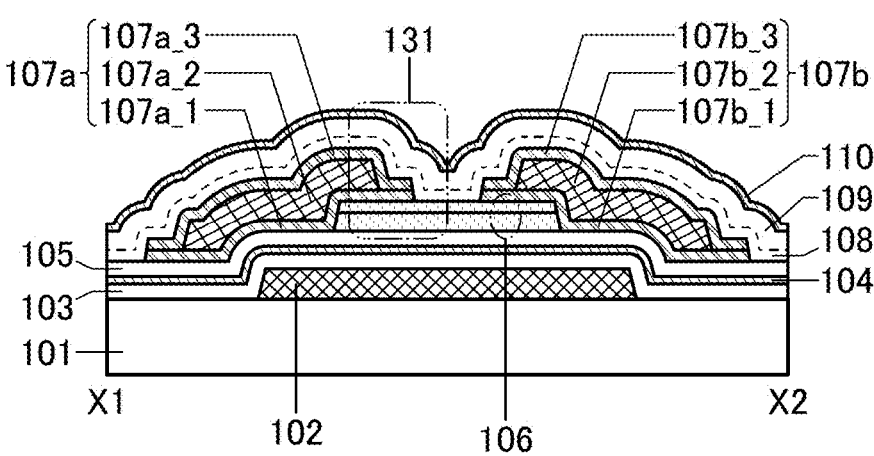
Figure 1C:
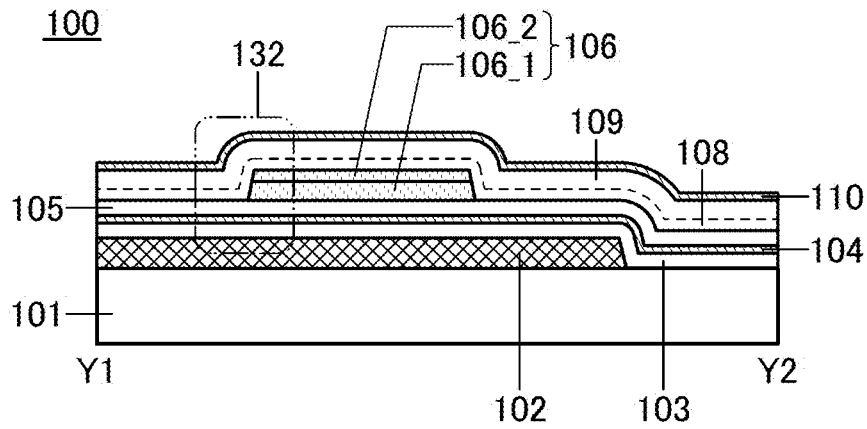
Figure 2A:
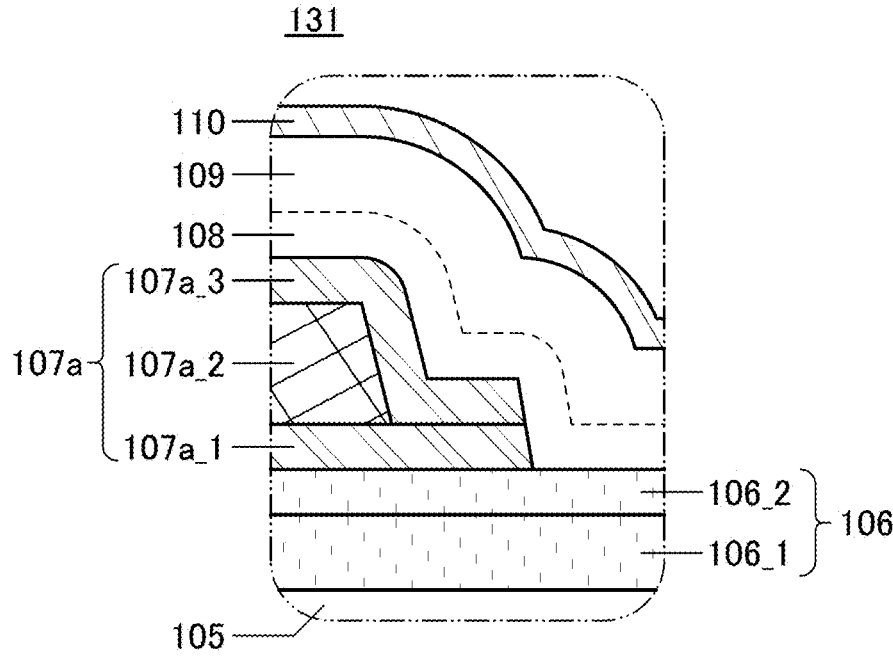
FIGS. 2A and 2B illustrate a transistor.
Figure 2B:
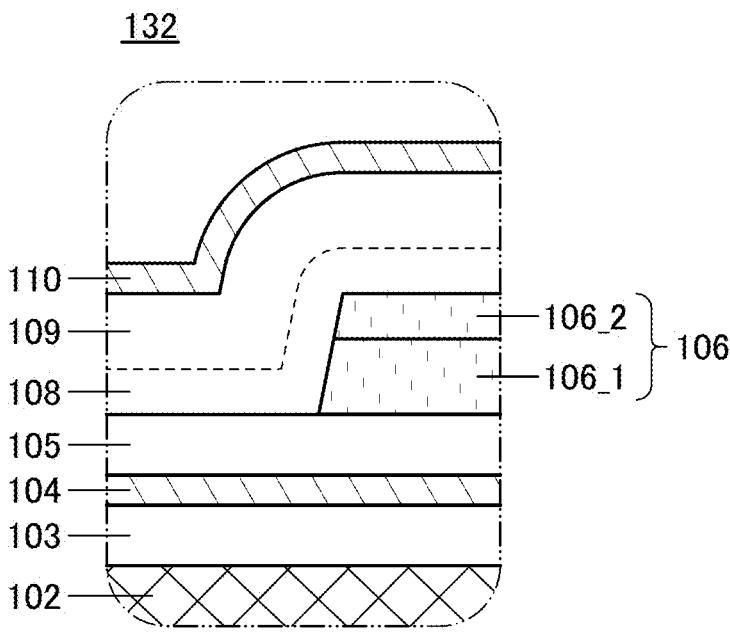

FIG. 1A is a plan view of the transistor 100. FIG. 1B is a cross-sectional view of a portion indicated by the dashed-dotted line X1-X2 in FIG. 1A. FIG. 1C is a cross-sectional view of a portion indicated by the dashed-dotted line Y1-Y2 in FIG. 1A. FIG. 2A is an enlarged view of a portion 131 shown in FIG. 1B. FIG. 2B is an enlarged view of a portion 132 shown in FIG. 1C.

The transistor 100 is a bottom-gate transistor. The transistor 100 includes an electrode 102, an insulating layer 103, an insulating layer 104, an insulating layer 105, an oxide semiconductor layer 106 (an oxide semiconductor layer 106_1 and an oxide semiconductor layer 106_2), an electrode 107a (an electrode 107a_1, an electrode 107a_2, and an electrode 107a_3), an electrode 107b (an electrode 107b_1, an electrode 107b_2, and an electrode 107b_3), an insulating layer 108, an insulating layer 109, and an insulating layer 110.

The electrode 102 is provided over a substrate 101. The insulating layer 103 is provided to cover the electrode 102. The insulating layer 104 is provided over the insulating layer 103. The insulating layer 105 is provided over the insulating layer 104. The oxide semiconductor layer 106 is provided over the insulating layer 105. The electrode 102 and the oxide semiconductor layer 106 partly overlap each other, with the insulating layers 103, 104, and 105 placed therebetween.

The electrode 107a and the electrode 107b are provided over the insulating layer 105. The electrode 107a has a region overlapping part of the oxide semiconductor layer 106, and the electrode 107b has a region overlapping another part of the oxide semiconductor layer 106.

The insulating layer 108 is provided to cover the electrode 107a, the electrode 107b, and the oxide semiconductor layer 106. The insulating layer 109 is provided over the insulating layer 108. The insulating layer 110 is provided over the insulating layer 109.

When the insulating layer 108 and the insulating layer 109 are formed using the same kind of material, the interface between the insulating layers 108 and 109 is not clearly observed in some cases. For that reason, the interface between the insulating layers 108 and 109 is indicated by dashed lines in this embodiment. Although a two-layer structure of the insulating layers 108 and 109 is described in this embodiment, one embodiment of the present invention is not limited to this, and a single-layer structure of either the insulating layer 108 or the insulating layer 109 or a stacked-layer structure including three or more layers may be employed, for example.

Figure 3A:
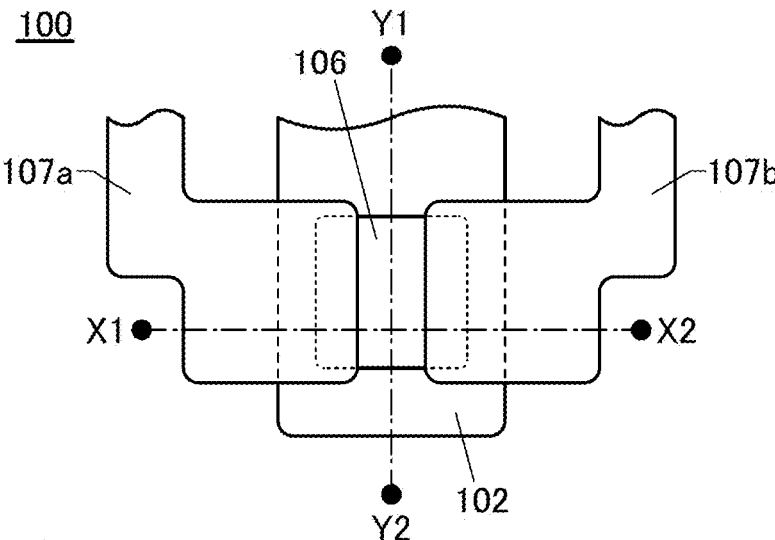
FIGS. 3A to 3C illustrate a transistor.
Figure 3B:
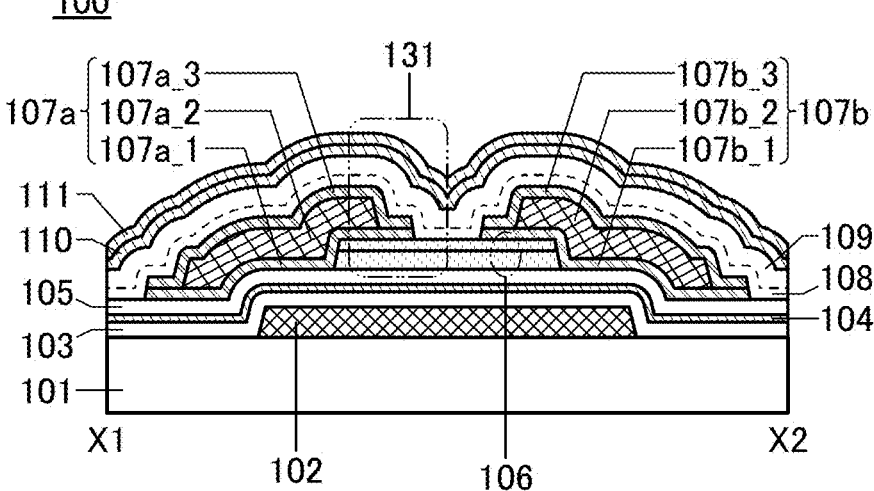
Figure 3C:
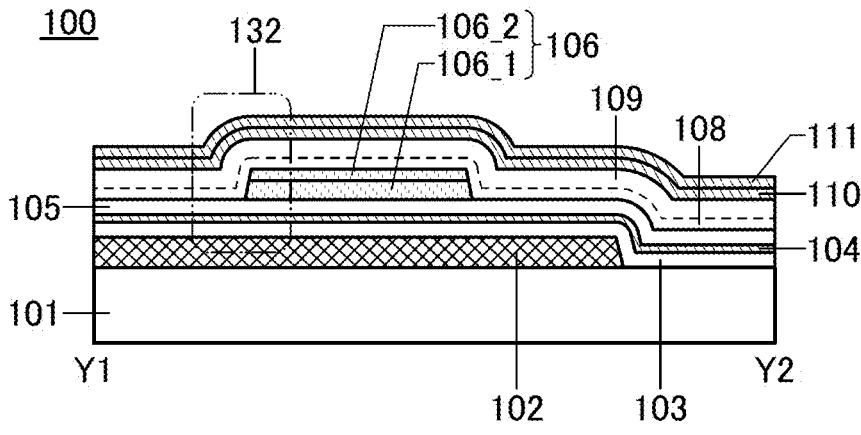
Figure 4A:
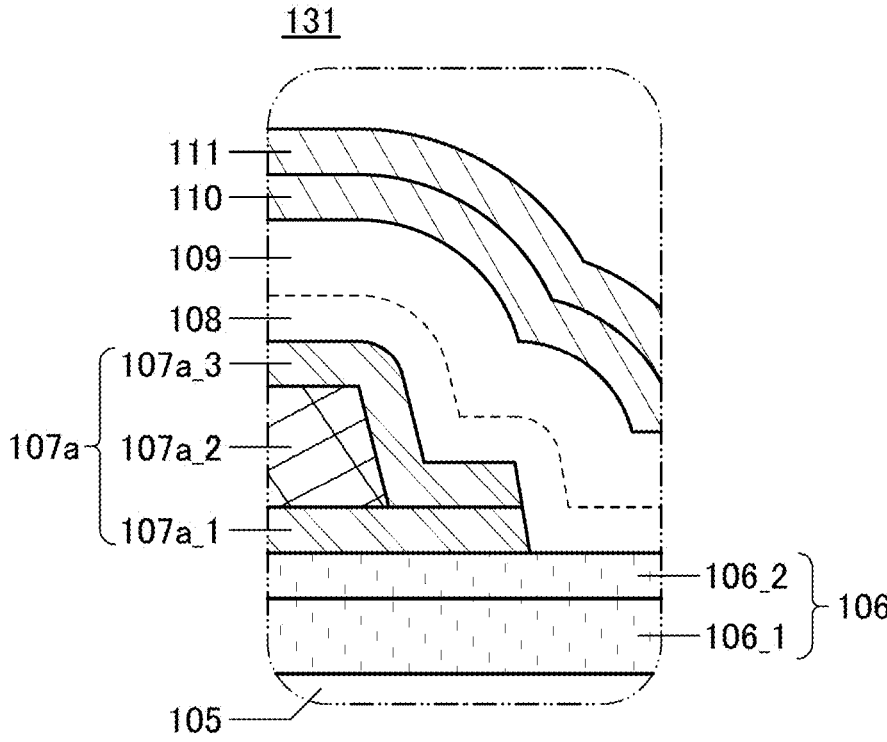
FIGS. 4A and 4B illustrate a transistor.
Figure 4B:
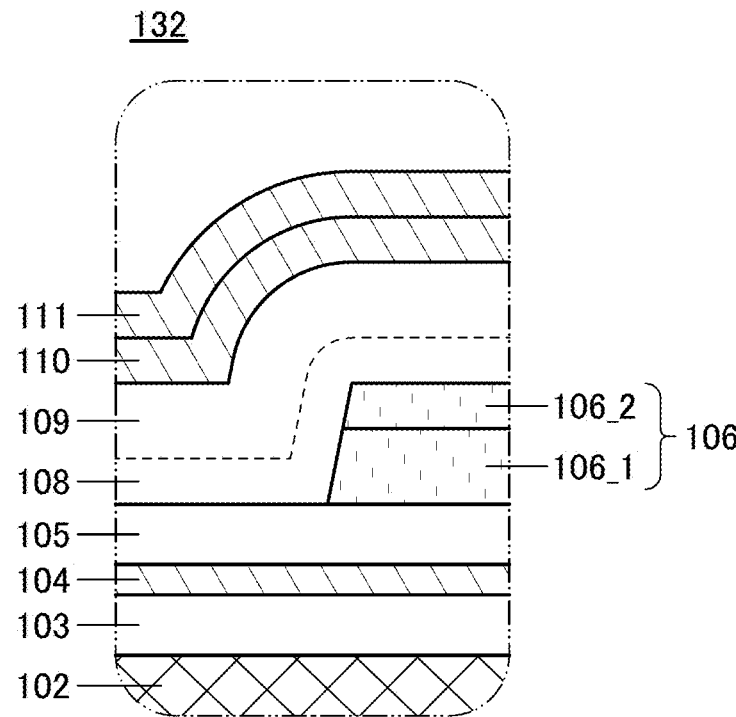

As illustrated in FIGS. 3A to 3C and FIGS. 4A and 4B, an insulating layer 111 may be provided over the insulating layer 110. FIG. 3A is a plan view of the transistor 100. FIG. 3B is a cross-sectional view of a portion indicated by the dashed-dotted line X1-X2 in FIG. 3A. FIG. 3C is a cross-sectional view of a portion indicated by the dashed-dotted line Y1-Y2 in FIG. 3A. FIG. 4A is an enlarged view of the portion 131 shown in FIG. 3B. FIG. 4B is an enlarged view of the portion 132 shown in FIG. 3C.

When the insulating layer 110 and the insulating layer 111 are provided in the transistor 100, one or both of the insulating layers 110 and 111 is preferably formed using an insulating material through which impurities do not easily pass. For example, at least one of the insulating layers 110 and 111 may be a silicon nitride layer or an aluminum oxide layer. Alternatively, one of the insulating layers 110 and 111 may be a silicon nitride layer or the like, and the other may be an aluminum oxide layer or the like.

As the insulating layer 110, an aluminum oxide layer is preferably formed by a sputtering method. As the insulating layer 111, an aluminum oxide layer is preferably formed by an ALD method. The effects of these aluminum oxide layers will be described later.

Figure 5A:
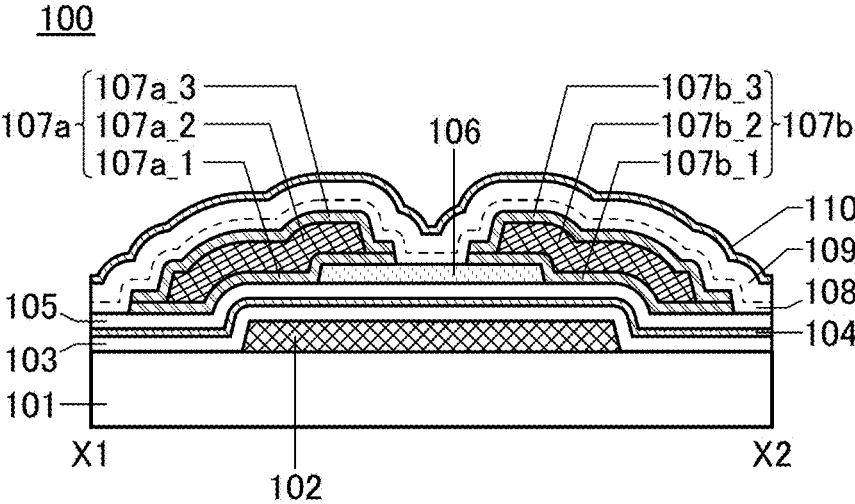
FIGS. 5A and 5B each illustrate a transistor.
Figure 5B:
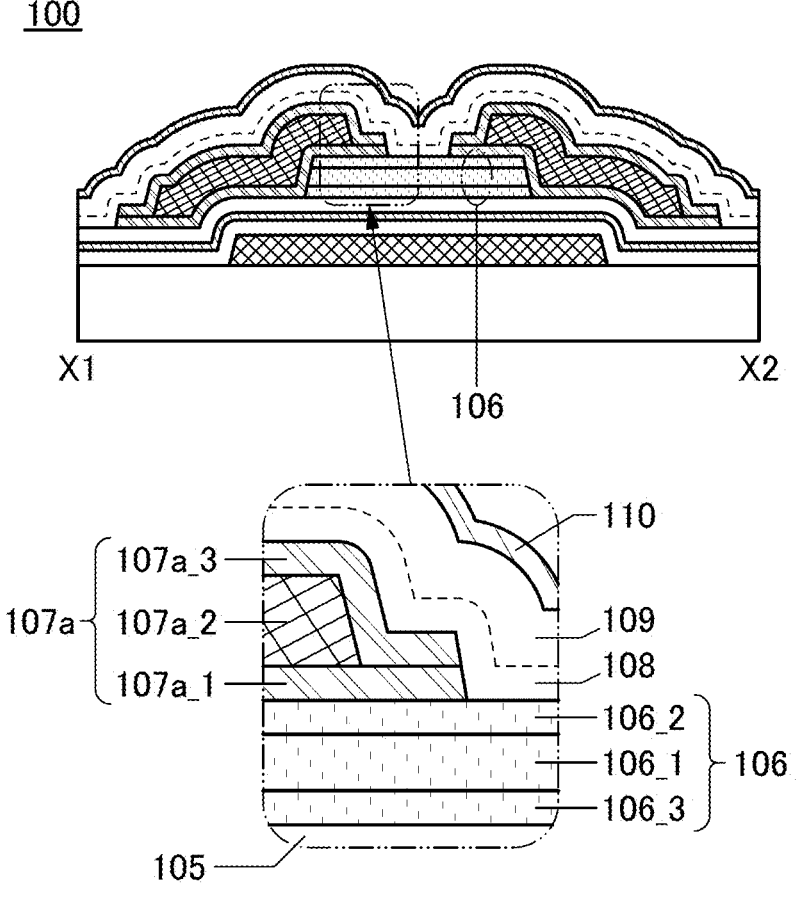

FIGS. 1B and 1C and FIGS. 2A and 2B show that the oxide semiconductor layer 106 is a stack of two layers, the oxide semiconductor layer 106_1 and the oxide semiconductor layer 106_2; however, one embodiment of the present invention is not limited to this. For example, the oxide semiconductor layer 106 may be a single layer as illustrated in FIG. 5A. Alternatively, the oxide semiconductor layer 106 may have a three-layer structure of the oxide semiconductor layer 106_1, the oxide semiconductor layer 106_2, and an oxide semiconductor layer 106_3 as illustrated in FIG. 5B. The oxide semiconductor layer 106 may be a stack of four or more layers. Note that FIGS. 5A and 5B are cross-sectional views corresponding to FIG. 1B.

The oxide semiconductor layer 106_3 can be formed using a material and a method similar to those for the oxide semiconductor layer 106_1 or the oxide semiconductor layer 106_2.

Figure 6A:
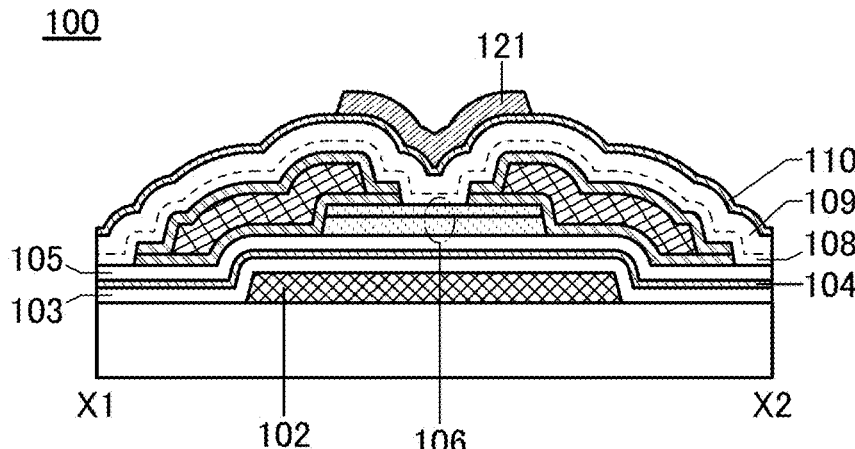
FIGS. 6A to 6C each illustrate a transistor.
Figure 6B:
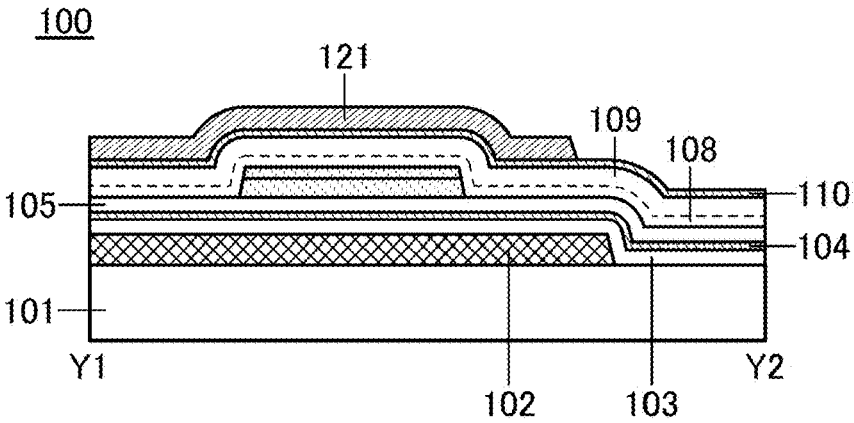
Figure 6C:
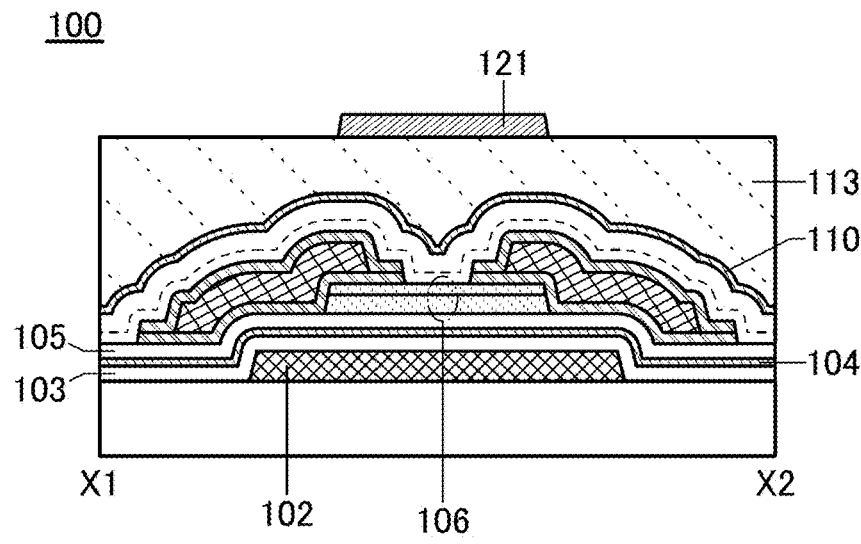

An electrode 121 that partly overlaps the oxide semiconductor layer 106 may be provided over the insulating layer 110 (see FIGS. 6A and 6B). An insulating layer 113 with a flat surface may be provided over the insulating layer 110 (see FIG. 6C). The electrode 121 that partly overlaps the oxide semiconductor layer 106 may be provided over the insulating layer 113. The electrode 121 may be provided between the insulating layer 109 and the insulating layer 110.

[Gate Electrode and Backgate Electrode]

The electrode 102 can function as a gate electrode. When the electrode 121, in addition to the electrode 102, is provided in the transistor 100, the electrode 121 can also function as a gate electrode. When one of the electrodes 102 and 121 is referred to as "gate electrode," the other is referred to as "backgate electrode." For example, in the transistor 100 illustrated in FIG. 6A or FIG. 6C, when the electrode 102 is referred to as the gate electrode, the electrode 121 is referred to as the backgate electrode. When the electrode 121 is used as the gate electrode, the transistor 100 can be considered as a top-gate transistor. In some cases, one of the electrodes 102 and 121 is referred to as "first gate electrode" and the other is referred to as "second gate electrode."

The gate electrode and the backgate electrode are generally formed using conductive layers. The gate electrode and the backgate electrode are placed so that a channel formation region of the semiconductor layer is sandwiched therebetween. In other words, the gate electrode and the backgate electrode surround the semiconductor layer (oxide semiconductor layer). This structure enables the oxide semiconductor layer 106 in the transistor 100 to be electrically surrounded by electric fields of the electrode 102 serving as the gate electrode and the electrode 121 serving as the backgate electrode. Such a structure of a transistor in which electric fields of the gate electrode and the backgate electrode electrically surround the semiconductor layer where a channel is formed can be referred to as a surrounded-channel (S-channel) structure.

The backgate electrode can function in a manner similar to that of the gate electrode. The potential of the backgate electrode may be the same as that of the gate electrode or may be a ground potential or a predetermined potential. By changing the potential of the backgate electrode independently of the potential of the gate electrode, the threshold voltage of the transistor can be changed.

As described above, the electrode 102 can function as the gate electrode. Thus, the insulating layers 103, 104, and 105 can function as gate insulating layers. When the electrode 121 is provided, the insulating layers 108 and 110 can function as gate insulating layers.

By providing the electrode 102 and the electrode 121 so that the oxide semiconductor layer 106 is located therebetween, and by setting the potentials of the electrode 102 and the electrode 121 to be the same, a region of the oxide semiconductor layer 106 through which carriers flow is enlarged in the film thickness direction; thus, the amount of transferred carriers is increased. As a result, the on-state current and the field-effect mobility of the transistor are increased.

Accordingly, the transistor can have a large on-state current for its area. That is, the area occupied by the transistor can be small for a required on-state current. Thus, a semiconductor device having a high degree of integration can be achieved.

Furthermore, the gate electrode and the backgate electrode are formed using conductive layers and thus each have a function of preventing an electric field generated outside the transistor from influencing the semiconductor layer in which the channel is formed (in particular, an electric field blocking function against static electricity and the like). When the backgate electrode is formed larger than the semiconductor layer to cover the semiconductor layer in the plan view, the electric field blocking function can be enhanced.

Since each of the electrodes 102 and 121 has a function of blocking an electric field from the outside, charges of charged particles and the like generated above the electrode 121 and below the electrode 102 do not influence the channel formation region of the oxide semiconductor layer 106. As a result, degradation of electrical characteristics by a stress test (e.g., a negative gate bias temperature (−GBT) stress test in which negative charges are applied to a gate) is reduced. In addition, the electrodes 102 and 121 can block an electric field generated from the drain electrode so as not to affect the semiconductor layer. Thus, changes in the rising voltage of on-state current due to changes in drain voltage can be suppressed. Note that this effect is significant when a potential is supplied to the electrodes 102 and 121.

A GBT stress test is a kind of acceleration test and can evaluate, in a short time, a change in transistor characteristics due to long-term use (i.e., a change over time). In particular, the amount of change in threshold voltage of a transistor between before and after the GBT stress test is an important indicator when examining the reliability of the transistor. As the amount of change in the threshold voltage between before and after the GBT stress test is smaller, the transistor has higher reliability.

By providing the electrode 102 and the electrode 121 and setting the potentials of the electrode 102 and the electrode 121 to be the same, the change in threshold voltage is reduced. Accordingly, variations in electrical characteristics among a plurality of transistors are also reduced.

The transistor including the backgate electrode has a smaller change in threshold voltage between before and after a positive GBT stress test in which positive charges are applied to a gate than a transistor including no backgate electrode.

In the case where light is incident on the backgate electrode side, when the backgate electrode is formed using a light-blocking conductive film, light can be prevented from entering the semiconductor layer from the backgate electrode side. Thus, photodegradation of the semiconductor layer can be prevented and deterioration in electrical characteristics of the transistor, such as a shift of the threshold voltage, can be prevented.

One of the electrodes 107a and 107b can function as one of a source electrode and a drain electrode. The other of the electrodes 107a and 107b can function as the other of the source electrode and the drain electrode.

[Substrate]

As the substrate 101, a glass substrate, a ceramic substrate, a flexible substrate that has high heat resistance enough to withstand a process temperature of this manufacturing process, or the like can be used. When the substrate does not need a light-transmitting property, a metal substrate such as a stainless alloy substrate with a surface provided with an insulating layer may be used. As the glass substrate, an alkali-free glass substrate of barium borosilicate glass, aluminoborosilicate glass, aluminosilicate glass, or the like can be used, for example. In addition, a quartz substrate, a sapphire substrate, or the like can be used.

As the substrate 101, a glass substrate having any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

When a flexible substrate is used as the substrate 101, a transistor, a capacitor, and the like may be directly formed over the flexible substrate, or they may be formed over a manufacturing substrate, and then separated from the manufacturing substrate and transferred onto the flexible substrate. To separate and transfer the transistor, the capacitor, and the like from the manufacturing substrate to the flexible substrate, a separation layer is preferably provided between the manufacturing substrate and the transistor, the capacitor, and the like.

For the flexible substrate, metal, an alloy, resin, glass, or fiber thereof can be used, for example. The flexible substrate used as the substrate 101 preferably has a lower coefficient of linear expansion because deformation due to an environment is suppressed. The flexible substrate used as the substrate 101 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon and aramid), polyimide, polycarbonate, and acrylic. In particular, aramid is preferably used for the flexible substrate because of its low coefficient of linear expansion.

As the substrate 101, a single crystal semiconductor substrate or a polycrystalline semiconductor substrate made of silicon, silicon carbide, or the like or a compound semiconductor substrate made of silicon germanium or the like can also be used. Alternatively, an SOI substrate, a semiconductor substrate on which a semiconductor element such as a strained transistor or a FIN-type transistor is provided, or the like can be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. That is, the substrate 101 is not limited to a simple supporting substrate and may be a substrate where a device such as a transistor is formed. In that case, at least one of the gate, the source, and the drain of the transistor may be electrically connected to the device.

[Insulating Layer]

The insulating layers 103 to 105, 108 to 111, and 113 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. Alternatively, a material in which two or more materials selected from an oxide material, a nitride material, an oxynitride material, and a nitride oxide material are mixed may be used.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

In particular, the insulating layers 104, 110, and 111 are preferably formed using an insulating material through which impurities do not easily pass. Examples of an insulating material through which impurities do not easily pass include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material through which impurities do not easily pass is used for the insulating layer 104, impurity diffusion from the substrate 101 side can be prevented, and the reliability of the transistor can be improved. When the insulating material through which impurities do not easily pass is used for the insulating layer 110, impurity diffusion from layers above the insulating layer 110 can be prevented, and the reliability of the transistor can be improved.

Moreover, the insulating layers 104, 110, and 111 are preferably formed using an insulating material into which oxygen is less likely to diffuse and/or be absorbed. In that case, diffusion of oxygen to the outside can be suppressed.

Note that each of the insulating layers 104, 110, and 111 may be a stack of insulating layers formed with these materials.

The hydrogen concentration of the insulating layers is preferably low in order to prevent an increase in the hydrogen concentration of the oxide semiconductor layer 106. In particular, the hydrogen concentration of the insulating layer in contact with the oxide semiconductor layer 106 is preferably low. In this embodiment, the hydrogen concentration of the insulating layers 105 and 108 is preferably low. Specifically, the hydrogen concentration of the insulating layers, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Furthermore, the nitrogen concentration of the insulating layer is preferably low in order to prevent an increase in the nitrogen concentration of the oxide semiconductor layer. Specifically, the nitrogen concentration of the insulating layer, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

At least one of the insulating layers 105, 108, and 109 is preferably formed using an insulating layer from which oxygen is released by heating (hereinafter also referred to as "insulating layer containing excess oxygen"). Specifically, it is preferable to use an insulating layer in which the amount of released oxygen converted into oxygen atoms is greater than or equal to $1.0\times10^{18}$ atoms/cm$^3$, greater than or equal to $1.0\times10^{19}$ atoms/cm$^3$, or greater than or equal to $1.0\times10^{20}$ atoms/cm$^3$ in thermal desorption spectroscopy (TDS) where heat treatment is performed such that the surface temperature of the insulating layer ranges from 100° C. to 700° C., preferably from 100° C. to 500° C.

It is particularly preferred that the amount of defects in the insulating layer in contact with the oxide semiconductor layer be small. Typically, the spin density of a signal that appears at g=2.001 due to a dangling bond of silicon is preferably lower than or equal to 3×10$^{17}$ spins/cm$^3$ by ESR measurement. If the amount of defects in the insulating layer is large, oxygen might be bonded to the defects, reducing excess oxygen.

It is particularly preferred that the insulating layer in contact with the oxide semiconductor layer be an oxide insulating layer in which the density of states due to nitrogen oxide (NOx) is low. A silicon oxynitride layer that releases less nitrogen oxide is a layer in which the amount of released ammonia is larger than the amount of released nitrogen oxide in TDS; the amount of released ammonia is typically greater than or equal to 1×10$^{18}$/cm$^3$ and less than or equal to 5×10$^{19}$/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

Nitrogen oxide (typically NO$_2$ or NO) forms a level in the oxide semiconductor layer or the insulating layer. The level is positioned in the energy gap of the oxide semiconductor. When nitrogen oxide reaches the interface between the insulating layer and the oxide semiconductor layer, an electron can potentially be trapped by the level on the insulating layer side. As a result, the trapped electrons remain in the vicinity of the interface between the insulating layer and the oxide semiconductor layer; thus, the threshold voltage of the transistor is shifted in the positive direction.

Note that the density of states due to nitrogen oxide can sometimes be formed between the energy of the valence band maximum (E$_{v\_os}$) and the energy of the conduction band minimum (E$_{c\_os}$) of the oxide semiconductor layer. As the oxide insulating layer, a silicon oxynitride layer that releases less nitrogen oxide, an aluminum oxynitride layer that releases less nitrogen oxide, and the like can be used.

Nitrogen oxide reacts with ammonia and oxygen in heat treatment. Since nitrogen oxide contained in the insulating layer reacts with ammonia contained in the insulating layer in heat treatment, the nitrogen oxide contained in the insulating layer is reduced. Consequently, electrons are hardly trapped at the interface between the insulating layer and the oxide semiconductor layer.

By using the above oxide insulating layer as the insulating layer in contact with the oxide semiconductor layer, a shift in the threshold voltage of the transistor can be reduced, which leads to reduced fluctuations in the electrical characteristics of the transistor.

The insulating layer containing excess oxygen can be formed by performing treatment for adding oxygen to an insulating layer. The treatment for adding oxygen can be performed by heat treatment under an oxygen atmosphere, an ion implantation method, an ion doping method, a plasma immersion ion implantation method, plasma treatment, inverse sputtering treatment, or the like. By oxygen addition through inverse sputtering treatment, the effect of cleaning a sample surface can be expected. Meanwhile, damage might occur on the sample surface depending on treatment conditions. As a gas for adding oxygen, an oxygen gas of $^{16}$O$_2$, $^{18}$O$_2$, or the like, a nitrous oxide gas, an ozone gas, or the like can be used. In this specification, the treatment for adding oxygen is also referred to as "oxygen doping treatment."

The insulating layer 113 preferably has a function of covering unevenness and the like caused by the transistor or the like. A material used for the insulating layer 113 is any insulating material; thus, the insulating layer 113 can be formed using an inorganic material or an organic material. For example, the insulating layer 113 can be formed using a heat-resistant organic material such as polyimide, acrylic, benzocyclobutene, polyamide, or epoxy as well as the aforementioned inorganic material. Other than such organic materials, it is also possible to use a low-dielectric constant material (low-k material), a siloxane-based resin, phosphosilicate glass (PSG), borophosphosilicate glass (BPSG), or the like. Note that the insulating layer 113 may be formed by stacking a plurality of insulating layers formed of any of these materials.

Note that a siloxane-based resin corresponds to a resin containing a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the method for forming the insulating layer 113, and any of the following methods appropriate for a material thereof can be used: a sputtering method, an SOG method, spin coating, dipping, spray coating, a droplet discharging method (e.g., an inkjet method), a printing method (e.g., screen printing or offset printing), or the like. When the baking step of the insulating layer 113 also serves as heat treatment for another layer, a transistor can be manufactured efficiently.

[Electrode]

As a conductive material for forming the electrodes 102, 107a_1, 107a_2, 107a_3, 107b_1, 107b_2, 107b_3, and 121, a material containing one or more metal elements selected from aluminum (Al), chromium (Cr), copper (Cu), silver (Ag), gold (Au), platinum (Pt), tantalum (Ta), nickel (Ni), titanium (Ti), molybdenum (Mo), tungsten (W), hafnium (Hf), vanadium (V), niobium (Nb), manganese (Mn), magnesium (Mg), zirconium (Zr), beryllium (Be), and the like can be used. Moreover, a semiconductor with a high electric conductivity, typified by polycrystalline silicon containing an impurity element such as phosphorus, or silicide such as nickel silicide may be used.

A Cu—X alloy film (X is Mn, Ni, Cr, Fe, Co, Mo, Ta, or Ti) may be used as the conductive material. A layer made of a Cu—X alloy can be processed with a wet etching process, resulting in lower manufacturing cost.

A conductive material containing the above metal element and oxygen may be used. A conductive material containing the above metal element and nitrogen may be used. For example, a conductive material containing nitrogen, such as titanium nitride or tantalum nitride, may be used. Indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide to which silicon is added, or indium gallium zinc oxide containing nitrogen may be used.

A stack of a plurality of conductive layers formed with the above materials may be used. For example, a stacked-layer structure formed using a material containing the above metal element and a conductive material containing oxygen may be used. Alternatively, a stacked-layer structure formed using a material containing the above metal element and a conductive material containing nitrogen may be used. Further alternatively, a stacked-layer structure formed using a material containing the above metal element, a conductive material containing oxygen, and a conductive material containing nitrogen may be used.

This embodiment shows an example where each of the electrodes 107a and 107b has a three-layer structure; however, one embodiment of the present invention is not limited to this. Each of the electrodes 107a and 107b may have a single-layer structure, a two-layer structure, or a stacked-layer structure of four or more layers.

When copper is used for the electrodes 107a and 107b to lower the resistance of the electrodes 107a and 107b, a conductive material into which copper does not easily diffuse is preferably provided between the electrode 107a and the oxide semiconductor layer 106 and between the electrode 107b and the oxide semiconductor layer 106. Since copper is likely to diffuse into a semiconductor layer, the operation of a semiconductor device might be unstable and the yield might be significantly reduced. When a conductive material into which copper does not easily diffuse is provided between the semiconductor layer and a wiring or an electrode that contains copper, the reliability of the transistor 100 can be increased.

Examples of a conductive material into which copper does not easily diffuse include a metal material having a higher melting point than copper (e.g., tungsten, titanium, and tantalum) and a nitride material thereof. Moreover, a wiring or an electrode containing copper may be covered with such a conductive material. When a wiring or an electrode containing copper is covered with or wrapped by a conductive material into which copper does not easily diffuse, the reliability of the transistor 100 can be further increased.

When a conductive material that has a function of absorbing hydrogen when being subjected to heat treatment is used for regions of the electrodes 107a and 107b in contact with the oxide semiconductor layer 106, the hydrogen concentration of the oxide semiconductor layer 106 can be reduced by heat treatment performed later. Examples of a conductive material with a function of absorbing hydrogen include titanium, indium zinc oxide, and indium tin oxide to which silicon is added.

[Oxide Semiconductor Layer]

An oxide semiconductor is preferably used for the oxide semiconductor layer 106. The band gap of an oxide semiconductor is greater than or equal to 2 eV; thus, when the oxide semiconductor is used for the oxide semiconductor layer 106, a transistor with an extremely low off-state current can be achieved. A transistor using an oxide semiconductor in the semiconductor layer where a channel is formed (also referred to as OS transistor) has high withstand voltage between its source and drain. Thus, a transistor with high reliability can be provided. A transistor with high output voltage and high withstand voltage can be provided. Furthermore, a semiconductor device or the like with high reliability can be provided. A semiconductor device with high output voltage and high withstand voltage can be provided.

An oxide semiconductor of the present invention will be described below. An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in an oxide semiconductor according to the present invention are described with reference to FIGS. 18A to 18C. Note that the proportion of oxygen atoms is not shown in FIGS. 18A to 18C. The terms of the atomic ratio of indium, the element M, and zinc contained in the oxide semiconductor are denoted by [In], [M], and [Zn], respectively.

Figures 18A, 18B, 18C:
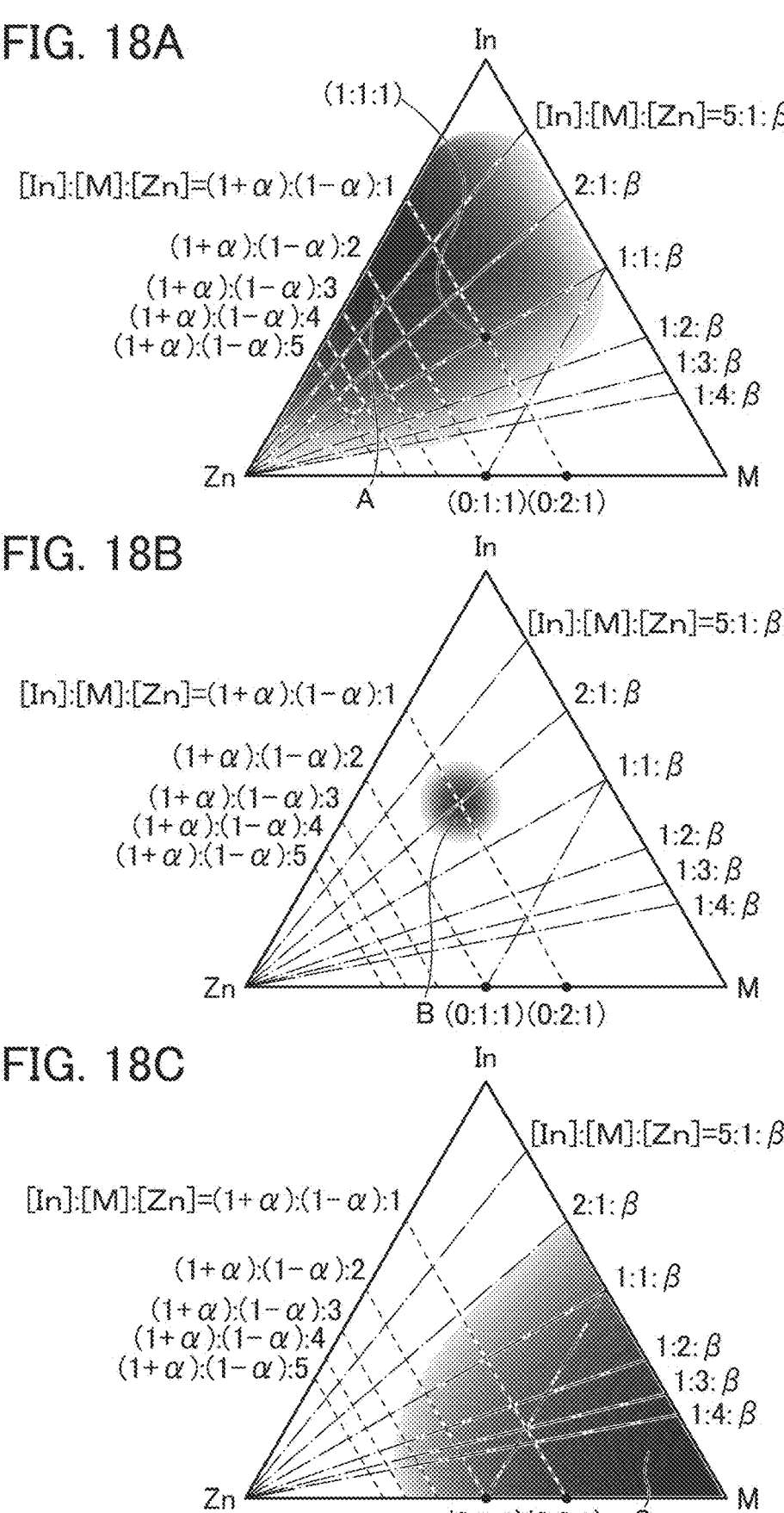
FIGS. 18A to 18C each show an atomic ratio range of an oxide of the present invention.

In FIGS. 18A to 18C, broken lines indicate a line where the atomic ratio [In]:[M]:[Zn] is $(1+\alpha):(1-\alpha):1$ (where $-1 \le \alpha \le 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ (where $\beta \ge 0$), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$ and a line where the atomic ratio [In]:[M]:[Zn] is $5:1:\beta$.

Dashed-double dotted lines indicate a line where the atomic ratio [In]:[M]:[Zn] is $(1+\gamma):2:(1-\gamma)$, where $-1 \le \gamma \le 1$. An oxide semiconductor having the atomic ratio [In]:[M]:[Zn] of 0:2:1 or close to 0:2:1 in FIGS. 18A to 18C tends to have a spinel crystal structure.

FIGS. 18A and 18B show examples of the preferred ranges of the atomic ratio of indium, the element M, and zinc contained in an oxide semiconductor of one embodiment of the present invention.

For example, when the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

InMZnO tends to have a layered crystal structure (also referred to as layered structure) in which a layer containing indium and oxygen (hereinafter "In layer") and a layer containing the element M, zinc, and oxygen (hereinafter "(M,Zn) layer") are stacked. Note that indium and the element M can be replaced with each other. When the element M in the (M,Zn) layer is replaced with indium, the layer can also be referred to as an (In,M,Zn) layer.

A plurality of phases (e.g., two phases or three phases) exist in the oxide semiconductor in some cases. For example, with an atomic ratio [In]:[M]:[Zn] close to 0:2:1, two phases of a spinel crystal structure and a layered crystal structure are likely to exist. Moreover, with an atomic ratio [In]:[M]:[Zn] close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor with a higher content of indium can have high carrier mobility (electron mobility). This is because in an oxide semiconductor containing indium, the element M, and zinc, the s orbital of heavy metal mainly contributes to carrier transfer, and a higher indium content in the oxide semiconductor enlarges a region where the s orbitals of indium atoms overlap; therefore, an oxide semiconductor with a high indium content has higher carrier mobility than an oxide semiconductor with a low indium content.

In contrast, when the indium content and the zinc content in an oxide semiconductor become lower, the carrier mobility becomes lower. Thus, with an atomic ratio [In]:[M]:[Zn] of 0:1:0 or around 0:1:0 (e.g., a region C in FIG. 18C), insulation performance becomes better.

Accordingly, an oxide semiconductor in one embodiment of the present invention preferably has an atomic ratio represented by a region A in FIG. 18A. With this atomic ratio, a layered structure with high carrier mobility and a few grain boundaries is easily obtained.

A region B in FIG. 18B represents an atomic ratio [In]:[M]:[Zn] of 4:2:3 to 4:2:4.1 and the vicinity thereof. The vicinity includes an atomic ratio [In]:[M]:[Zn] of 5:3:4. An oxide semiconductor with an atomic ratio represented by the region B is an excellent oxide semiconductor that has particularly high crystallinity and high carrier mobility.

Note that the property of an oxide semiconductor is not uniquely determined by an atomic ratio. Even with the same atomic ratio, the property of an oxide semiconductor may sometimes be different depending on a formation condition. Thus, the illustrated regions each represent an atomic ratio with which an oxide semiconductor tends to have specific characteristics, and boundaries of the regions A to C are not clear.

Next, the case where the oxide semiconductor is used for a transistor is described.

When the oxide semiconductor is used for a transistor, carrier scattering or the like at a grain boundary can be reduced; thus, the transistor can have high field-effect mobility. Moreover, the transistor can have high reliability.

An oxide semiconductor with a low carrier density is preferably used for a transistor. For example, an oxide semiconductor whose carrier density is lower than $8 \times 10^{11}/$ $cm^3$, preferably lower than $1 \times 10^{11}/cm^3$, further preferably lower than $1 \times 10^{10}/cm^3$, and greater than or equal to $1 \times 10^{-9}/cm^3$ is used.

A highly purified intrinsic or substantially highly purified intrinsic oxide semiconductor has few carrier generation sources and thus can have a low carrier density. A highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor with a high density of trap states has unstable electrical characteristics in some cases.

In view of the above, to obtain stable electrical characteristics of a transistor, it is effective to reduce the concentration of impurities in the oxide semiconductor. To reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor is described.

When silicon or carbon, which is a Group 14 element, is contained in the oxide semiconductor, defect states are formed in the oxide semiconductor. Thus, the concentration of silicon or carbon in the oxide semiconductor and around an interface with the oxide semiconductor (measured by secondary ion mass spectrometry (SIMS)) is lower than or equal to $2 \times 10^{18}$ atoms/$cm^3$, preferably lower than or equal to $2 \times 10^{17}$ atoms/$cm^3$.

When the oxide semiconductor contains alkali metal or alkaline earth metal, defect states are formed and carriers are generated in some cases. Thus, a transistor using an oxide semiconductor that contains alkali metal or alkaline earth metal is likely to have normally-on characteristics. Accordingly, it is preferable to reduce the concentration of alkali metal or alkaline earth metal in the oxide semiconductor. Specifically, the concentration of alkali metal or alkaline earth metal in the oxide semiconductor, measured by SIMS, is lower than or equal to $1 \times 10^{18}$ atoms/$cm^3$, preferably lower than or equal to $2 \times 10^{16}$ atoms/$cm^3$.

When the oxide semiconductor contains nitrogen, the oxide semiconductor easily becomes n-type by generation of electrons serving as carriers and an increase of carrier density. Thus, a transistor in which an oxide semiconductor containing nitrogen is used as a semiconductor is likely to have normally-on characteristics. For this reason, nitrogen in the oxide semiconductor is preferably reduced as much as possible. In particular, nitrogen in a region where the channel is formed is preferably reduced as much as possible. For example, the nitrogen concentration in the oxide semiconductor, measured by SIMS, is lower than $5 \times 10^{19}$ atoms/$cm^3$, preferably lower than $5 \times 10^{18}$ atoms/$cm^3$, further preferably lower than $1 \times 10^{18}$ atoms/$cm^3$, still further preferably lower than $5 \times 10^{17}$ atoms/$cm^3$.

Hydrogen contained in an oxide semiconductor reacts with oxygen bonded to a metal atom to be water, and thus causes an oxygen vacancy in some cases. Due to entry of hydrogen into the oxygen vacancy, an electron serving as a carrier is sometimes generated. Furthermore, in some cases, bonding of part of hydrogen to oxygen bonded to a metal atom causes generation of an electron serving as a carrier. Thus, a transistor using an oxide semiconductor that contains hydrogen is likely to have normally-on characteristics. Accordingly, hydrogen in the oxide semiconductor is preferably reduced as much as possible. In particular, hydrogen in a region where the channel is formed is preferably reduced as much as possible. Specifically, the hydrogen concentration in the oxide semiconductor, measured by SIMS, is lower than $1 \times 10^{20}$ atoms/$cm^3$, preferably lower than $1 \times 10^{19}$ atoms/$cm^3$, further preferably lower than $5 \times 10^{18}$ atoms/$cm^3$, still further preferably lower than $1 \times 10^{18}$ atoms/$cm^3$.

When an oxide semiconductor with sufficiently reduced impurity concentration is used for a channel formation region in a transistor, the transistor can have stable electrical characteristics.

For example, in the case where an $InGaZnO_X$ film (X>0) is formed as the oxide semiconductor layer 106 by a thermal CVD method, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, in the case where an $InGaZnO_X$ film (X>0) is formed as the oxide semiconductor layer 106 by an ALD method, an $In(CH_3)_3$ gas and an $O_3$ gas are sequentially introduced a plurality of times to form an $InO_2$ layer, a $Ga(CH_3)_3$ gas and an $O_3$ gas are sequentially introduced a plurality of times to form a GaO layer, and then a $Zn(CH_3)_2$ gas and an $O_3$ gas are sequentially introduced a plurality of times to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed using these gases. Note that although an $H_2O$ gas obtained by bubbling water with an inert gas such as Ar may be used instead of an $O_3$ gas, it is preferable to use an $O_3$ gas, which does not contain H. Instead of an $In(CH_3)_3$ gas, an $In(C_2H_5)_3$ gas or tris (acetylacetonato)indium may be used. Note that tris(acetylacetonato)indium is also referred to as $In(acac)_3$. Instead of a $Ga(CH_3)_3$ gas, a $Ga(C_2H_5)_3$ gas or tris(acetylacetonato) gallium may be used. Note that tris(acetylacetonato)gallium is also referred to as $Ga(acac)_3$. Furthermore, a $Zn(CH_3)_2$ gas or zinc acetate may be used. However, the deposition gas is not limited to the above.

In the case where the oxide semiconductor layer 106 is formed by a sputtering method, a target containing indium is preferably used in order to reduce the number of particles. In addition, if an oxide target having a high atomic ratio of the element Mis used, the conductivity of the target may be decreased. When a target containing indium is used, the conductivity of the target can be increased and DC discharge or AC discharge is facilitated; thus, deposition over a large substrate can be easily performed. Thus, semiconductor devices can be manufactured with improved productivity.

In the case where the oxide semiconductor layer 106 is formed by a sputtering method, the atomic ratio of In to M and Zn (In:M:Zn) contained in the target is 3:1:1, 3:1:2, 3:1:4, 1:1:0.5, 1:1:1, 1:1:2, 1:1:1.2, 1:4:4, 4:2:4.1, 1:3:2, 1:3:4, 5:1:6, 5:1:8, or the like.

In the case where the oxide semiconductor layer 106 is formed by a sputtering method, a film having an atomic ratio deviated from the atomic ratio of the target is formed in some cases. In particular, the atomic ratio of zinc in a deposited film is smaller than that in the target in some cases. Specifically, the film sometimes has an atomic ratio of zinc of 40 atomic % to 90 atomic % of the atomic ratio of zinc in the target.

For the oxide semiconductor layer 106_1, an oxide semiconductor with a wide energy gap is used, for example. The energy gap of the oxide semiconductor layer 106_1 ranges, for example, from 2.5 eV to 4.2 eV, preferably from 2.8 eV to 3.8 eV, further preferably from 3 eV to 3.5 eV.

The oxide semiconductor layers 106_2 and 106_3 are preferably formed using a material containing one or more kinds of metal elements, other than oxygen, contained in the oxide semiconductor layer 106_1. With the use of such a material, interface states at interfaces between the oxide semiconductor layer 106_3 and the oxide semiconductor layer 106_1 and between the oxide semiconductor layer 106_2 and the oxide semiconductor layer 106_1 are less likely to be generated. Accordingly, carriers are not likely to be scattered or captured at the interfaces, which results in an improvement in field-effect mobility of the transistor. Furthermore, variations in threshold voltage of transistors can be reduced. Thus, a semiconductor device having favorable electrical characteristics can be obtained.

When the oxide semiconductor layer 106_1 is an In-M-Zn oxide (oxide containing In, the element M, and Zn) with an atomic ratio In:M:Zn of $x_2:y_2:z_2$ and each of the oxide semiconductor layers 106_2 and 106_3 is an In-M-Zn oxide with an atomic ratio In:M:Zn of $x_1:y_1:z_1$, $y_1/x_1$ is preferably larger than $y_2/x_2$, further preferably 1.5 or more times $y_2/x_2$, still further preferably two or more times $y_2/x_2$, yet still further preferably three or more times $y_2/x_2$. At this time, $y_1$ is preferably greater than or equal to $x_1$ in the oxide semiconductor layer 106_1, in which case the transistor can have stable electrical characteristics. However, if $y_1$ is five or more times $x_1$, the field-effect mobility of the transistor is reduced; accordingly, $y_1$ is preferably smaller than five times $x_1$. With the above structure, each of the oxide semiconductor layers 106_2 and 106_3 can be a layer in which oxygen vacancy is less likely to be formed than in the oxide semiconductor layer 106_1.

In the case where the oxide semiconductor layer 106_3 is an In-M-Zn oxide and the total content of In and M is assumed to be 100 atomic %, the proportions of In and M are preferably less than 50 atomic % and greater than 50 atomic %, respectively, further preferably less than 25 atomic % and greater than 75 atomic %, respectively. In the case where the oxide semiconductor layer 106_1 is an In-M-Zn oxide and the total content of In and Mis assumed to be 100 atomic %, the proportions of In and M are preferably greater than 25 atomic % and less than 75 atomic %, respectively, further preferably greater than 34 atomic % and less than 66 atomic %, respectively. In the case where the oxide semiconductor layer 106_2 is an In-M-Zn oxide and the total content of In and Mis assumed to be 100 atomic %, the proportions of In and M are preferably less than 50 atomic % and greater than 50 atomic %, respectively, further preferably less than 25 atomic % and greater than 75 atomic %, respectively. Note that the oxide semiconductor layers 106_2 and 106_3 may be formed using the same type of oxide.

For example, an In—Ga—Zn oxide formed using a target with an atomic ratio In:Ga:Zn of 1:3:2, 1:3:4, 1:3:6, 1:4:5, 1:6:4, or 1:9:6 or an In—Ga oxide formed using a target with an atomic ratio In:Ga of 1:9 or 7:93 can be used for each of the oxide semiconductor layers 106_2 and 106_3 containing In or Ga. Moreover, an In—Ga—Zn oxide formed using a target with an atomic ratio In:Ga:Zn of 1:1:1 or 3:1:2 can be used for the oxide semiconductor layer 106_1, for example. Note that the atomic ratio of each of the oxide semiconductor layers 106_1 to 106_3 may vary within a margin of ±20% of the corresponding atomic ratio.

For the oxide semiconductor layer 106_1, an oxide having a higher electron affinity than the oxide semiconductor layers 106_2 and 106_3 is preferably used. For example, the oxide semiconductor layer 106_1 may be an oxide having an electron affinity higher than that of each of the oxide semiconductor layers 106_2 and 106_3 by 0.07 eV or higher and 1.3 eV or lower, preferably 0.1 eV or higher and 0.7 eV or lower, further preferably 0.15 eV or higher and 0.4 eV or lower. Note that the electron affinity refers to an energy difference between the vacuum level and the conduction band minimum.

Indium gallium oxide has a small electron affinity and an excellent oxygen-blocking property. Therefore, the oxide semiconductor layer 106_2 preferably contains indium gallium oxide. The gallium atomic ratio [Ga/(In+Ga)] is, for example, higher than or equal to 70%, preferably higher than or equal to 80%, further preferably higher than or equal to 90%.

Note that the oxide semiconductor layer 106_2 and/or the oxide semiconductor layer 106_3 may be gallium oxide. For example, when gallium oxide is used for the oxide semiconductor layer 106_3, a leakage current generated between the electrode 102 and the oxide semiconductor layer 106 can be reduced. In other words, the off-state current of the transistor 100 can be reduced.

At this time, when a gate voltage is applied, a channel is formed in the oxide semiconductor layer 106_1 having the highest electron affinity among the oxide semiconductor layers 106_1 to 106_3.

In order to give stable electrical characteristics to the OS transistor, it is preferred that impurities and oxygen vacancies in the oxide semiconductor layer be reduced to highly purify the oxide semiconductor layer so that at least the oxide semiconductor layer 106_1 can be regarded as an intrinsic or substantially intrinsic oxide semiconductor layer. Furthermore, preferably at least the channel formation region of the oxide semiconductor layer 106_1 is regarded as an intrinsic or substantially intrinsic semiconductor layer.

[Classification of Oxide Semiconductor Films]

Next, classification of oxide semiconductor films will be described.

An oxide semiconductor film is classified into a single crystal oxide semiconductor film and a non-single-crystal oxide semiconductor film. Examples of a non-single-crystal oxide semiconductor film include a c-axis-aligned crystalline oxide semiconductor (CAAC-OS) film, a polycrystalline oxide semiconductor film, a nanocrystalline oxide semiconductor (nc-OS) film, an amorphous-like oxide semiconductor (a-like OS) film, and an amorphous oxide semiconductor film.

From another perspective, an oxide semiconductor film is classified into an amorphous oxide semiconductor film and a crystalline oxide semiconductor film. Examples of a crystalline oxide semiconductor film include a single crystal oxide semiconductor film, a CAAC-OS film, a polycrystalline oxide semiconductor film, and an nc-OS film.

An amorphous structure is generally thought to be isotropic and have no non-uniform structure, to be metastable and not to have fixed positions of atoms, to have a flexible bond angle, and to have a short-range order but have no long-range order, for example.

In other words, a stable oxide semiconductor film cannot be regarded as a completely amorphous oxide semiconductor film. Moreover, an oxide semiconductor film that is not isotropic (e.g., an oxide semiconductor film that has a periodic structure in a microscopic region) cannot be regarded as a completely amorphous oxide semiconductor film. In contrast, an a-like OS film, which is not isotropic, has an unstable structure that contains a void. Because of its instability, an a-like OS film is close to an amorphous oxide semiconductor film in terms of physical properties.

[CAAC-OS]

A CAAC-OS film is an oxide semiconductor film having a plurality of c-axis-aligned crystal parts (also referred to as pellets).

A CAAC-OS film is an oxide semiconductor film with high crystallinity. Entry of impurities, formation of defects, or the like might decrease the crystallinity of an oxide semiconductor film. This means that the CAAC-OS film has negligible amounts of impurities and defects (e.g., oxygen vacancies).

Note that impurities mean an element other than the main components of an oxide semiconductor film, such as hydrogen, carbon, silicon, and a transition metal element. For example, an element (e.g., silicon) having higher strength of bonding to oxygen than a metal element contained in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity.

[nc-OS]

Analysis of an nc-OS by XRD is described. When the structure of an nc-OS is analyzed by an out-of-plane method, a peak indicating orientation does not appear. That is, a crystal of an nc-OS does not have orientation.

An nc-OS film is an oxide semiconductor film that has higher regularity than an amorphous oxide semiconductor film. Therefore, the nc-OS film is likely to have a lower density of defect states than an a-like OS film and an amorphous oxide semiconductor film. Since there is no regularity of crystal orientation between different pellets in the nc-OS, the nc-OS has a higher density of defect states than the CAAC-OS.

[a-Like OS]

An a-like OS film has a structure between those of the nc-OS film and an amorphous oxide semiconductor film.

An a-like OS includes a void or a low-density region. The a-like OS has an unstable structure because it includes a void.

The a-like OS has a lower density than the nc-OS and the CAAC-OS because it includes a void. Specifically, the density of the a-like OS is higher than or equal to 78.6% and lower than 92.3% of the density of a single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in an oxide semiconductor film having an atomic ratio of In:Ga:Zn=1:1:1, the density of single crystal $InGaZnO_4$ with a rhombohedral crystal structure is 6.357 $g/cm^3$. Accordingly, for an oxide semiconductor film having an atomic ratio of In:Ga:Zn=1:1:1, for example, the density of the a-like OS is higher than or equal to 5.0 $g/cm^3$ and lower than 5.9 $g/cm^3$, and the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate a density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductor films have various structures and various properties. In the oxide semiconductor film of one embodiment of the present invention, two or more of an amorphous oxide semiconductor, an a-like OS, an nc-OS, and a CAAC-OS may be mixed.

[Film Formation Method]

The insulating layers, the conductive layers for forming electrodes or wirings, the semiconductor layers, or the like can be formed by a sputtering method, a spin coating method, a chemical vapor deposition (CVD) method (such as a thermal CVD method, a metal organic chemical vapor deposition (MOCVD) method, a plasma-enhanced CVD (PECVD) method, a high-density plasma CVD method, a low-pressure CVD (LPCVD) method, or an atmospheric-pressure CVD (APCVD) method), an atomic layer deposition (ALD) method, a molecular beam epitaxy (MBE) method, a pulsed laser deposition (PLD) method, a dipping method, a spray coating method, a droplet discharging method (such as an inkjet method), or a printing method (such as screen printing or offset printing).

By using a PECVD method, a high-quality film can be formed at a relatively low temperature. By using a deposition method that does not use plasma for deposition, such as an MOCVD method, an ALD method, or a thermal CVD method, damage is not easily caused on a surface on which the film is deposited. For example, a wiring, an electrode, an element (e.g., transistor or capacitor), or the like included in a semiconductor device may sometimes be charged up by receiving charges from plasma. In that case, accumulated charges might break the wiring, electrode, element, or the like included in the semiconductor device. Such plasma damage is not caused in the case of using a deposition method without using plasma, and thus the yield of a semiconductor device can be increased. In addition, since plasma damage does not occur in the deposition, a film with few defects can be obtained.

Unlike in a deposition method in which particles ejected from a target or the like are deposited, a film is formed by reaction at a surface of an object in a CVD method and an ALD method. Thus, a CVD method and an ALD method enable favorable step coverage almost regardless of the shape of the object. In particular, an ALD method enables excellent step coverage and excellent thickness uniformity and can be favorably used to cover a surface of an opening with a high aspect ratio, for example. On the other hand, an ALD method has a relatively low deposition rate; thus, it is sometimes preferable to combine an ALD method with another deposition method with a high deposition rate, such as a CVD method.

When a CVD method or an ALD method is used, the composition of a film to be formed can be controlled with a flow rate ratio of source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, the time taken for the film formation can be reduced because the time taken for transfer and pressure adjustment is omitted. Thus, semiconductor devices can be manufactured with improved productivity.

In the case where a film is formed by an ALD method, a gas that does not contain chlorine is preferably used as a material gas.

When an oxide semiconductor is formed by a sputtering method, each chamber of a sputtering apparatus is preferably evacuated to a high vacuum (to the degree of approximately $5\times10^{-7}$ Pa to $1\times10^{-4}$ Pa) by an adsorption vacuum pump such as a cryopump so that water and the like acting as impurities for the oxide semiconductor can be removed as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa.

In addition, increasing the purity of a sputtering gas is necessary. For example, as an oxygen gas or an argon gas used for a sputtering gas, a gas that is highly purified to have a dew point of $-40°$ C. or lower, preferably $-80°$ C. or lower, further preferably $-100°$ C. or lower, still further preferably $-120°$ C. or lower is used, whereby entry of moisture or the like into the oxide semiconductor film can be minimized.

In the case where the insulating layers, the conductive layers, the semiconductor layers, or the like are formed by a sputtering method using a sputtering gas containing oxygen, oxygen can be supplied to a layer over which these layers are formed. As the amount of oxygen contained in the sputtering gas increases, the amount of oxygen supplied to a layer over which these layers are formed tends to increase.

Example of Method for Manufacturing Transistor
100

Figure 7A:
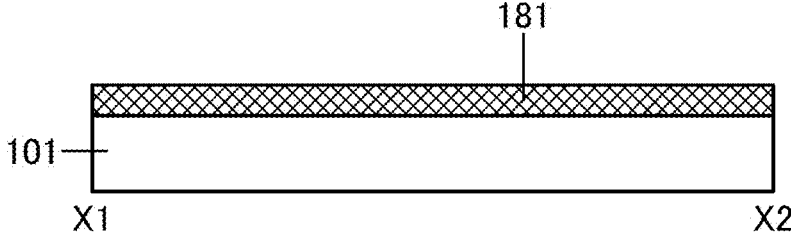
FIGS. 7A to 7D illustrate steps for manufacturing a transistor.

An example of a method for manufacturing the transistor 100 illustrated in FIGS. 1A and 1B and FIGS. 2A and 2B will be described with reference to FIGS. 7A to 7D, FIGS. 8A to 8C, FIGS. 9A to 9C, and FIGS. 10A to 10C. Cross sections X1-X2 in FIGS. 7A to 7D, FIGS. 8A to 8C, FIGS. 9A to 9C, and FIGS. 10A to 10C correspond to the cross section of the portion indicated by the dashed-dotted line X1-X2 in FIG. 1A.
[Step 1]
First, a conductive layer 181 for forming the electrode 102 is formed over the substrate 101 (see FIG. 7A). In this embodiment, aluminoborosilicate glass is used for the substrate 101. Moreover, in this embodiment, as the conductive layer 181, a 50-nm-thick titanium layer and a 200-nm-thick copper layer are formed in this order by a sputtering method.
[Step 2]
Next, a resist mask is formed (not illustrated). The resist mask can be formed by a photolithography method, a printing method, an inkjet method, or the like as appropriate. Formation of the resist mask by a printing method, an inkjet method, or the like needs no photomask; thus, the manufacturing cost can be reduced.

The formation of the resist mask by a photolithography method can be performed in such a manner that a photosensitive resist is irradiated with light through a photomask and a portion of the resist that has been exposed to light (or has not been exposed to light) is removed using a developing solution. Examples of light with which the photosensitive resist is irradiated include KrF excimer laser light, ArF excimer laser light, and extreme ultraviolet (EUV) light. Alternatively, a liquid immersion technique may be employed in which light exposure is performed with a portion between a substrate and a projection lens filled with liquid (e.g., water). An electron beam or an ion beam may be used instead of the above-mentioned light. Note that a photomask is not necessary in the case of using an electron beam or an ion beam.

Figure 7B:
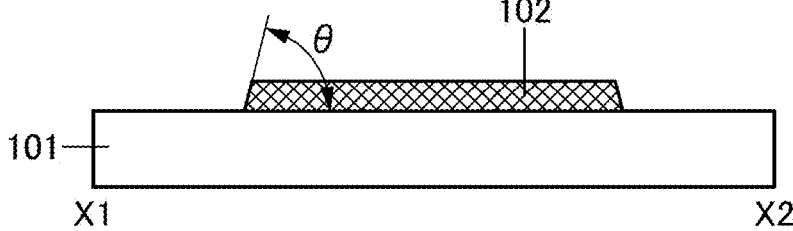

With the use of the resist mask as a mask, a portion of the conductive layer 181 is selectively removed to form the electrode 102 (see FIG. 7B). The insulating layer 181 can be removed by a dry etching method, a wet etching method, or the like. Both the dry etching method and the wet etching method may be used.

The resist mask is removed after the portion of the conductive layer 181 is removed. The resist can be removed by a dry etching method such as ashing or a wet etching method using a dedicated stripper or the like. Both the dry etching method and the wet etching method may be used.

A side surface of the electrode 102 is preferably tapered in cross section. A taper angle $\theta$ of the side surface of the electrode 102 is preferably $20°$ or more and less than $90°$, further preferably $30°$ or more and less than $80°$, still further preferably $40°$ or more and less than $70°$. Note that the taper angle $\theta$ refers to an angle formed by a side surface and a bottom surface of a layer having a tapered shape when the layer is seen from the cross-sectional direction (i.e., the direction of the plane perpendicular to the substrate surface).

The tapered shape of the side surface of the electrode 102 can prevent disconnection of a layer formed over the electrode 102 and improve the coverage. Moreover, the tapered shape of the side surface of the electrode 102 can relieve electric field concentration at an upper edge portion of the electrode 102. Meanwhile, if the taper angle θ is too small, miniaturization of the transistor is sometimes difficult or variations in opening size, wiring width, or the like sometimes increase.

The side surface of the electrode 102 may have a step-like shape, in which case disconnection of a layer formed over the electrode 102 can be prevented and the coverage can be improved. As well as the side surface of the electrode 102, an edge portion of any layer can have a tapered shape or a step-like shape, in which case disconnection of a layer covering the layer (disconnection caused by a step) can be prevented, resulting in favorable coverage.

[Step 3]

Figure 7C:
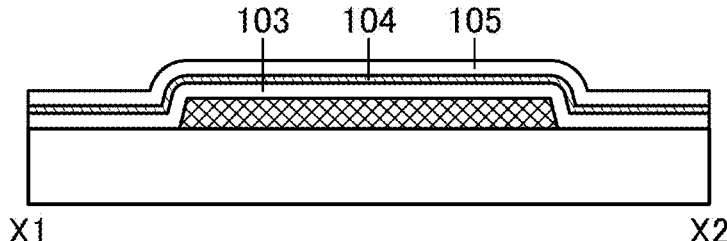

Next, the insulating layer 103, the insulating layer 104, and the insulating layer 105 are sequentially formed (see FIG. 7C). In this embodiment, a 400-nm-thick silicon nitride layer is formed as the insulating layer 103, a 30-nm-thick aluminum oxide layer as the insulating layer 104, and a 50-nm-thick silicon oxynitride layer as the insulating layer 105.

Note that the silicon nitride layer used as the insulating layer 103 has a three-layer structure of a first silicon nitride layer, a second silicon nitride layer, and a third silicon nitride layer. The three-layer structure can be formed as follows, for example.

For example, the first silicon nitride layer can be formed to have a thickness of 50 nm under the conditions where silane at a flow rate of 200 sccm, nitrogen at a flow rate of 2000 sccm, and an ammonia gas at a flow rate of 100 sccm are supplied as source gases to a reaction chamber of a PECVD apparatus, the pressure in the reaction chamber is controlled to 100 Pa, and a power of 2000 W is supplied using a 27.12 MHz high-frequency power source.

The second silicon nitride layer can be formed to have a thickness of 300 nm under the conditions where silane at a flow rate of 200 sccm, nitrogen at a flow rate of 2000 sccm, and an ammonia gas at a flow rate of 2000 sccm are supplied as source gasses to the reaction chamber of the PECVD apparatus, the pressure in the reaction chamber is controlled to 100 Pa, and a power of 2000 W is supplied using the 27.12 MHz high-frequency power source.

The third silicon nitride layer can be formed to have a thickness of 50 nm under the conditions where silane at a flow rate of 200 sccm and nitrogen at a flow rate of 5000 sccm are supplied as source gasses to the reaction chamber of the PECVD apparatus, the pressure in the reaction chamber is controlled to 100 Pa, and a power of 2000 W is supplied using the 27.12 MHz high-frequency power source.

Note that each of the first to third silicon nitride layers can be formed at a substrate temperature of 350° C. or lower.

For example, when a conductive layer containing copper is used as the electrode 102, the silicon nitride layer with the above three-layer structure provides the following effects.

The first silicon nitride layer can inhibit diffusion of copper elements from the electrode 102. The second silicon nitride layer has a function of releasing hydrogen and can improve the withstand voltage of an insulating layer functioning as a gate insulating layer. The third silicon nitride layer releases a small amount of hydrogen and can prevent diffusion of hydrogen released from the second silicon nitride layer.

As described above, the insulating layer 104 is preferably formed using an insulating material through which impurities do not easily pass. Furthermore, the insulating layer 104 is preferably formed using an insulating material into which oxygen is less likely to diffuse. An aluminum oxide layer used as the insulating layer 104 may be formed by a DC sputtering method using an aluminum target or by an AC sputtering method using an aluminum oxide target. Alternatively, the aluminum oxide layer may be formed by an ALD method.

As the insulating layer 105, an insulating layer containing excess oxygen is preferably used. The insulating layer 105 may be subjected to oxygen doping treatment. Moreover, heat treatment is preferably performed after formation of the insulating layer 105 to reduce hydrogen and moisture contained in the insulating layer 105. Oxygen doping treatment may be performed after the heat treatment. For example, the oxygen doping treatment is performed while the substrate is heated at 400° C. and a gas containing argon and oxygen is excited at a frequency of 2.45 GHz. The heat treatment and the oxygen doping treatment may be performed plural times.

When the insulating layer 105 is exposed to a plasma atmosphere of nitrogen or an inert gas, impurities such as hydrogen and carbon on or near a surface of the insulating layer 105 can be reduced. For example, while the substrate is heated at 400° C., the insulating layer 105 is exposed to a plasma atmosphere where a gas containing argon and nitrogen is excited at a frequency of 2.45 GHz.

For example, the heat treatment is performed in an inert gas atmosphere containing nitrogen, a rare gas, or the like, an oxidizing gas atmosphere, or an ultra-dry air atmosphere (in which the moisture amount measured with a dew point meter in a cavity ring down laser spectroscopy (CRDS) system is 20 ppm (corresponding to a dew point of −55° C.) or lower, preferably 1 ppm or lower, further preferably 10 ppb or lower). Note that the oxidizing atmosphere refers to an atmosphere containing an oxidizing gas such as oxygen, ozone, or nitrogen oxide at 10 ppm or higher. The inert atmosphere refers to an atmosphere that contains the oxidizing gas at lower than 10 ppm and is filled with nitrogen or a rare gas. Although there is no particular limitation on the pressure during the heat treatment, the heat treatment is preferably performed under a reduced pressure.

The heat treatment is performed at temperatures of 150° C. or higher and lower than the strain point of the substrate, preferably from 200° C. to 500° C., further preferably from 250° C. to 400° C. The treatment time is shorter than or equal to 24 hours. Heat treatment for over 24 hours is not preferable because the productivity is reduced.

The heat treatment can be performed using an electric furnace, an RTA apparatus, or the like. With the use of an RTA apparatus, the heat treatment can be performed at a temperature higher than or equal to the strain point of the substrate if the heating time is short. Thus, the heating time can be shortened. Note that the atmosphere of nitrogen, oxygen, ultra-dry air, or a rare gas preferably does not contain hydrogen, water, and the like.

[Step 4]

Figure 7D:
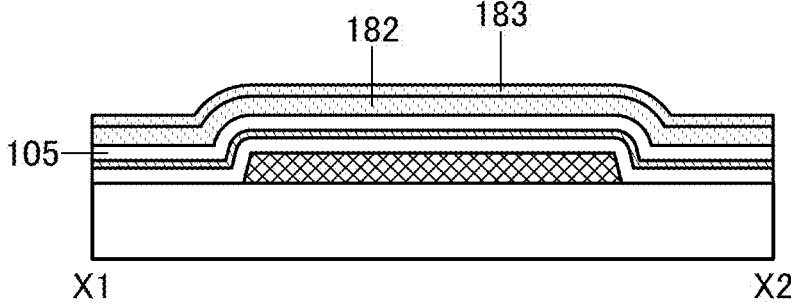

Next, an oxide semiconductor layer 182 and an oxide semiconductor layer 183 are sequentially formed (see FIG. 7D). Note that before the oxide semiconductor layer 182 is formed, an oxygen gas may be supplied to generate plasma, in which case oxygen can be added to the insulating layer 105, which is a surface where the oxide semiconductor layer 182 is formed.

For the oxide semiconductor layer 182, it is preferable to use indium zinc oxide, indium gallium zinc oxide formed using a target with an atomic ratio In:Ga:Zn=5:1:6 or 4:2:3, or the like.

In this embodiment, for the oxide semiconductor layer 182, indium gallium zinc oxide is deposited by a sputtering method using a target with an atomic ratio In:Ga:Zn=5:1:6. Oxygen or a mixed gas of oxygen and a rare gas is used as a sputtering gas. In this embodiment, a mixed gas of oxygen and argon at an oxygen flow rate ratio of 10% is used as the sputtering gas.

When the flow rate ratio of oxygen in the sputtering gas is higher than or equal to 0% and lower than or equal to 30%, preferably higher than or equal to 5% and lower than or equal to 20%, an oxygen-deficient oxide semiconductor layer is formed. A transistor including an oxygen-deficient oxide semiconductor layer can have relatively high field-effect mobility.

At the formation of the oxide semiconductor layer 182, part of oxygen contained in the sputtering gas is supplied to the insulating layer 105 in some cases. As the amount of oxygen contained in the sputtering gas increases, the amount of oxygen supplied to the insulating layer 105 increases. Part of oxygen supplied to the insulating layer 105 reacts with hydrogen left in the insulating layer 105 to produce water, and the water is released from the insulating layer 105 by heat treatment performed later. Thus, the hydrogen concentration in the insulating layer 105 can be reduced. Moreover, when the amount of excess oxygen in the insulating layer 105 is increased, oxygen can be supplied to the oxide semiconductor layer 182 (that is to be the oxide semiconductor layer 106_1) by heat treatment performed later.

For the oxide semiconductor layer 183, it is preferable to use indium gallium zinc oxide formed using a target with an atomic ratio In:Ga:Zn=5:1:6, 4:2:3, or 1:1:1, for example.

Moreover, for the oxide semiconductor layer 183, it is preferable to use an oxide semiconductor layer with high crystallinity, e.g., a CAAC-OS layer. For example, in a subsequent etching step for forming the electrodes 107a and 107b, an exposed portion of the oxide semiconductor layer is etched and the oxide semiconductor layer is damaged in some cases. An oxide semiconductor layer with high crystallinity is not likely to be etched in this etching step. Using an oxide semiconductor layer with high crystallinity as the oxide semiconductor layer 183 can reduce damage of the oxide semiconductor layer caused in the etching step; thus, the reliability of the transistor can be improved.

In this embodiment, a CAAC-OS is used for the oxide semiconductor layer 183. Specifically, indium gallium zinc oxide is deposited by a sputtering method using a target with an atomic ratio In:Ga:Zn=1:1:1. Oxygen or a mixed gas of oxygen and a rare gas is used as a sputtering gas. In this embodiment, 100% oxygen is used as the sputtering gas. The flow rate ratio of oxygen in the sputtering gas for forming the oxide semiconductor layer 183 is preferably 70% or more, further preferably 80% or more, still further preferably 100%. By increasing the proportion (flow rate ratio) of oxygen in the sputtering gas, the crystallinity of the oxide semiconductor layer can be increased.

By introducing an impurity element after formation of the oxide semiconductor layer 183, the threshold voltage of the transistor 100 can be changed. An impurity element can be introduced by an ion implantation method, an ion doping method, a plasma immersion ion implantation method, plasma treatment using a gas containing an impurity element, or the like.

After the oxide semiconductor layer 183 is formed, heat treatment and/or oxygen doping treatment may be performed. Heat treatment and oxygen doping treatment may be performed plural times.

Furthermore, after heat treatment is performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor layer and oxygen can be supplied to the oxide semiconductor layer at the same time. Consequently, oxygen vacancies in the oxide semiconductor layer can be reduced.

[Step 5]

Then, a resist mask is formed by a photolithography method (not illustrated). With the use of the resist mask as a mask, portions of the oxide semiconductor layers 182 and 183 are selectively removed, so that the island-shaped oxide semiconductor layers 106_1 and 106_2 are formed (see FIG. 8A).

After the oxide semiconductor layers 106_1 and 106_2 are formed, heat treatment and/or oxygen doping treatment may be performed. Heat treatment and oxygen doping treatment may be performed plural times.

[Step 6]

Figure 8A:
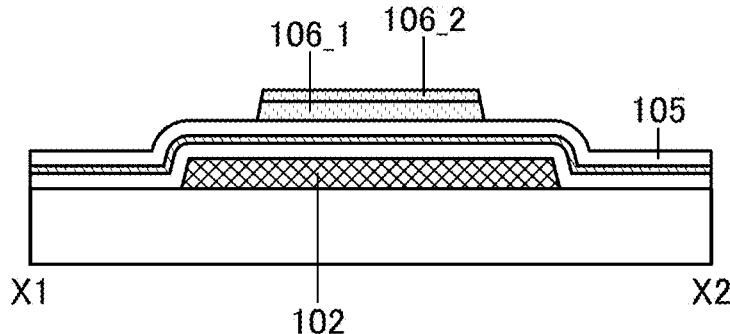
FIGS. 8A to 8C illustrate steps for manufacturing a transistor.
Figure 8B:
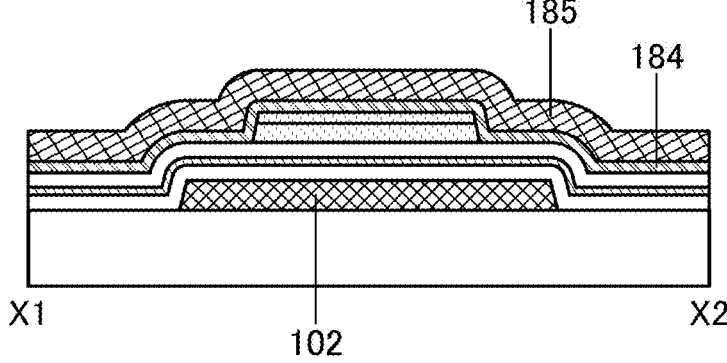
Figure 8C:
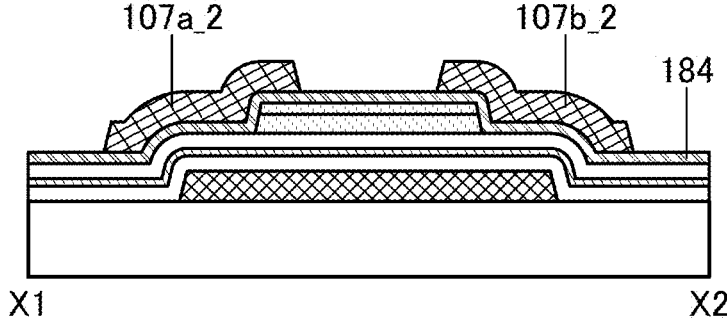

Subsequently, a conductive layer 184 and a conductive layer 185 are sequentially formed (see FIG. 8B). Since the conductive layer 184 is in contact with the oxide semiconductor layer 106, the conductive layer 184 is preferably formed using a conductive material with a function of absorbing hydrogen through heat treatment. When the conductive layer 184 is formed using such a material, the hydrogen concentration of the oxide semiconductor layer 106 can be reduced by heat treatment performed later. Examples of a conductive material with a function of absorbing hydrogen include titanium, indium zinc oxide, and indium tin oxide to which silicon is added.

In this embodiment, a 30-nm-thick titanium layer is formed as the conductive layer 184, and a 200-nm-thick copper layer is formed by a sputtering method as the conductive layer 185.

[Step 7]

Next, a resist mask is formed by a photolithography method (not illustrated). With the use of the resist mask as a mask, a portion of the conductive layer 185 is selectively removed, so that the electrode 107a_2 and the electrode 107b_2 are formed (see FIG. 8C).

The conductive layer 185 can be removed by a dry etching method, a wet etching method, or the like. Both the dry etching method and the wet etching method may be used.

[Step 8]

Figure 9A:
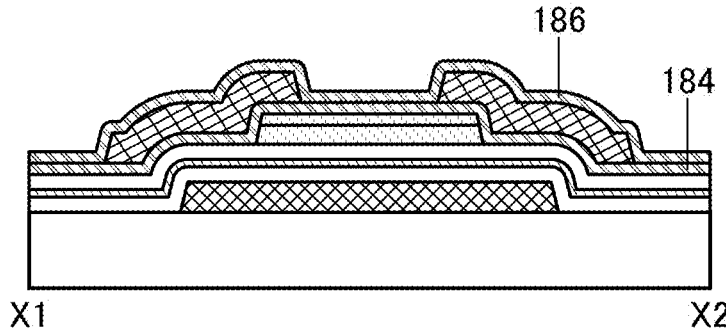
FIGS. 9A to 9C illustrate steps for manufacturing a transistor.
Figure 9B:
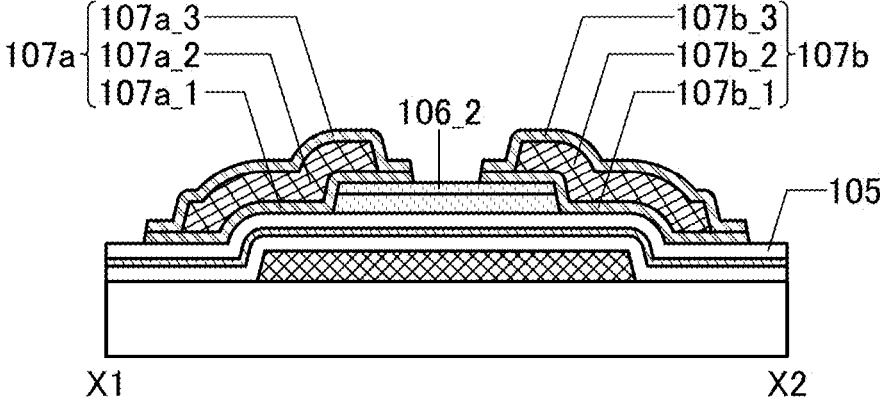

Then, a conductive layer 186 is formed (see FIG. 9A). In this embodiment, a 10-nm-thick titanium layer is formed as the conductive layer 186.

[Step 9]

Subsequently, a resist mask is formed by a photolithography method (not illustrated). With the use of the resist mask as a mask, portions of the conductive layers 184 and 186 are selectively removed, so that the electrodes 107a_1, 107a_3, 107b_1, and 107b_3 are formed (see FIG. 9B). In such a manner, the electrode 107a and the electrode 107b are formed.

The removal of the conductive layers 184 and 185 can be performed by a dry etching method, a wet etching method, or the like. Both the dry etching method and the wet etching method may be used.

When portions of the conductive layers 184 and 185 are removed by a dry etching method, an impurity element such as a residual component of an etching gas is sometimes attached to exposed portions of the oxide semiconductor layer 106_2 and the insulating layer 105. For example, when a chlorine-based gas is used as the etching gas, chlorine and the like are attached in some cases. Moreover, when a hydrocarbon-based gas is used as the etching gas, carbon, hydrogen, and the like are attached in some cases.

The impurity element attached to the exposed surfaces of the oxide semiconductor 106_2 and the insulating layer 105 are preferably reduced. The impurity elements can be reduced by cleaning treatment using dilute hydrofluoric acid, cleaning treatment using ozone, or cleaning treatment using ultra violet rays, for example. Plasma treatment using an oxidizing gas, for example, a nitrous oxide gas may be performed. By the plasma treatment, fluorine and the like attached to the exposed surface can be reduced. Moreover, the plasma treatment is effective in removing an organic substance. Note that different types of cleaning treatment may be used in combination. Cleaning treatment and plasma treatment may be used in combination.

[Step 10]

Figure 9C:
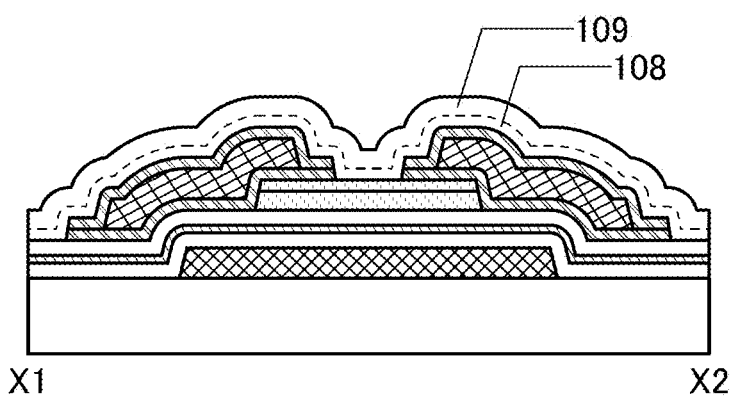

Next, the insulating layer 108 and the insulating layer 109 are sequentially formed (see FIG. 9C). The insulating layer 108 and the insulating layer 109 are preferably formed successively without being exposed to the air.

The insulating layer 108 is preferably an insulating layer containing excess oxygen. The thickness of the insulating layer 108 ranges from 5 nm to 150 nm, preferably from 5 nm to 50 nm. When the insulating layer 108 is an insulating layer through which oxygen can pass, oxygen contained in the insulating layer 109 formed later can be transferred to the oxide semiconductor layer 106.

For example, the insulating layer 108 can be a silicon oxynitride layer formed by a PECVD method. In this case, a deposition gas containing silicon and an oxidizing gas are preferably used as source gasses. Typical examples of a deposition gas containing silicon include silane, disilane, trisilane, and silane fluoride. Examples of an oxidizing gas include dinitrogen monoxide and nitrogen dioxide. The flow rate of the oxidizing gas is 20 times or more and 5000 times or less, preferably 40 times or more and 100 times or less that of the deposition gas.

In this embodiment, a 30-nm-thick silicon oxynitride layer is formed as the insulating layer 108. Specifically, the silicon oxynitride layer is formed by a PECVD method under the conditions where the substrate temperature is 350° C., silane at a flow rate of 20 sccm and dinitrogen monoxide at a flow rate of 3000 sccm are used as source gasses, the pressure in the reaction chamber is 200 Pa, and a high-frequency power of 100 W at 13.56 MHz is supplied to a parallel-plate electrode.

The insulating layer 109 is preferably an insulating layer containing excess oxygen. The thickness of the insulating layer 109 ranges from 30 nm to 500 nm, preferably from 50 nm to 400 nm.

The amount of defects in the insulating layer 109 is preferably small; as a typical example, the spin density corresponding to a signal that appears at g=2.001 due to a dangling bond of silicon is preferably lower than $1.5 \times 10^{18}$ spins/cm³, further preferably lower than or equal to $1 \times 10^{18}$ spins/cm³ by ESR measurement. Since the distance between the insulating layer 109 and the oxide semiconductor layer 106 is larger than the distance between the insulating layer 108 and the oxide semiconductor layer 106, the insulating layer 109 may have a higher defect density than the insulating layer 108.

The insulating layer 109 can be a silicon oxynitride layer formed by a PECVD method. For example, a silicon oxide layer or a silicon oxynitride layer is formed under the conditions where the substrate placed in a reaction chamber of a PECVD apparatus that is vacuum-evacuated is held at a temperature ranging from 180° C. to 400° C., the pressure in the reaction chamber into which source gasses are introduced ranges from 100 Pa to 250 Pa, preferably from 100 Pa to 200 Pa, and a high-frequency power of 0.17 W/cm² to 0.5 W/cm², preferably 0.25 W/cm² to 0.35 W/cm² is supplied to an electrode provided in the reaction chamber.

In formation of the insulating layer 109, when the high-frequency power with the above power density is supplied in the reaction chamber at the above pressure, decomposition efficiency of the source gases is increased in plasma. That is, oxygen radicals increase in the reaction chamber, and oxidation of the source gasses proceeds. Thus, the oxygen content of the insulating layer 109 is higher than that in the stoichiometric composition.

In the insulating layer formed at a substrate temperature within the above range, the bond between silicon and oxygen is weak, and accordingly, part of oxygen in the insulating layer is released by heat treatment in a later step. Thus, it is possible to form an oxide insulating layer which contains more oxygen than that in the stoichiometric composition and from which part of oxygen is released by heating.

In this embodiment, a 100-nm-thick silicon oxynitride layer is formed as the insulating layer 109. Specifically, the silicon oxynitride layer is formed by a PECVD method under the conditions where the substrate temperature is 220° C., silane at a flow rate of 160 sccm and dinitrogen monoxide at a flow rate of 4000 sccm are used as source gasses, the pressure in the reaction chamber is 200 Pa, and a high-frequency power of 1500 W at 13.56 MHz is supplied to a parallel-plate electrode.

Note that the insulating layer 108 functions as a protective layer for the oxide semiconductor layer 106 in the step of forming the insulating layer 109. Consequently, the insulating layer 109 can be formed using the high-frequency power having a high power density while damage to the oxide semiconductor layer 106 is reduced.

Note that in the formation conditions for the insulating layer 109, the flow rate of the deposition gas containing silicon relative to the oxidizing gas can be increased, whereby the amount of defects in the insulating layer 109 can be reduced. Typically, it is possible to form an oxide insulating layer in which the number of defects is small, i.e., the spin density of a signal that appears at g=2.001 originating from a dangling bond of silicon is lower than $6 \times 10^{17}$ spins/cm³, preferably lower than or equal to $3 \times 10^{17}$ spins/cm³, further preferably lower than or equal to $1.5 \times 10^{17}$ spins/cm³ by ESR measurement. As a result, the reliability of the transistor can be improved.

[Step 11]

Then, heat treatment is performed in an inert atmosphere to reduce impurities such as hydrogen and moisture included in the insulating layers 108 and 109. Note that heat treatment may be performed under a reduced pressure without supply of an inert gas or the like. In this embodiment, heat treatment is performed at 400° C. for one hour in a nitrogen atmosphere (see FIG. 10A).

[Step 12]

Subsequently, heat treatment is performed in an oxidizing atmosphere. In this embodiment, heat treatment is performed at 400° C. for one hour in an oxygen atmosphere (see FIG. 10B). In Step 11 and Step 12, part of oxygen contained in the insulating layer 108 and/or the insulating layer 109 can be moved to the oxide semiconductor layer 106 so that oxygen vacancies in the oxide semiconductor layer 106 can be reduced. Note that one of Step 11 and Step 12 may be omitted.

[Step 13]

Figure 10A:
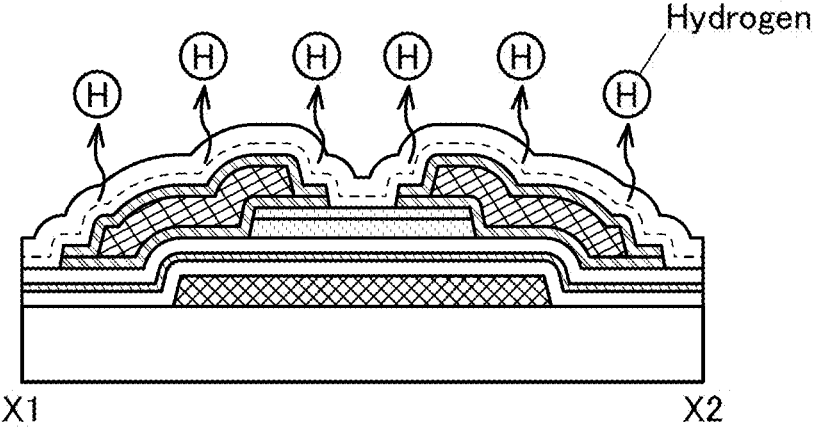
FIGS. 10A to 10C illustrate steps for manufacturing a transistor.
Figure 10B:
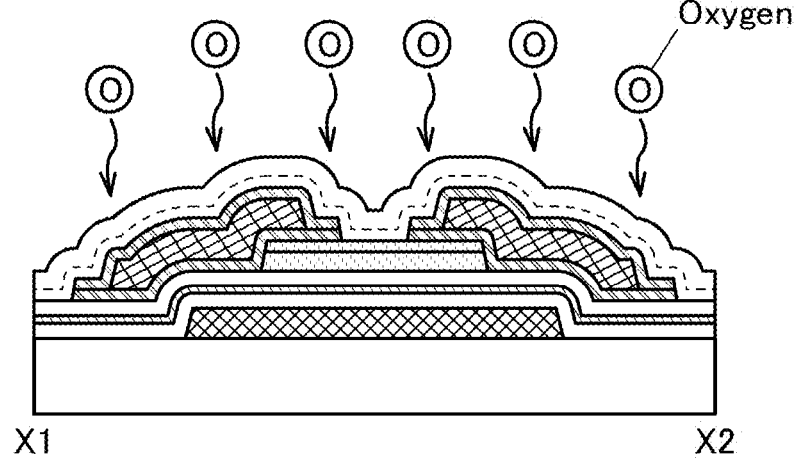
Figure 10C:
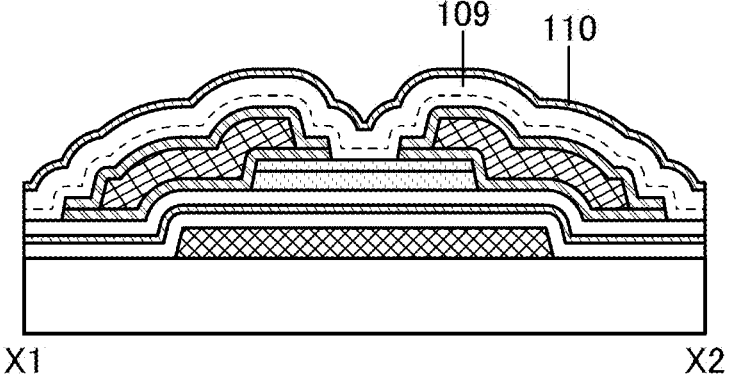

Next, the insulating layer 110 is formed (see FIG. 10C). As described above, the insulating layer 110 is preferably formed using an insulating material through which impurities do not easily pass. Moreover, the insulating layer 110 is preferably formed using an insulating material into which oxygen does not easily diffuse. The thickness of the insulating layer 110 ranges from 5 nm to 40 nm.

In this embodiment, a 30-nm-thick aluminum oxide layer is formed by a sputtering method as the insulating layer 110. Oxygen or a mixed gas of oxygen and a rare gas is used as a sputtering gas. The flow rate ratio of oxygen in the sputtering gas is preferably 70% or more, further preferably 80% or more, still further preferably 100%. By using a sputtering gas containing oxygen, oxygen can be supplied to the layer over which the insulating layer 110 is formed (i.e., the insulating layer 109). As the amount of oxygen contained in the sputtering gas increases, the amount of oxygen supplied to the layer over which the insulating layer 110 is formed tends to increase. In this embodiment, 100% oxygen is used as the sputtering gas.

The aluminum oxide layer used as the insulating layer 110 may be formed by a DC sputtering method using an aluminum target or by an AC sputtering method using an aluminum oxide target.

Alternatively, the insulating layer 110 may be a silicon nitride layer that contains no or little hydrogen. Such a silicon nitride layer can be formed by a sputtering method, for example.

When the insulating layer 111 is formed over the insulating layer 110, the insulating layer 111 is preferably an aluminum oxide layer formed by an ALD method. The thickness of the insulating layer 111 ranges from 5 nm to 40 nm. An ALD method can provide an aluminum oxide layer with favorable coverage, resulting in higher reliability of the transistor. Alternatively, the insulating layer 111 may be a silicon nitride layer.

Steps 11 to 13 are successively performed without exposure to the air. This can prevent adsorption of hydrogen, moisture, and the like and increase the reliability of the transistor. Moreover, covering the oxide semiconductor layer 106 with the insulating layer 110 can prevent entry of hydrogen, moisture, and the like from the outside and diffusion of oxygen to the outside.

Modification Examples of Transistor 100

Modification examples of the transistor 100 will be described with reference to drawings.

Modification Example 1

Figure 11A:
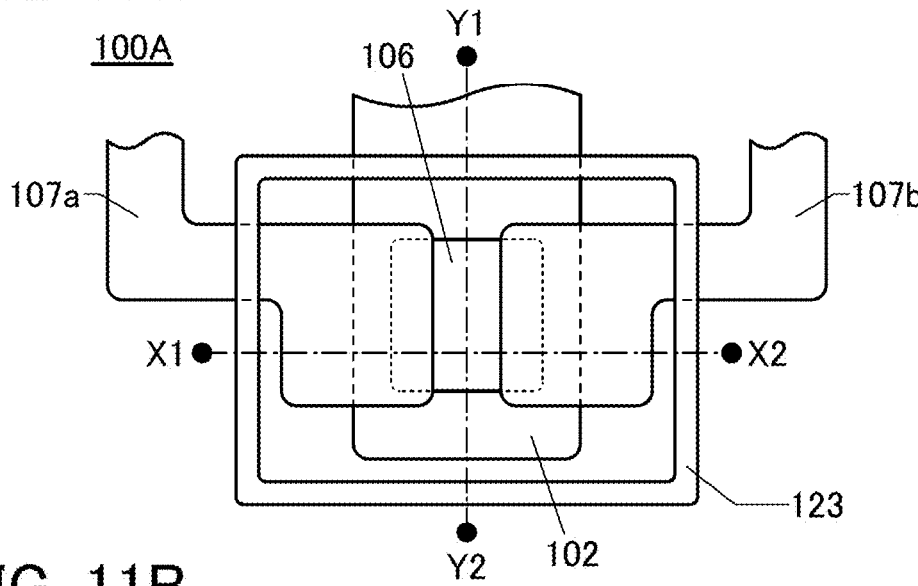
FIGS. 11A to 11C illustrate a transistor.
Figure 11B:
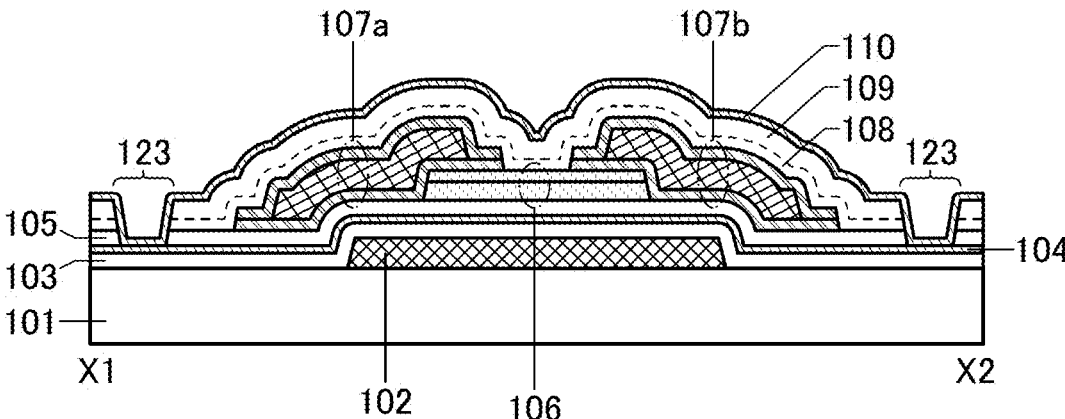
Figure 11C:
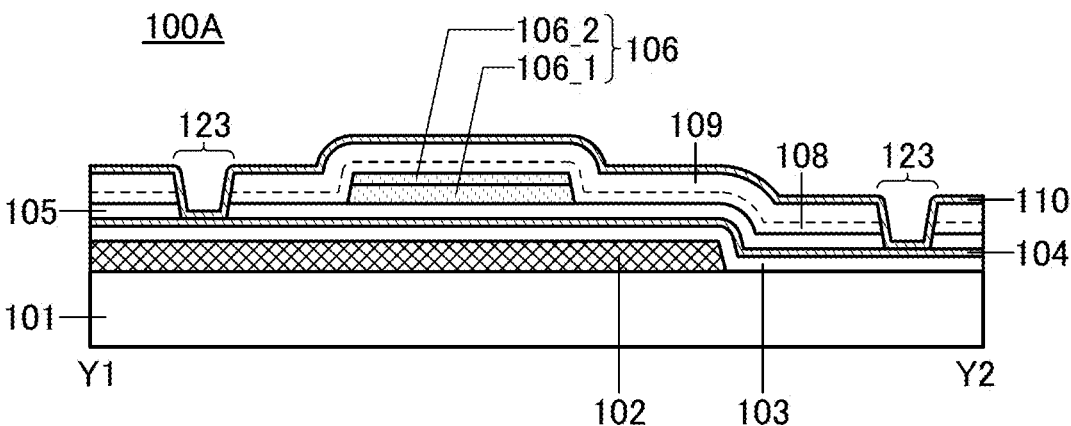

FIG. 11A is a plan view of a transistor 100A. FIG. 11B is a cross-sectional view of a portion indicated by the dashed-dotted line X1-X2 in FIG. 11A. FIG. 11C is a cross-sectional view of a portion indicated by the dashed-dotted line Y1-Y2 in FIG. 11A.

The transistor 100A is different from the transistor 100 in including a region 123 that surrounds the outer side of the oxide semiconductor layer 106 when seen in the plan view. In the region 123, the insulating layer 105, the insulating layer 108, and the insulating layer 109 are removed, and the insulating layer 104 is in contact with the insulating layer 110.

Providing the region 123 can enhance the effect of preventing entry of hydrogen, moisture, and the like from the outside and the effect of preventing diffusion of oxygen to the outside.

Modification Example 2

Figure 12A:
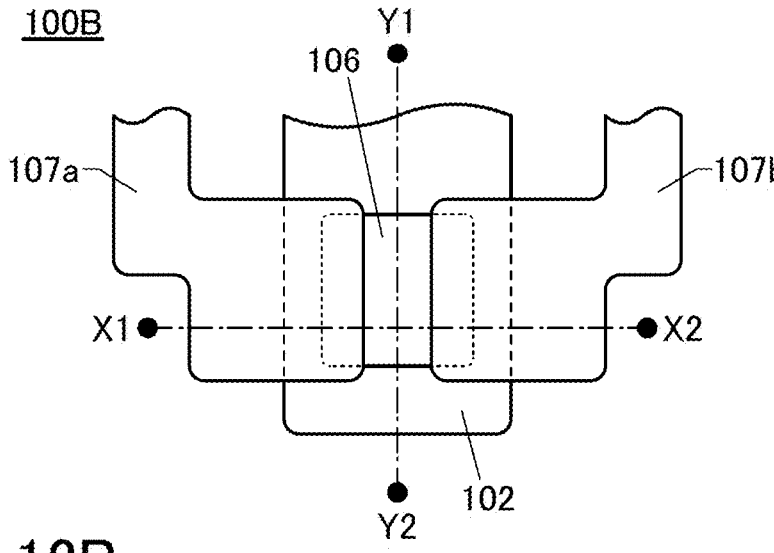
FIGS. 12A to 12C illustrate a transistor.
Figure 12B:
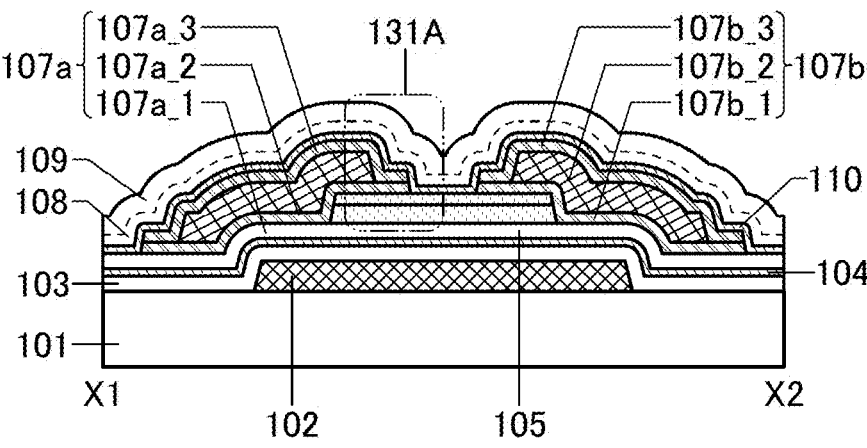
Figure 12C:
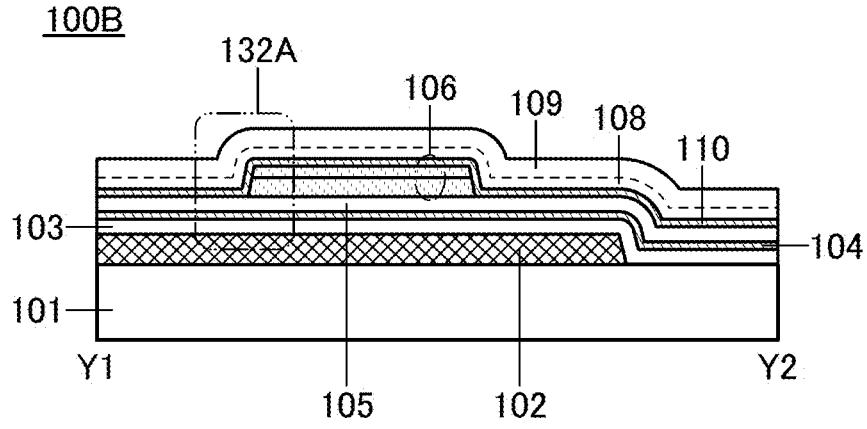
Figure 13A:
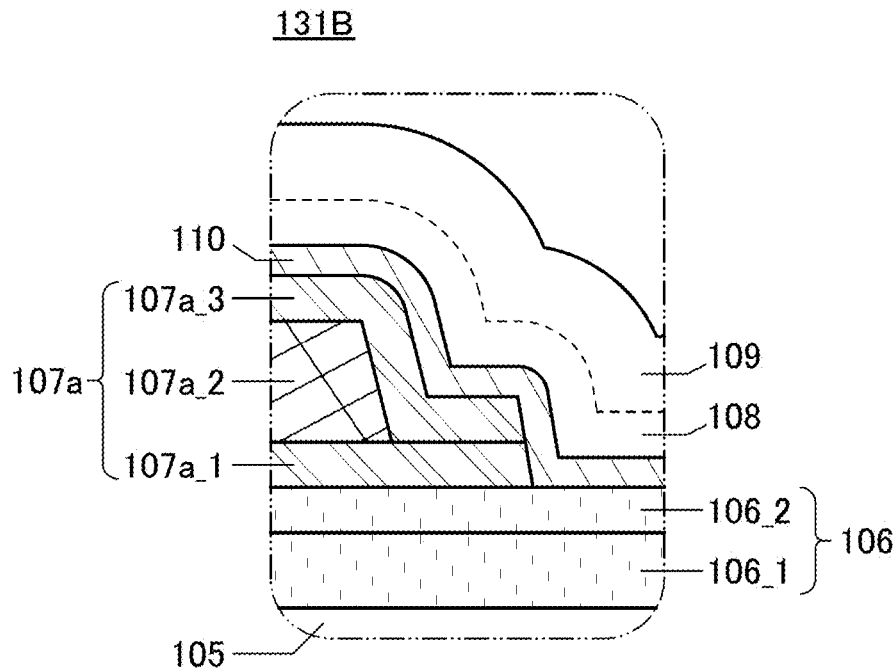
FIGS. 13A and 13B illustrate a transistor.
Figure 13B:
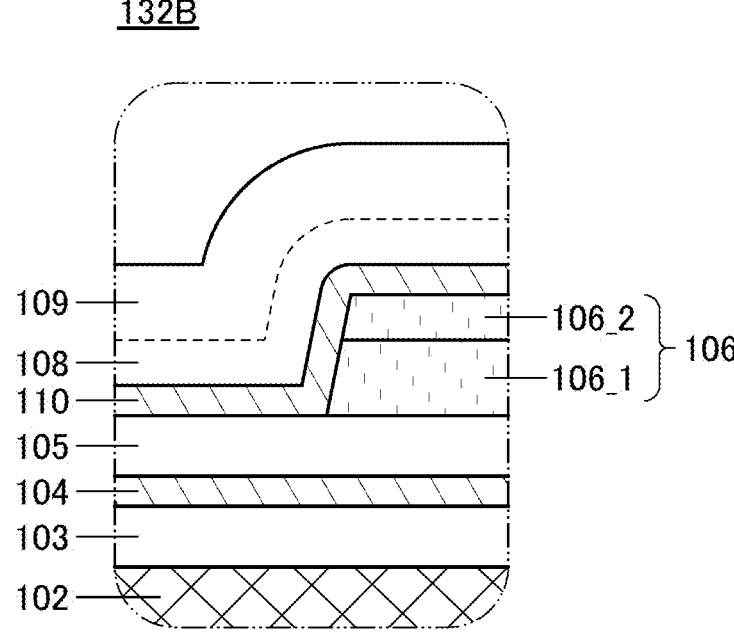

FIG. 12A is a plan view of a transistor 100B. FIG. 12B is a cross-sectional view of a portion indicated by the dashed-dotted line X1-X2 in FIG. 12A. FIG. 12C is a cross-sectional view of a portion indicated by the dashed-dotted line Y1-Y2 in FIG. 12A. FIG. 13A is an enlarged view of a portion 131B in FIG. 12B. FIG. 13B is an enlarged view of a portion 132B in FIG. 12C.

The transistor 100B is different from the transistor 100 in the stacking order of the insulating layer 108 and the insulating layer 110. In the transistor 100B, oxygen can be supplied to the insulating layer 105 at the time when the insulating layer 110 is formed by a sputtering method using a sputtering gas containing oxygen. Moreover, oxygen can be supplied to part of the oxide semiconductor layer 106.

Modification Example 3

Figure 14A:
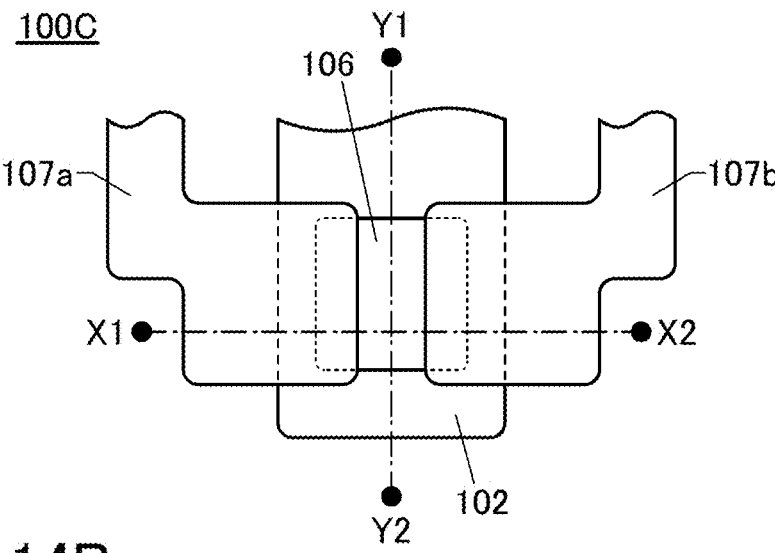
FIGS. 14A to 14C illustrate a transistor.
Figure 14B:
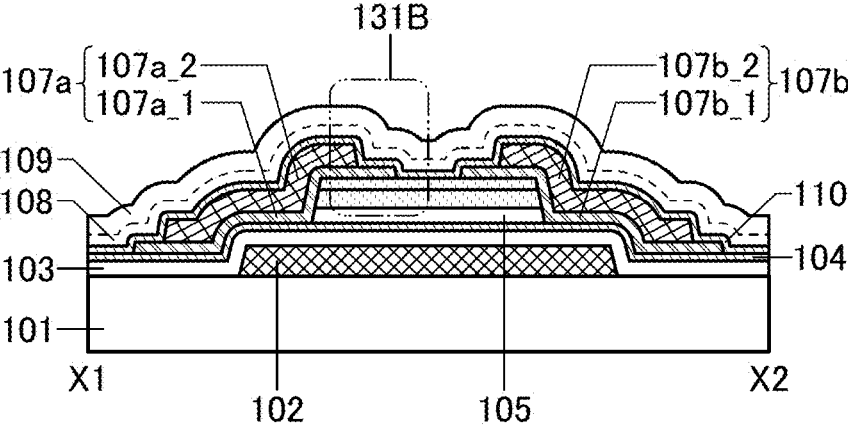
Figure 14C:
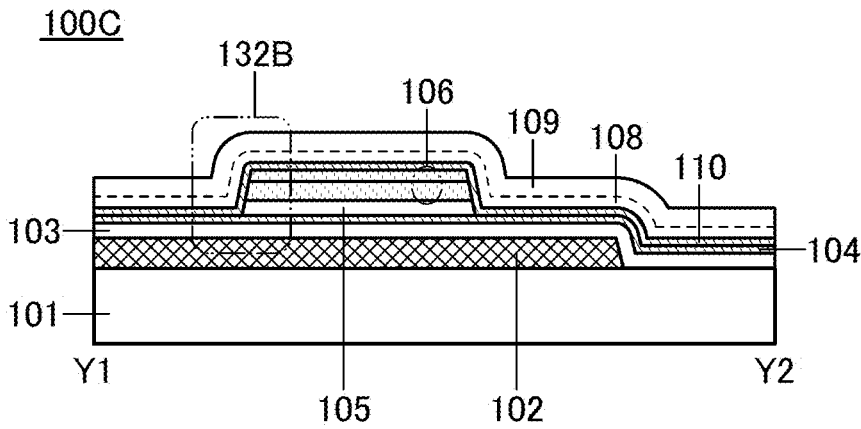
Figure 15A:
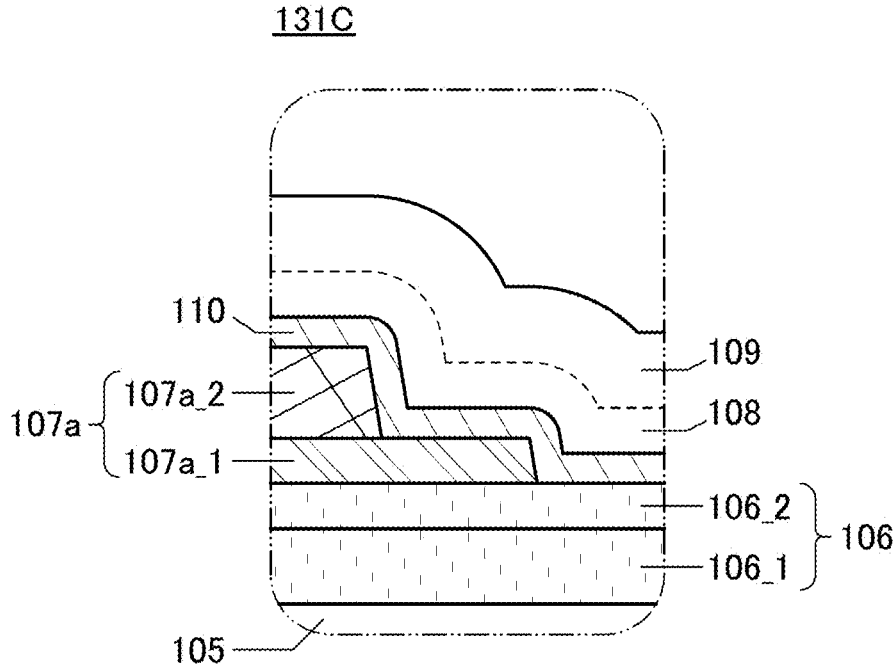
FIGS. 15A and 15B illustrate a transistor.
Figure 15B:
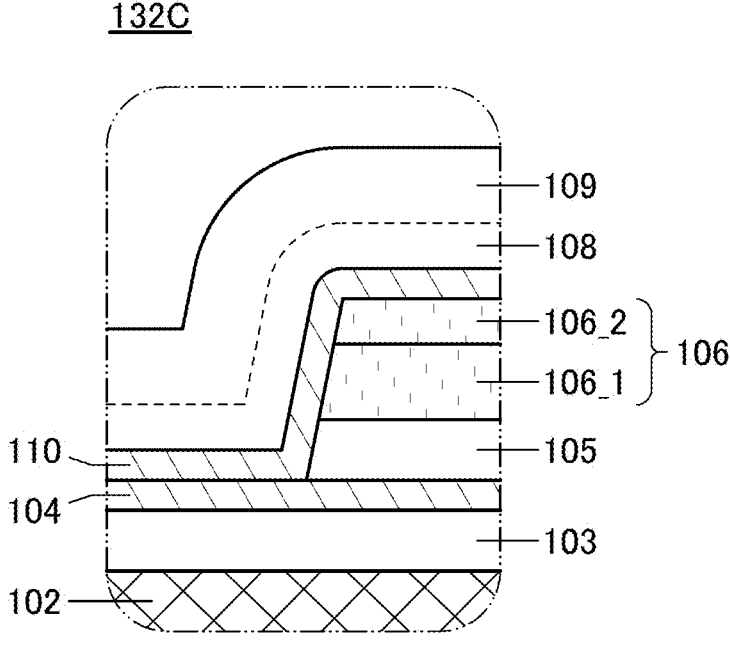

FIG. 14A is a plan view of a transistor 100C. FIG. 14B is a cross-sectional view of a portion indicated by the dashed-dotted line X1-X2 in FIG. 14A. FIG. 14C is a cross-sectional view of a portion indicated by the dashed-dotted line Y1-Y2 in FIG. 14A. FIG. 15A is an enlarged view of a portion 131C in FIG. 14B. FIG. 15B is an enlarged view of a portion 132C in FIG. 14C.

The transistor 100C differs from the transistor 100A in the shape of the insulating layer 105. The transistor 100C includes an island-shaped insulating layer 105 overlapped by the oxide semiconductor layer 106. The island-shaped insulating layer 105 can be formed by removing part of the exposed insulating layer 105 in formation of the oxide semiconductor layer 106 in Step 5.

In the transistor 100C, the insulating layer 110 and the insulating layer 104 extend beyond end portions of the oxide semiconductor layer 106 and end portions of the insulating layer 105 to have a region where they are in contact with each other. This structure can enhance the effect of preventing entry of hydrogen, moisture, and the like from the outside and the effect of preventing diffusion of oxygen to the outside.

When the insulating layer 110 is formed using an insulating material through which impurities such as aluminum oxide do not easily pass, formation of the electrode 107a_3 can be omitted even if a conductive layer containing copper is used for the electrode 107a_2. Thus, the manufacturing cost can be reduced.

Modification Example 4

Figure 16A:
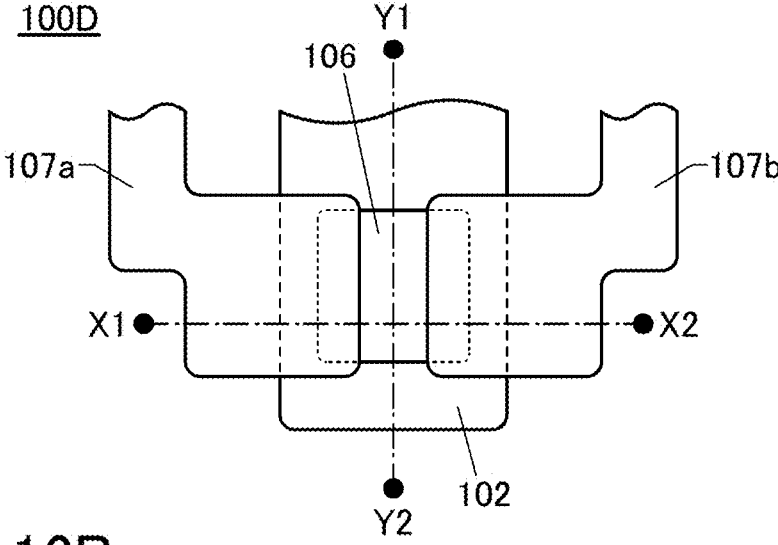
FIGS. 16A to 16C illustrate a transistor.
Figure 16B:
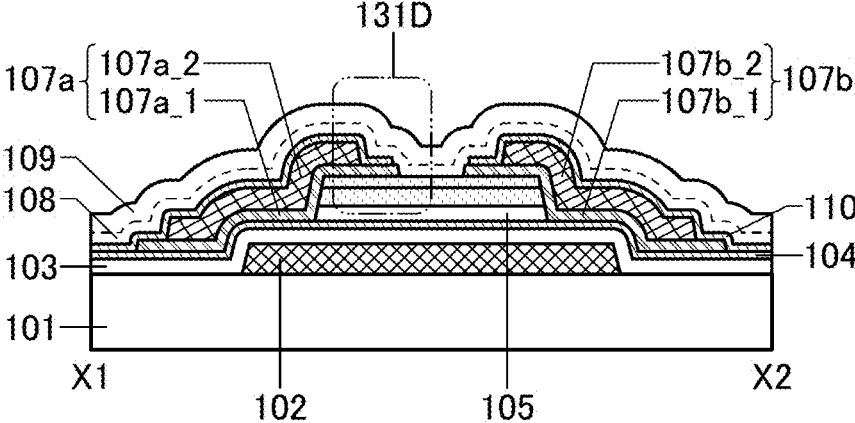
Figure 16C:
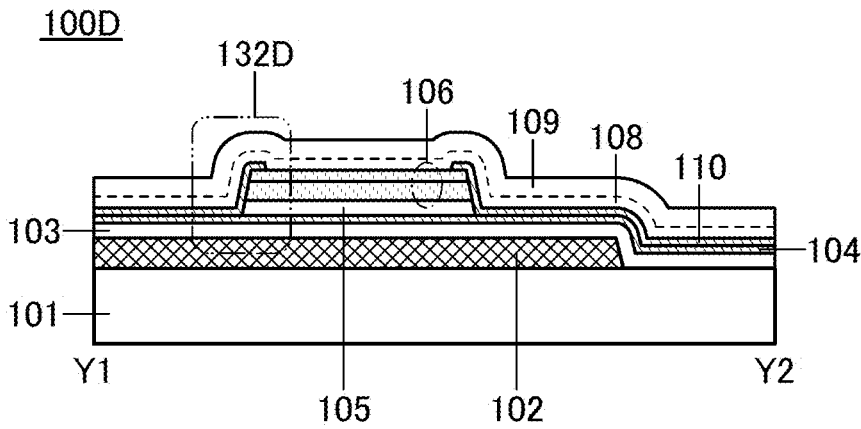
Figure 17A:
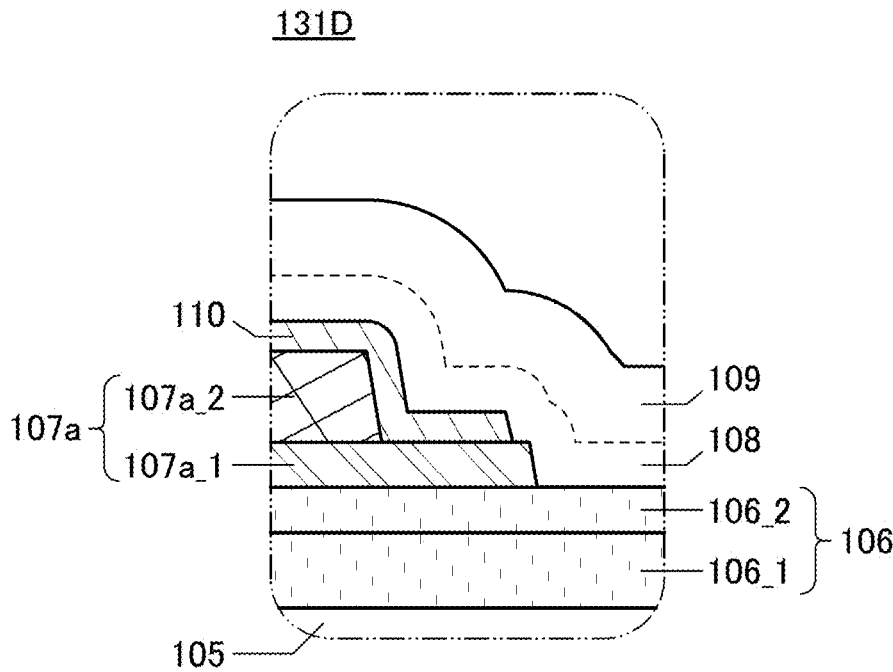
FIGS. 17A and 17B illustrate a transistor.
Figure 17B:
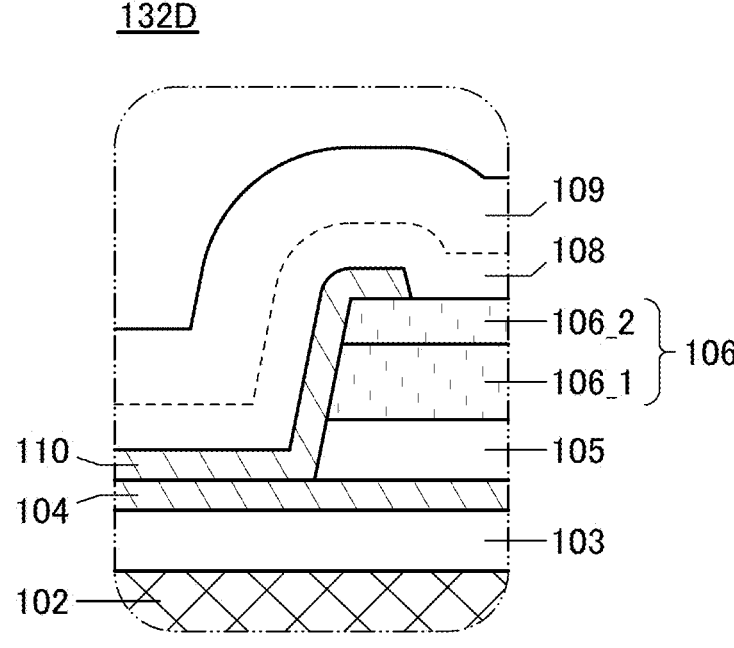

FIG. 16A is a plan view of a transistor 100D. FIG. 16B is a cross-sectional view of a portion indicated by the dashed-dotted line X1-X2 in FIG. 16A. FIG. 16C is a cross-sectional view of a portion indicated by the dashed-dotted line Y1-Y2 in FIG. 16A. FIG. 17A is an enlarged view of a portion 131D in FIG. 16B. FIG. 17B is an enlarged view of a portion 132D in FIG. 16C.

The transistor 100D differs from the transistor 100B in the shape of the insulating layer 110. The transistor 100D includes a region where part of the insulating layer 110 is removed and the oxide semiconductor layer 106 is in contact with the insulating layer 108. This structure allows excess oxygen in the insulating layer 108 to be efficiently supplied to the oxide semiconductor layer 106.

This embodiment can be implemented in appropriate combination with any of the structures described in the other embodiments and the like.

Embodiment 2

A transistor 200 of one embodiment of the present invention will be described with reference to drawings.

Structure Example of Transistor 200

Figure 19A:
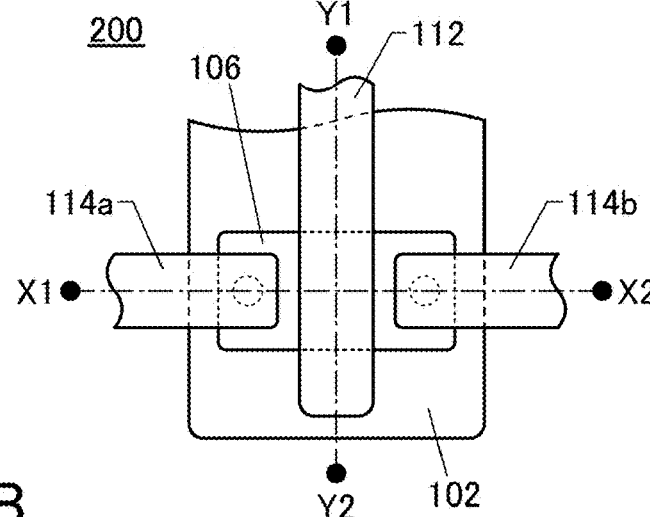
FIGS. 19A to 19C illustrate a transistor.
Figure 19B:
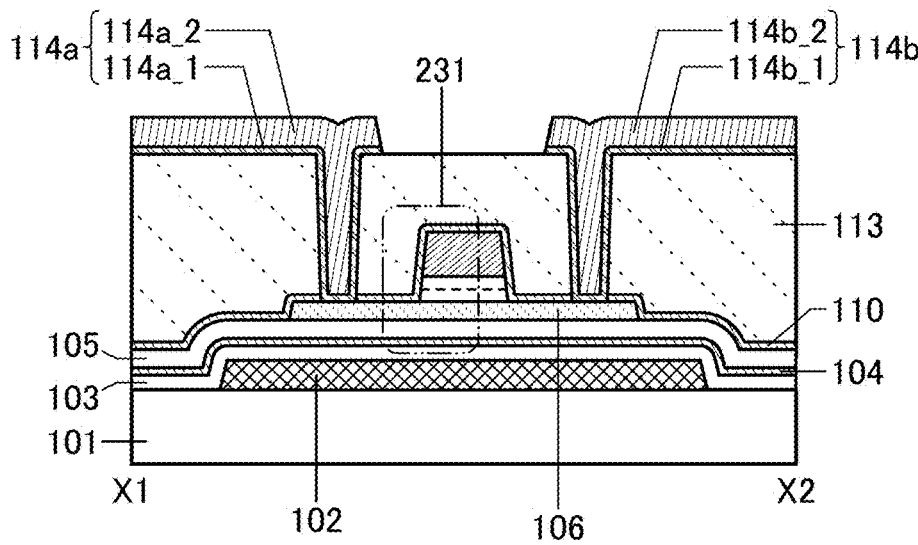
Figure 19C:
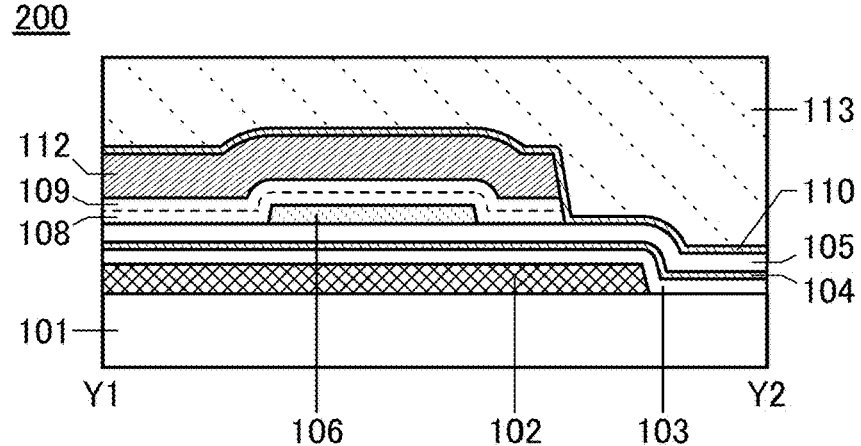
Figure 20:
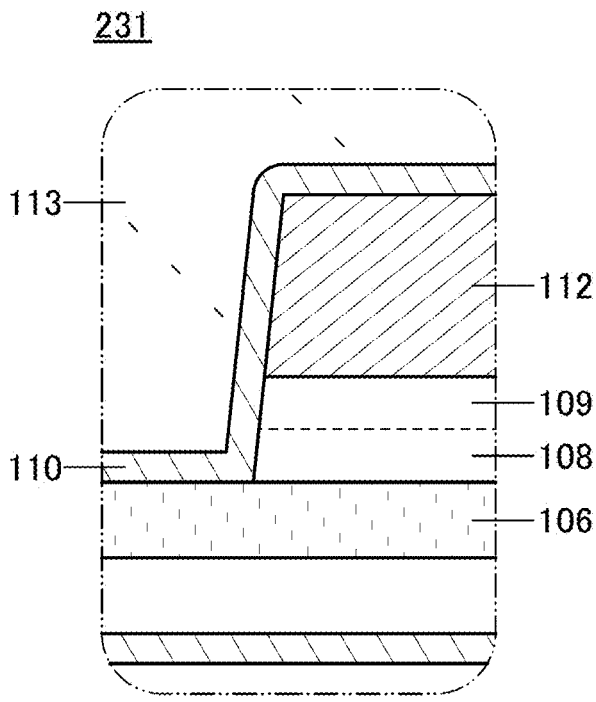
FIG. 20 illustrates a transistor.

FIG. 19A is a plan view of the transistor 200. FIG. 19B is a cross-sectional view of a portion indicated by the dashed-dotted line X1-X2 in FIG. 19A. FIG. 19C is a cross-sectional view of a portion indicated by the dashed-dotted line Y1-Y2 in FIG. 19A. FIG. 20 is an enlarged view of a portion 231 shown in FIG. 19B.

The transistor 200 is a top-gate transistor. The transistor 200 includes the electrode 102, the insulating layer 103, the insulating layer 104, the insulating layer 105, the oxide semiconductor layer 106, the insulating layer 108, the insulating layer 109, an electrode 112, the insulating layer 110, the insulating layer 113, an electrode 114a (an electrode 114a_1 and an electrode 114a_2), and an electrode 114b (an electrode 114b_1 and an electrode 114b_2).

The electrode 102 is provided over the substrate 101. The insulating layer 103 is provided to cover the electrode 102. The insulating layer 104 is provided over the insulating layer 103. The insulating layer 105 is provided over the insulating layer 104. The oxide semiconductor layer 106 is provided over the insulating layer 105. The electrode 102 and the oxide semiconductor layer 106 partly overlap each other, with the insulating layers 103, 104, and 105 placed therebetween.

The insulating layer 108 is provided over the oxide semiconductor layer 106. The insulating layer 109 is provided over the insulating layer 108. The electrode 112 is provided over the insulating layer 109. The insulating layer 108, the insulating layer 109, and the electrode 112 partly overlap the oxide semiconductor layer 106. The insulating layer 110 is provided over the insulating layer 105, the oxide semiconductor layer 106, the insulating layer 108, the insulating layer 109, and the electrode 112. The insulating layer 113 is provided over the insulating layer 110.

The electrode 114a (the electrode 114a_1 and the electrode 114a_2) is provided over the insulating layer 113. The electrode 114a is electrically connected to a part of the oxide semiconductor layer 106 through an opening provided in the insulating layer 113 and the insulating layer 110. The electrode 114b (the electrode 114b_1 and the electrode 114b_2) is provided over the insulating layer 113. The electrode 114b is electrically connected to another part of the oxide semiconductor layer 106 through another opening provided in the insulating layer 113 and the insulating layer 110.

When the insulating layer 108 and the insulating layer 109 are formed using the same kind of material, the interface between the insulating layers 108 and 109 is not clearly observed in some cases. For that reason, the interface between the insulating layers 108 and 109 is indicated by dashed lines in this embodiment. Although a two-layer structure of the insulating layers 108 and 109 is described in this embodiment, one embodiment of the present invention is not limited to this, and a single-layer structure of either the insulating layer 108 or the insulating layer 109 or a stacked-layer structure including three or more layers may be employed, for example.

Figure 21A:
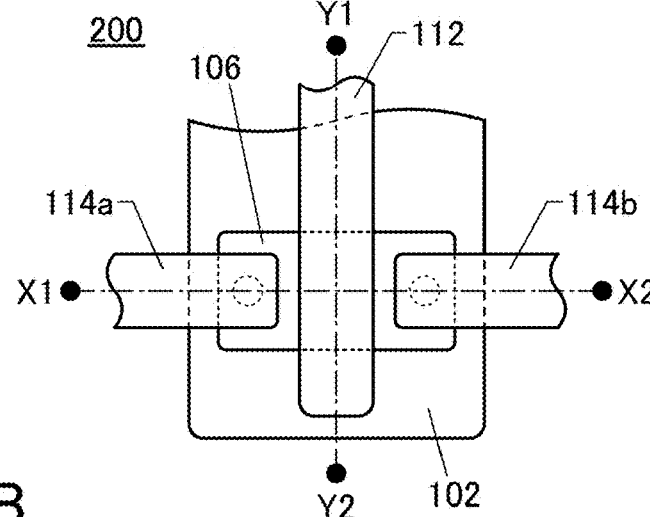
FIGS. 21A to 21C illustrate a transistor.
Figure 21B:
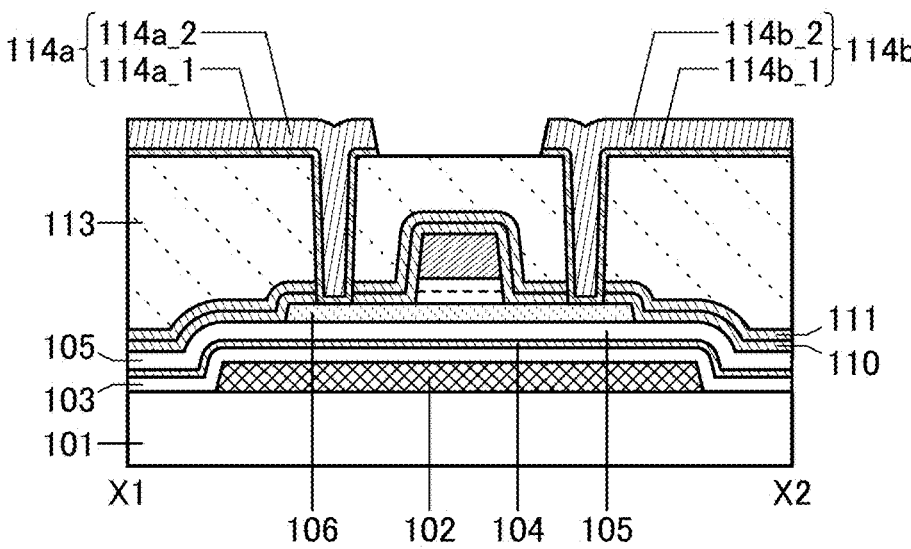
Figure 21C:
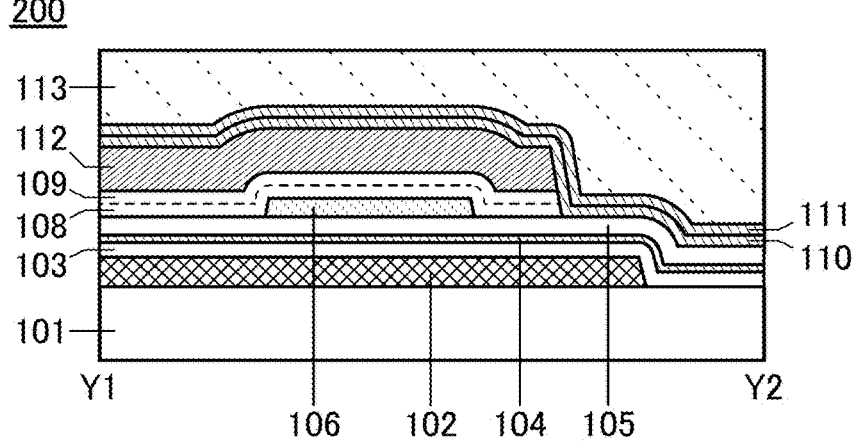

As illustrated in FIGS. 21A to 21C, the insulating layer 111 may be provided over the insulating layer 110. FIG. 21A is a plan view of the transistor 200. FIG. 21B is a cross-sectional view of a portion indicated by the dashed-dotted line X1-X2 in FIG. 21A. FIG. 21C is a cross-sectional view of a portion indicated by the dashed-dotted line Y1-Y2 in FIG. 21A.

When the insulating layer 110 and the insulating layer 111 are provided in the transistor 200, one or both of the insulating layers 110 and 111 is preferably formed using an insulating material through which impurities do not easily pass. For example, at least one of the insulating layers 110 and 111 may be a silicon nitride layer or an aluminum oxide layer. Alternatively, one of the insulating layers 110 and 111 may be a silicon nitride layer or the like, and the other may be an aluminum oxide layer or the like.

As the insulating layer 110, an aluminum oxide layer is preferably formed by a sputtering method. As the insulating layer 111, an aluminum oxide layer is preferably formed by an ALD method. The effects of these aluminum oxide layers will be described later.

Figure 22A:
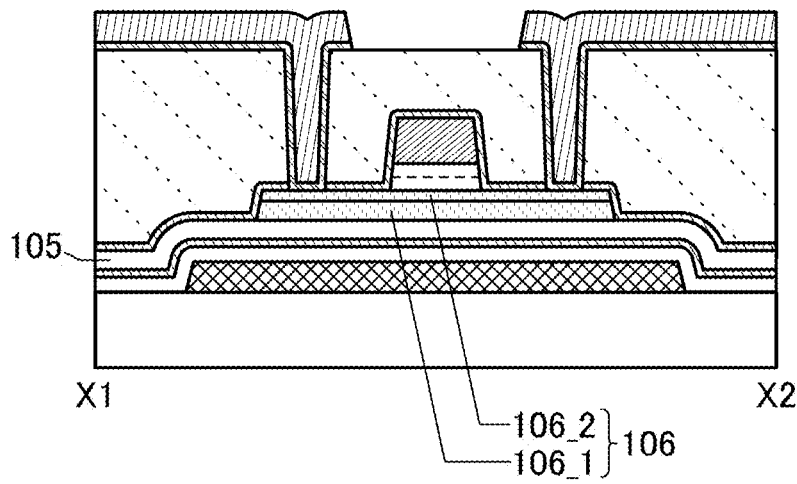
FIGS. 22A and 22B each illustrate a transistor.
Figure 22B:
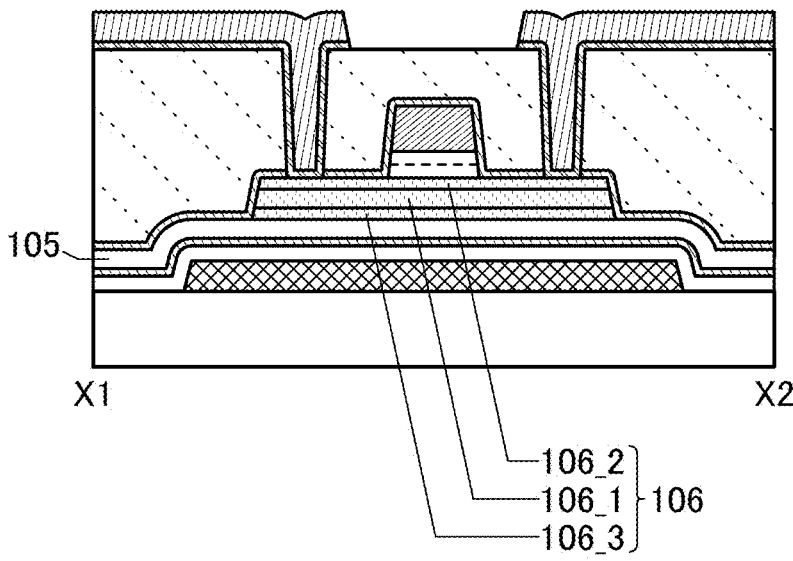

The oxide semiconductor layer 106 is not limited to a single layer and may be a stack of a plurality of layers. For example, the oxide semiconductor layer 106 may have a two-layer structure of the oxide semiconductor layer 106_1 and the oxide semiconductor layer 106_2 as illustrated in FIG. 22A. Alternatively, the oxide semiconductor layer 106 may have a three-layer structure of the oxide semiconductor layer 106_1, the oxide semiconductor layer 106_2, and the oxide semiconductor layer 106_3 as illustrated in FIG. 22B. Needless to say, the oxide semiconductor layer 106 may be a stack of four or more layers. Note that FIGS. 22A and 22B are cross-sectional views corresponding to FIG. 19B.

In the transistor 200, each of the electrodes 102 and 112 can function as a gate electrode. When one of the electrodes 102 and 112 is referred to as "gate electrode," the other is referred to as "backgate electrode." For example, in the transistor 200, when the electrode 102 is referred to as the gate electrode, the electrode 112 is referred to as the backgate electrode. When the electrode 102 is used as the gate electrode, the transistor 200 can be considered as a bottom-gate transistor. In some cases, one of the electrodes 102 and 112 is referred to as "first gate electrode" and the other is referred to as "second gate electrode."

In the transistor 200, the insulating layer 108 and the insulating layer 109 can function as gate insulating layers. The insulating layer 103, the insulating layer 104, and the insulating layer 105 can also function as gate insulating layers.

By providing the electrode 102 and the electrode 112 so that the oxide semiconductor layer 106 is located therebetween, and by setting the potentials of the electrode 102 and the electrode 112 to be the same, a region of the oxide semiconductor layer 106 through which carriers flow is enlarged in the film thickness direction; thus, the amount of transferred carriers is increased. As a result, the on-state current and the field-effect mobility of the transistor are increased.

Accordingly, the transistor can have a large on-state current for its area. That is, the area occupied by the transistor can be small for a required on-state current. Thus, a semiconductor device having a high degree of integration can be achieved.

Furthermore, the gate electrode and the backgate electrode are formed using conductive layers and thus each have a function of preventing an electric field generated outside the transistor from influencing the semiconductor layer in which the channel is formed (in particular, an electric field blocking function against static electricity and the like). When the backgate electrode is formed larger than the semiconductor layer to cover the semiconductor layer in the plan view, the electric field blocking function can be enhanced.

Since each of the electrodes 102 and 112 has a function of blocking an electric field from the outside, charges of charged particles and the like generated above the electrode 112 and below the electrode 102 do not influence the channel formation region of the oxide semiconductor layer 106. As a result, degradation of electrical characteristics by a stress test is reduced. In addition, the electrodes 102 and 112 can block an electric field generated from the drain electrode so as not to affect the semiconductor layer. Thus, changes in the rising voltage of on-state current due to changes in drain voltage can be suppressed. Note that this effect is significant when a potential is supplied to the electrodes 102 and 112.

By providing the electrode 102 and the electrode 112 and setting the potentials of the electrode 102 and the electrode 112 to be the same, the change in threshold voltage is reduced. Accordingly, variations in electrical characteristics among a plurality of transistors are also reduced.

One of the electrodes 114a and 114b can function as one of a source electrode and a drain electrode. The other of the electrodes 114a and 114b can function as the other of the source electrode and the drain electrode.

A conductive material for forming the electrodes 114a_1, 114a_2, 114b_1, 114b_2, and 112 can be similar to the material for the electrode 102 and the like.

This embodiment shows an example where each of the electrodes 114a and 114b has a two-layer structure; however, one embodiment of the present invention is not limited to this. Each of the electrodes 114a and 114b may have a single-layer structure, a three-layer structure, or a stacked-layer structure of four or more layers.

When copper is used for the electrodes 114a and 114b to lower the resistance of the electrodes 114a and 114b, a conductive material into which copper does not easily diffuse is preferably provided between the electrode 114a and the oxide semiconductor layer 106 and between the electrode 114b and the oxide semiconductor layer 106. Since copper is likely to diffuse into a semiconductor layer, the operation of a semiconductor device might be unstable and the yield might be significantly reduced. When a conductive material into which copper does not easily diffuse is provided between the semiconductor layer and a wiring or an electrode that contains copper, the reliability of the transistor 200 can be increased.

When a wiring or an electrode containing copper is covered with or wrapped by a conductive material into which copper does not easily diffuse, the reliability of the transistor 200 can be further increased.

When a conductive material that has a function of absorbing hydrogen when being subjected to heat treatment is used for regions of the electrodes 114a and 114b in contact with the oxide semiconductor layer 106, the hydrogen concentration of the oxide semiconductor layer 106 can be reduced by heat treatment performed later.

Example of Method for Manufacturing Transistor 200

An example of a method for manufacturing the transistor 200 will be described with reference to FIGS. 23A to 23D, FIGS. 24A to 24D, FIGS. 25A to 25C, and FIGS. 26A to 26C. Cross sections X1-X2 in FIGS. 23A to 23D, FIGS. 24A to 24D, FIGS. 25A to 25C, and FIGS. 26A to 26C correspond to the cross section of the portion indicated by the dashed-dotted line X1-X2 in FIG. 19A.

[Step 1]

Figure 23A:
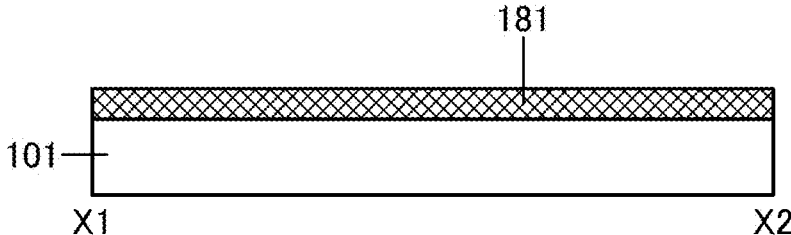
FIGS. 23A to 23D illustrate steps for manufacturing a transistor.

First, the conductive layer 181 for forming the electrode 102 is formed over the substrate 101 (see FIG. 23A). In this embodiment, aluminoborosilicate glass is used for the substrate 101. Moreover, in this embodiment, as the conductive layer 181, a 50-nm-thick titanium layer and a 200-nm-thick copper layer are formed in this order by a sputtering method.

[Step 2]

Next, a resist mask is formed (not illustrated). The resist mask can be formed by a photolithography method, a printing method, an inkjet method, or the like as appropriate. Formation of the resist mask by a printing method, an inkjet method, or the like needs no photomask; thus, the manufacturing cost can be reduced.

The formation of the resist mask by a photolithography method can be performed in such a manner that a photosensitive resist is irradiated with light through a photomask and a portion of the resist that has been exposed to light (or has not been exposed to light) is removed using a developing solution. Examples of light with which the photosensitive resist is irradiated include KrF excimer laser light, ArF excimer laser light, and extreme ultraviolet (EUV) light. Alternatively, a liquid immersion technique may be employed in which light exposure is performed with a portion between a substrate and a projection lens filled with liquid (e.g., water). An electron beam or an ion beam may be used instead of the above-mentioned light. Note that a photomask is not necessary in the case of using an electron beam or an ion beam.

Figure 23B:
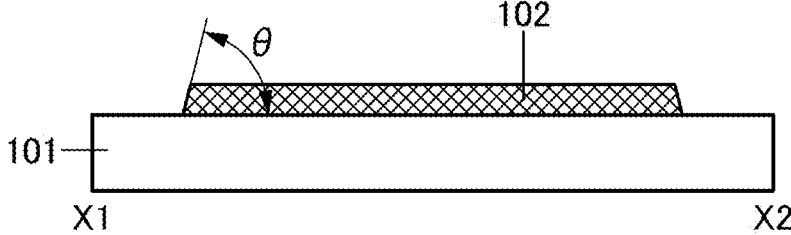

With the use of the resist mask as a mask, a portion of the conductive layer 181 is selectively removed to form the electrode 102 (see FIG. 23B). The insulating layer 181 can be removed by a dry etching method, a wet etching method, or the like. Both the dry etching method and the wet etching method may be used.

The resist mask is removed after the portion of the conductive layer 181 is removed. The resist can be removed by a dry etching method such as ashing or a wet etching method using a dedicated stripper or the like. Both the dry etching method and the wet etching method may be used.

A side surface of the electrode 102 is preferably tapered in cross section. The taper angle θ of the side surface of the electrode 102 is preferably 200 or more and less than 90°, further preferably 30° or more and less than 80°, still further preferably 40° or more and less than 70°. Note that the taper angle θ refers to an angle formed by a side surface and a bottom surface of a layer having a tapered shape when the layer is seen from the cross-sectional direction (i.e., the direction of the plane perpendicular to the substrate surface).

The tapered shape of the side surface of the electrode 102 can prevent disconnection of a layer formed over the electrode 102 and improve the coverage. Moreover, the tapered shape of the side surface of the electrode 102 can relieve electric field concentration at an upper edge portion of the electrode 102. Meanwhile, if the taper angle θ is too small, miniaturization of the transistor is sometimes difficult or variations in opening size, wiring width, or the like sometimes increase.

The side surface of the electrode 102 may have a step-like shape, in which case disconnection of a layer formed over the electrode 102 can be prevented and the coverage can be improved. As well as the side surface of the electrode 102, an edge portion of any layer can have a tapered shape or a step-like shape, in which case disconnection of a layer covering the layer (disconnection caused by a step) can be prevented, resulting in favorable coverage.

[Step 3]

Figure 23C:
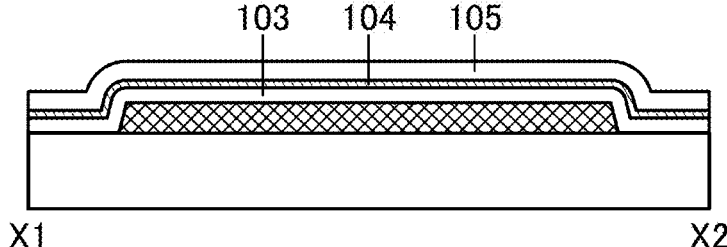

Next, the insulating layer 103, the insulating layer 104, and the insulating layer 105 are sequentially formed (see FIG. 23C). In this embodiment, a 400-nm-thick silicon nitride layer is formed as the insulating layer 103, a 30-nm-thick aluminum oxide layer as the insulating layer 104, and a 50-nm-thick silicon oxynitride layer as the insulating layer 105.

Note that the silicon nitride layer used as the insulating layer 103 has a three-layer structure of a first silicon nitride layer, a second silicon nitride layer, and a third silicon nitride layer. The three-layer structure can be formed as follows, for example.

For example, the first silicon nitride layer can be formed to have a thickness of 50 nm under the conditions where silane at a flow rate of 200 sccm, nitrogen at a flow rate of 2000 sccm, and an ammonia gas at a flow rate of 100 sccm are supplied as source gases to a reaction chamber of a PECVD apparatus, the pressure in the reaction chamber is controlled to 100 Pa, and a power of 2000 W is supplied using a 27.12 MHz high-frequency power source.

The second silicon nitride layer can be formed to have a thickness of 300 nm under the conditions where silane at a flow rate of 200 sccm, nitrogen at a flow rate of 2000 sccm, and an ammonia gas at a flow rate of 2000 sccm are supplied as source gasses to the reaction chamber of the PECVD apparatus, the pressure in the reaction chamber is controlled to 100 Pa, and a power of 2000 W is supplied using the 27.12 MHz high-frequency power source.

The third silicon nitride layer can be formed to have a thickness of 50 nm under the conditions where silane at a flow rate of 200 sccm and nitrogen at a flow rate of 5000 sccm are supplied as source gasses to the reaction chamber of the PECVD apparatus, the pressure in the reaction chamber is controlled to 100 Pa, and a power of 2000 W is supplied using the 27.12 MHz high-frequency power source.

Note that each of the first to third silicon nitride layers can be formed at a substrate temperature of 350° C. or lower.

For example, when a conductive layer containing copper is used for the electrode 102, the silicon nitride layer with the above three-layer structure provides the following effects.

The first silicon nitride layer can inhibit diffusion of copper elements from the electrode 102. The second silicon nitride layer has a function of releasing hydrogen and can improve the withstand voltage of an insulating layer functioning as a gate insulating layer. The third silicon nitride layer releases a small amount of hydrogen and can prevent diffusion of hydrogen released from the second silicon nitride layer.

As has been described, the insulating layer 104 is preferably formed using an insulating material through which impurities do not easily pass. Moreover, the insulating layer 104 is preferably formed using an insulating material into which oxygen is less likely to diffuse. An aluminum oxide layer used as the insulating layer 104 may be formed by a DC sputtering method using an aluminum target or by an AC sputtering method using an aluminum oxide target. Alternatively, the aluminum oxide layer may be formed by an ALD method.

As the insulating layer 105, an insulating layer containing excess oxygen is preferably used. The insulating layer 105 may be subjected to oxygen doping treatment. Moreover, heat treatment is preferably performed after formation of the insulating layer 105 to reduce hydrogen and moisture contained in the insulating layer 105. Oxygen doping treatment may be performed after the heat treatment. For example, the oxygen doping treatment is performed while the substrate is heated at 400° C. and a gas containing argon and oxygen is excited at a frequency of 2.45 GHz. The heat treatment and the oxygen doping treatment may be performed plural times.

When the insulating layer 105 is exposed to a plasma atmosphere of nitrogen or an inert gas, impurities such as hydrogen and carbon on or near a surface of the insulating layer 105 can be reduced. For example, while the substrate is heated at 400° C., the insulating layer 105 is exposed to a plasma atmosphere where a gas containing argon and nitrogen is excited at a frequency of 2.45 GHz.

For example, the heat treatment is performed in an inert gas atmosphere containing nitrogen, a rare gas, or the like, an oxidizing gas atmosphere, or an ultra-dry air atmosphere (in which the moisture amount measured with a dew point meter in a cavity ring down laser spectroscopy (CRDS) system is 20 ppm (corresponding to a dew point of −55° C.) or lower, preferably 1 ppm or lower, further preferably 10 ppb or lower). Note that the oxidizing atmosphere refers to an atmosphere containing an oxidizing gas such as oxygen, ozone, or nitrogen oxide at 10 ppm or higher. The inert atmosphere refers to an atmosphere that contains the oxidizing gas at lower than 10 ppm and is filled with nitrogen or a rare gas. Although there is no particular limitation on the pressure during the heat treatment, the heat treatment is preferably performed under a reduced pressure.

The heat treatment is performed at temperatures of 150° C. or higher and lower than the strain point of the substrate, preferably from 200° C. to 500° C., further preferably from 250° C. to 400° C. The treatment time is shorter than or equal to 24 hours. Heat treatment for over 24 hours is not preferable because the productivity is reduced.

The heat treatment can be performed using an electric furnace, an RTA apparatus, or the like. With the use of an RTA apparatus, the heat treatment can be performed at a temperature higher than or equal to the strain point of the substrate if the heating time is short. Thus, the heating time can be shortened. The heat treatment can be performed under an atmosphere of nitrogen, oxygen, ultra-dry air (air in which the water content is 20 ppm or less, preferably 1 ppm or less, further preferably 10 ppb or less), or a rare gas (e.g., argon or helium). Note that the atmosphere of nitrogen, oxygen, ultra-dry air, or a rare gas preferably does not contain hydrogen, water, and the like.

[Step 4]

Figure 23D:
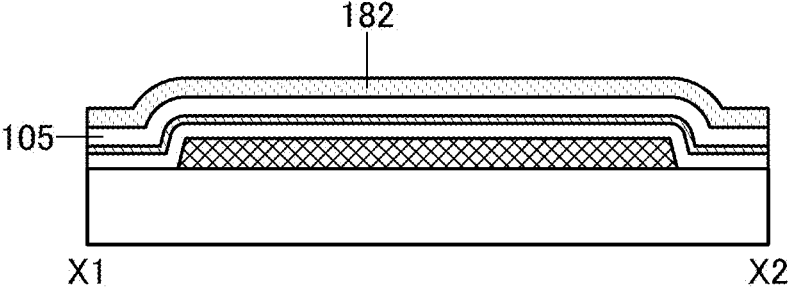

Next, the oxide semiconductor layer 182 is formed (see FIG. 23D). Note that before the oxide semiconductor layer 182 is formed, an oxygen gas may be supplied to generate plasma, in which case oxygen can be added to the insulating layer 105, which is a surface where the oxide semiconductor layer 182 is formed.

For the oxide semiconductor layer 182, it is preferable to use indium zinc oxide, indium gallium zinc oxide formed using a target with an atomic ratio In:Ga:Zn=5:1:6 or 4:2:3, or the like.

In this embodiment, for the oxide semiconductor layer 182, indium gallium zinc oxide is deposited by a sputtering method using a target with an atomic ratio In:Ga:Zn=5:1:6. Oxygen or a mixed gas of oxygen and a rare gas is used as a sputtering gas. In this embodiment, a mixed gas of oxygen and argon at an oxygen flow rate ratio of 10% is used as the sputtering gas.

When the flow rate ratio of oxygen in the sputtering gas is higher than or equal to 0% and lower than or equal to 30%, preferably higher than or equal to 5% and lower than or equal to 20%, an oxygen-deficient oxide semiconductor layer is formed. A transistor including an oxygen-deficient oxide semiconductor layer can have relatively high field-effect mobility.

At the formation of the oxide semiconductor layer 182, part of oxygen contained in the sputtering gas is supplied to the insulating layer 105 in some cases. As the amount of oxygen contained in the sputtering gas increases, the amount of oxygen supplied to the insulating layer 105 increases. Part of oxygen supplied to the insulating layer 105 reacts with hydrogen left in the insulating layer 105 to produce water, and the water is released from the insulating layer 105 by heat treatment performed later. Thus, the hydrogen concentration in the insulating layer 105 can be reduced. Moreover, when the amount of excess oxygen in the insulating layer 105 is increased, oxygen can be supplied to the oxide semiconductor layer 182 (that is to be the oxide semiconductor layer 106_1) by heat treatment performed later.

When the oxide semiconductor layer 106 is a stack of two layers or three layers as illustrated in FIGS. 22A and 22B, an oxide semiconductor layer for forming the oxide semiconductor layer 106_1 is formed in the above manner.

For an oxide semiconductor layer for forming the oxide semiconductor layer 106_2 and/or the oxide semiconductor layer 106_3, it is preferable to use an oxide semiconductor layer with high crystallinity, for example, a CAAC-OS layer. For example, in a subsequent etching step for forming the insulating layer 108, the insulating layer 109, and the electrode 112, an exposed portion of the oxide semiconductor layer is etched and the oxide semiconductor layer is damaged in some cases. An oxide semiconductor layer with high crystallinity is not likely to be etched in this etching step. Using an oxide semiconductor layer with high crystallinity as the oxide semiconductor layer can reduce damage of the oxide semiconductor layer caused in the etching step; thus, the reliability of the transistor can be improved.

For the oxide semiconductor layer for forming the oxide semiconductor layer 106_2 and/or the oxide semiconductor layer 106_3, indium gallium zinc oxide is deposited by a sputtering method using a target with an atomic ratio In:Ga:Zn=1:1:1, for example. Oxygen or a mixed gas of oxygen and a rare gas is used as a sputtering gas. For example, 100% oxygen is used as the sputtering gas. The flow rate ratio of oxygen in the sputtering gas for forming the oxide semiconductor layer is preferably 70% or more, further preferably 80% or more, still further preferably 100%. By increasing the proportion (flow rate ratio) of oxygen in the sputtering gas, the crystallinity of the oxide semiconductor layer can be increased.

By introducing an impurity element after the oxide semiconductor layer 182 is formed, the threshold voltage of the transistor 200 can be changed. An impurity element can be introduced by an ion implantation method, an ion doping method, a plasma immersion ion implantation method, plasma treatment using a gas containing an impurity element, or the like.

After the oxide semiconductor layer 182 is formed, heat treatment and/or oxygen doping treatment may be performed. Heat treatment and oxygen doping treatment may be performed plural times.

Furthermore, after heat treatment is performed in a nitrogen atmosphere or a rare gas atmosphere, heat treatment may be additionally performed in an oxygen atmosphere or an ultra-dry air atmosphere. As a result, hydrogen, water, and the like contained in the oxide semiconductor layer can be released and oxygen can be supplied to the oxide semiconductor layer at the same time. Consequently, oxygen vacancies in the oxide semiconductor layer can be reduced.
[Step 5]

Then, a resist mask is formed by a photolithography method (not illustrated). With the use of the resist mask as a mask, a portion of the oxide semiconductor layer 182 is selectively removed, so that the island-shaped oxide semiconductor layer 106 is formed (see FIG. 24A).

The oxide semiconductor layer 182 can be removed by a dry etching method, a wet etching method, or the like. Both the dry etching method and the wet etching method may be used.

After the oxide semiconductor layer 106 is formed, heat treatment and/or oxygen doping treatment may be performed. Heat treatment and oxygen doping treatment may be performed plural times.
[Step 6]

Figure 24A:
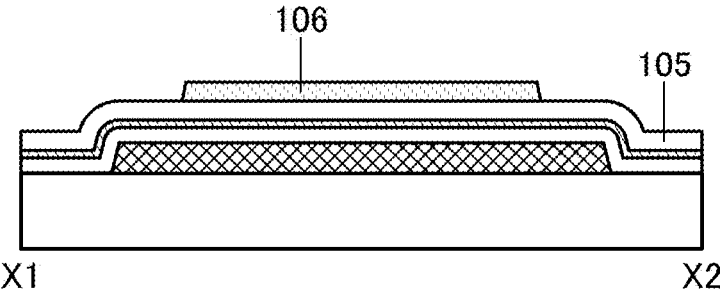
FIGS. 24A to 24D illustrate steps for manufacturing a transistor.
Figure 24B:
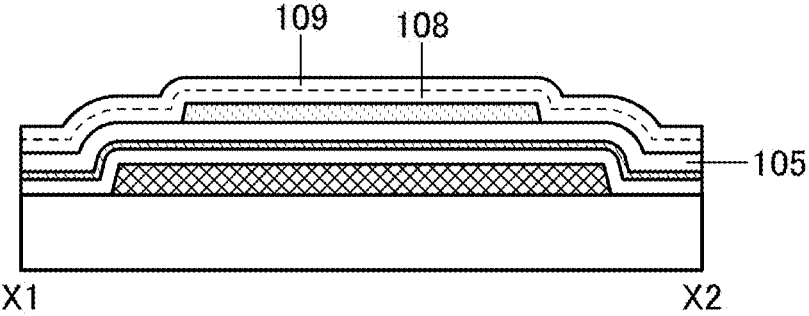

Next, the insulating layer 108 and the insulating layer 109 are sequentially formed (see FIG. 24B). The insulating layer 108 and the insulating layer 109 are preferably formed successively without being exposed to the air.

The insulating layer 108 is preferably an insulating layer containing excess oxygen. The thickness of the insulating layer 108 ranges from 5 nm to 150 nm, preferably from 5 nm to 50 nm. When the insulating layer 108 is an insulating layer through which oxygen can pass, oxygen contained in the insulating layer 109 formed later can be transferred to the oxide semiconductor layer 106.

For example, the insulating layer 108 can be a silicon oxynitride layer formed by a PECVD method. In this case, a deposition gas containing silicon and an oxidizing gas are preferably used as source gasses. Typical examples of a deposition gas containing silicon include silane, disilane, trisilane, and silane fluoride. Examples of an oxidizing gas include dinitrogen monoxide and nitrogen dioxide. The flow rate of the oxidizing gas is 20 times or more and 5000 times or less, preferably 40 times or more and 100 times or less that of the deposition gas.

In this embodiment, a 30-nm-thick silicon oxynitride layer is formed as the insulating layer 108. Specifically, the silicon oxynitride layer is formed by a PECVD method under the conditions where the substrate temperature is 350° C., silane at a flow rate of 20 sccm and dinitrogen monoxide at a flow rate of 3000 sccm are used as source gasses, the pressure in the reaction chamber is 200 Pa, and a high-frequency power of 100 W at 13.56 MHz is supplied to a parallel-plate electrode.

The insulating layer 109 is preferably an insulating layer containing excess oxygen. The thickness of the insulating layer 109 ranges from 30 nm to 500 nm, preferably from 50 nm to 400 nm.

The amount of defects in the insulating layer 109 is preferably small; as a typical example, the spin density corresponding to a signal that appears at g=2.001 due to a dangling bond of silicon is preferably lower than $1.5 \times 10^{18}$ spins/cm$^3$, further preferably lower than or equal to $1 \times 10^{18}$ spins/cm$^3$ by ESR measurement. Since the distance between the insulating layer 109 and the oxide semiconductor layer 106 is larger than the distance between the insulating layer 108 and the oxide semiconductor layer 106, the insulating layer 109 may have a higher defect density than the insulating layer 108.

The insulating layer 109 can be a silicon oxynitride layer formed by a PECVD method. For example, a silicon oxide layer or a silicon oxynitride layer is formed under the conditions where the substrate placed in a reaction chamber of a PECVD apparatus that is vacuum-evacuated is held at a temperature ranging from 180° C. to 400° C., the pressure in the reaction chamber into which source gasses are introduced ranges from 100 Pa to 250 Pa, preferably from 100 Pa to 200 Pa, and a high-frequency power of 0.17 W/cm$^2$ to 0.5 W/cm$^2$, preferably 0.25 W/cm$^2$ to 0.35 W/cm$^2$ is supplied to an electrode provided in the reaction chamber.

In formation of the insulating layer 109, when the high-frequency power with the above power density is supplied in the reaction chamber at the above pressure, decomposition efficiency of the source gases is increased in plasma. That is, oxygen radicals increase in the reaction chamber, and oxidation of the source gasses proceeds. Thus, the oxygen content of the insulating layer 109 is higher than that in the stoichiometric composition.

In the insulating layer formed at a substrate temperature within the above range, the bond between silicon and oxygen is weak, and accordingly, part of oxygen in the insulating layer is released by heat treatment in a later step. Thus, it is possible to form an oxide insulating layer which contains more oxygen than that in the stoichiometric composition and from which part of oxygen is released by heating.

In this embodiment, a 100-nm-thick silicon oxynitride layer is formed as the insulating layer 109. Specifically, the silicon oxynitride layer is formed by a PECVD method under the conditions where the substrate temperature is 220° C., silane at a flow rate of 160 sccm and dinitrogen monoxide at a flow rate of 4000 sccm are used as source gasses, the pressure in the reaction chamber is 200 Pa, and a high-frequency power of 1500 W at 13.56 MHz is supplied to a parallel-plate electrode.

Note that the insulating layer 108 functions as a protective layer for the oxide semiconductor layer 106 in the step of forming the insulating layer 109. Consequently, the insulating layer 109 can be formed using the high-frequency power with a high power density while damage to the oxide semiconductor layer 106 is reduced.

Note that in the formation conditions for the insulating layer 109, the flow rate of the deposition gas containing silicon relative to the oxidizing gas can be increased, whereby the amount of defects in the insulating layer 109 can be reduced. Typically, it is possible to form an oxide insulating layer in which the number of defects is small, i.e., the spin density of a signal that appears at g=2.001 originating from a dangling bond of silicon is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor can be improved.

[Step 7]

Figure 24C:
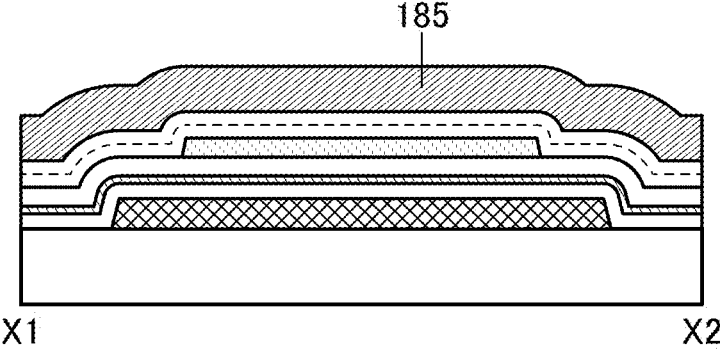
Figure 24D:
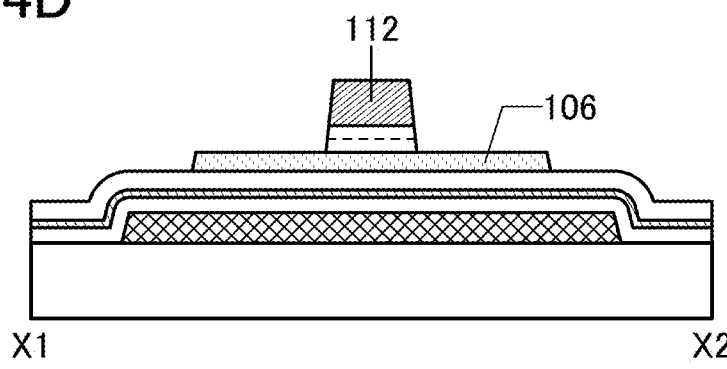

The conductive layer 185 for forming the electrode 112 is formed over the insulating layer 109 (see FIG. 24C). In this embodiment, the conductive layer 185 is formed using indium gallium zinc oxide; specifically, the conductive layer 185 has a stack of two layers of indium gallium zinc oxide.

First, a 10-nm-thick indium gallium zinc oxide layer is formed using a target with an atomic ratio In:Ga:Zn=4:2:3 and a sputtering gas with an oxygen content of 100%. Next, a 90-nm-thick indium gallium zinc oxide layer is formed using a target with an atomic ratio In:Ga:Zn=4:2:3 and a sputtering gas with an oxygen content of 10% and an argon content of 90%.

[Step 8]

Next, a resist mask is formed by a photolithography method (not illustrated). With the use of the resist mask as a mask, a portion of the conductive layer 185 is selectively removed, so that the electrode 112 is formed. At this time, with the use of the electrode 112 as a mask, portions of the insulating layers 108 and 109 are also selectively removed (see FIG. 24D). By Step 8, part of the oxide semiconductor layer 106 is exposed.

The conductive layer 185 and the insulating layers 108 and 109 can be removed by a dry etching method, a wet etching method, or the like. Both the dry etching method and the wet etching method may be used.

[Step 9]

Figure 25A:
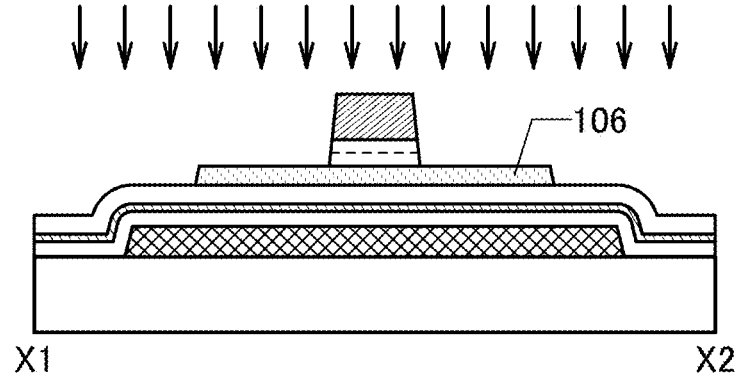
FIGS. 25A to 25C illustrate steps for manufacturing a transistor.

Then, impurities are introduced into the exposed regions of the oxide semiconductor layer 106, which are exposed in Step 8 (see FIG. 25A). The impurities can be introduced by an ion implantation method, an ion doping method, a plasma immersion ion implantation method, or the like. Introducing impurities such as nitrogen into the regions can lower the resistance of the regions.

Moreover, the regions may be exposed to a plasma atmosphere of nitrogen or an inert gas. Exposing the regions to a plasma atmosphere causes a defect in the regions and thus can lower the resistance of the regions.

In the oxide semiconductor layer 106, the regions into which the impurities are introduced or the regions exposed to a plasma atmosphere can function as a source region and a drain region of the transistor. Moreover, in the oxide semiconductor layer 106, a region overlapped by the electrode 112 can function as a channel formation region. In other words, the source region and the drain region can be formed in a self-aligned manner.

[Step 10]

Then, heat treatment is performed in an inert atmosphere to reduce hydrogen, moisture, and the like included in the oxide semiconductor layer 106 and the insulating layers 108 and 109. Heat treatment after Step 9 may sometimes lower the resistance of the source region and the drain region in the oxide semiconductor layer 106. Note that heat treatment may be performed under a reduced pressure without supply of an inert gas or the like. In this embodiment, heat treatment is performed at 400° C. for one hour in a nitrogen atmosphere.

[Step 11]

Subsequently, heat treatment may be performed in an oxidizing atmosphere. In this embodiment, heat treatment is performed at 400° C. for one hour in an oxygen atmosphere. For example, when nitrogen is introduced into the oxide semiconductor layer 106 in Step 8, heat treatment in an oxygen atmosphere may sometimes increase the amount of NOx in the source and drain regions and lower the resistance of the source and drain regions. Note that one of Step 10 and Step 11 may be omitted.

[Step 12]

Figure 25B:
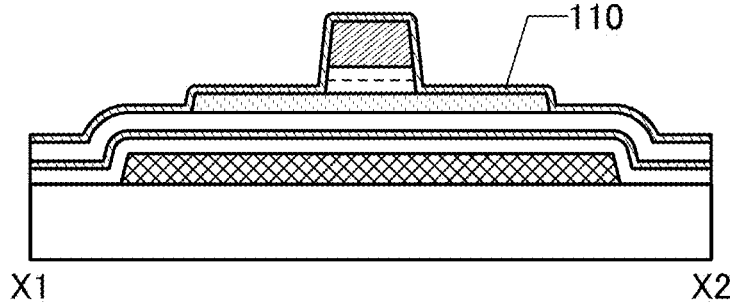

Next, the insulating layer 110 is formed (see FIG. 25B). As described above, the insulating layer 110 is preferably formed using an insulating material through which impurities do not easily pass. Moreover, the insulating layer 110 is preferably formed using an insulating material into which oxygen does not easily diffuse. The thickness of the insulating layer 110 ranges from 5 nm to 40 nm.

In this embodiment, a 30-nm-thick aluminum oxide layer is formed by a sputtering method as the insulating layer 110. Oxygen or a mixed gas of oxygen and a rare gas is used as a sputtering gas. The flow rate ratio of oxygen in the sputtering gas is preferably 70% or more, further preferably 80% or more, still further preferably 100%. By using a sputtering gas containing oxygen, oxygen can be supplied to the layer over which the insulating layer 110 is formed (i.e., the insulating layer 109). As the amount of oxygen contained in the sputtering gas increases, the amount of oxygen supplied to the layer over which the insulating layer 110 is formed tends to increase. In this embodiment, 100% oxygen is used as the sputtering gas.

The aluminum oxide layer used as the insulating layer 110 may be formed by a DC sputtering method using an aluminum target or by an AC sputtering method using an aluminum oxide target.

Alternatively, the insulating layer 110 may be a silicon nitride layer that contains no or little hydrogen. Such a silicon nitride layer can be formed by a sputtering method, for example.

When the insulating layer 111 is formed over the insulating layer 110, the insulating layer 111 is preferably an aluminum oxide layer formed by an ALD method. The thickness of the insulating layer 111 ranges from 5 nm to 40 nm. An ALD method can provide an aluminum oxide layer with favorable coverage, resulting in higher reliability of the transistor. Alternatively, the insulating layer 111 may be a silicon nitride layer.

Steps 10 to 12 are successively performed without exposure to the air. This can prevent adsorption of hydrogen, moisture, and the like on the oxide semiconductor layer 106 and increase the reliability of the transistor. Moreover, covering the oxide semiconductor layer 106 with the insulating layer 110 can prevent entry of hydrogen, moisture, and the like from the outside and diffusion of oxygen to the outside.

[Step 13]

Figure 25C:
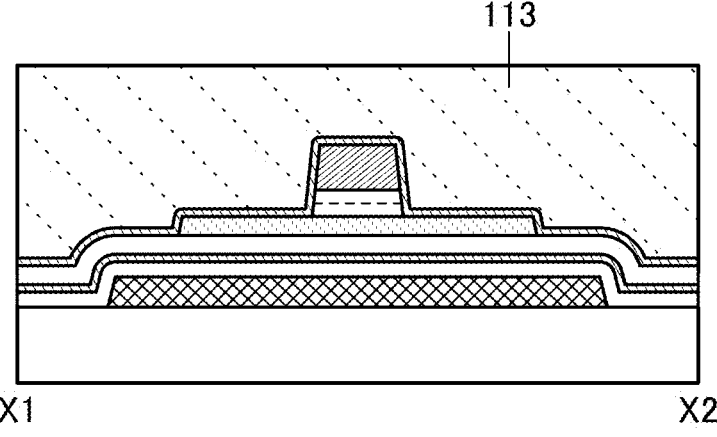

Then, the insulating layer 113 is formed (see FIG. 25C). In this embodiment, a 1.5-μm-thick acrylic resin layer is formed as the insulating layer 113.

[Step 14]

Next, a resist mask is formed by a photolithography method (not illustrated). With the use of the resist mask as a mask, portions of the insulating layers 113 and 110 are selectively removed to form openings 188 (see FIG. 26A). At this time, part of the oxide semiconductor layer 106 is exposed.

[Step 15]

Figure 26A:
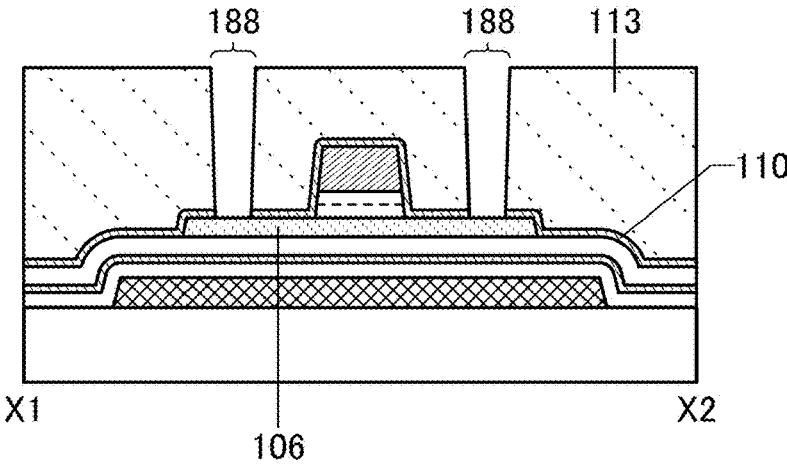
FIGS. 26A to 26C illustrate steps for manufacturing a transistor.
Figure 26B:
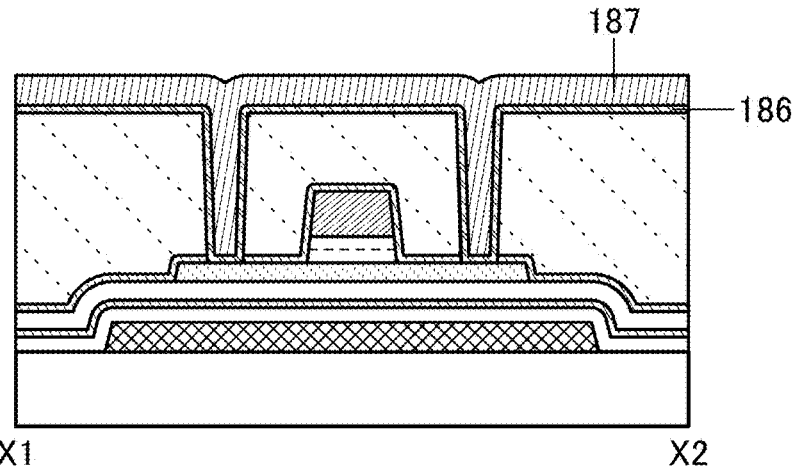
Figure 26C:
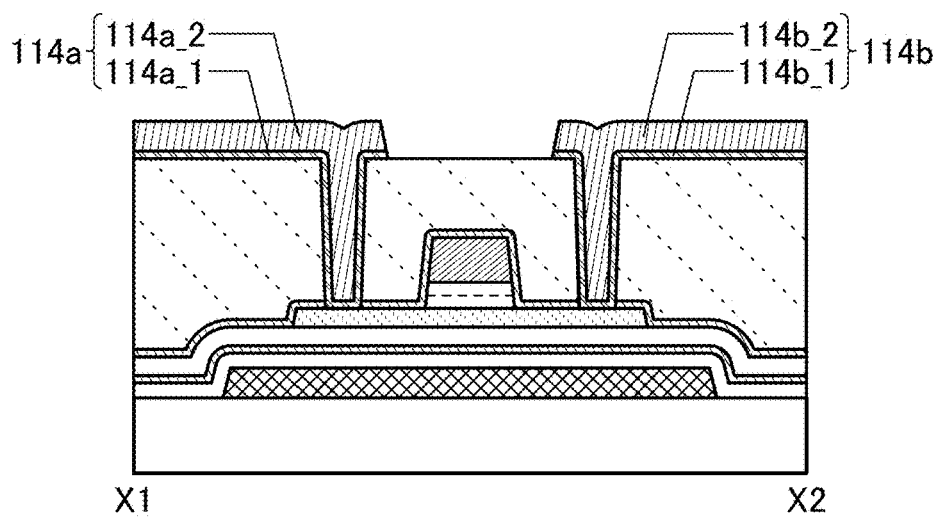

Subsequently, the conductive layer 186 and a conductive layer 187 are sequentially formed (see FIG. 26B). Particularly for the conductive layer 186, which is in contact with the oxide semiconductor layer 106, a conductive material with a function of absorbing hydrogen through heat treatment is preferably used. When the conductive layer 186 is formed using such a material, the hydrogen concentration of the oxide semiconductor layer 106 can be reduced by heat treatment performed later. Examples of a conductive material with a function of absorbing hydrogen include titanium, indium zinc oxide, and indium tin oxide to which silicon is added.

In this embodiment, a 30-nm-thick titanium layer is formed as the conductive layer 186, and a 200-nm-thick copper layer is formed by a sputtering method as the conductive layer 187.

[Step 16]

Next, a resist mask is formed by a photolithography method (not illustrated). With the use of the resist mask as a mask, a portion of the conductive layer 186 is selectively removed to form the electrode 114a_1 and the electrode 114b_1 (see FIG. 26C). At the same time, a portion of the conductive layer 187 is selectively removed to form the electrode 114a_2 and the electrode 114b_2.

The conductive layers 186 and 187 can be removed by a dry etching method, a wet etching method, or the like. Both the dry etching method and the wet etching method may be used.

Heat treatment may be performed after the resist mask is removed. For example, heat treatment is performed at 250° C. for one hour in a nitrogen atmosphere.

Modification Examples of Transistor 200

Modification examples of the transistor 200 will be described with reference to drawings.

Modification Example 1

Figure 27A:
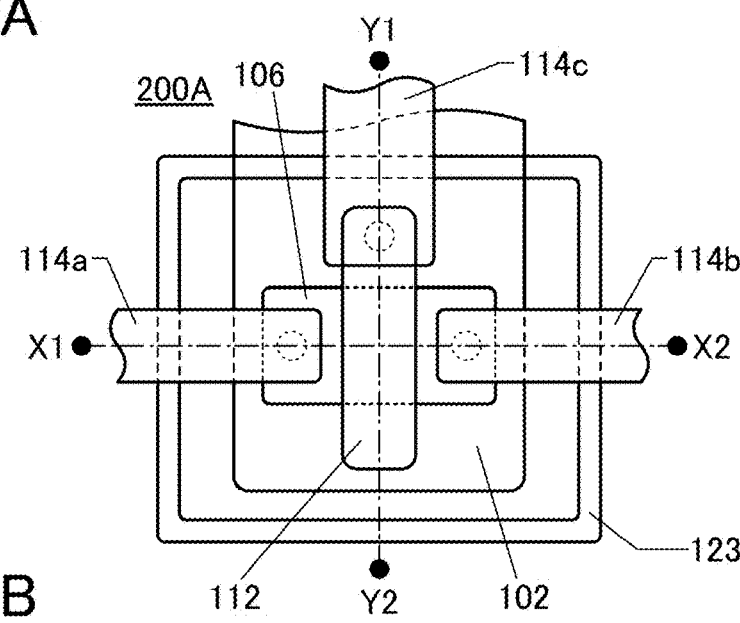
FIGS. 27A to 27C illustrate a transistor.
Figure 27B:
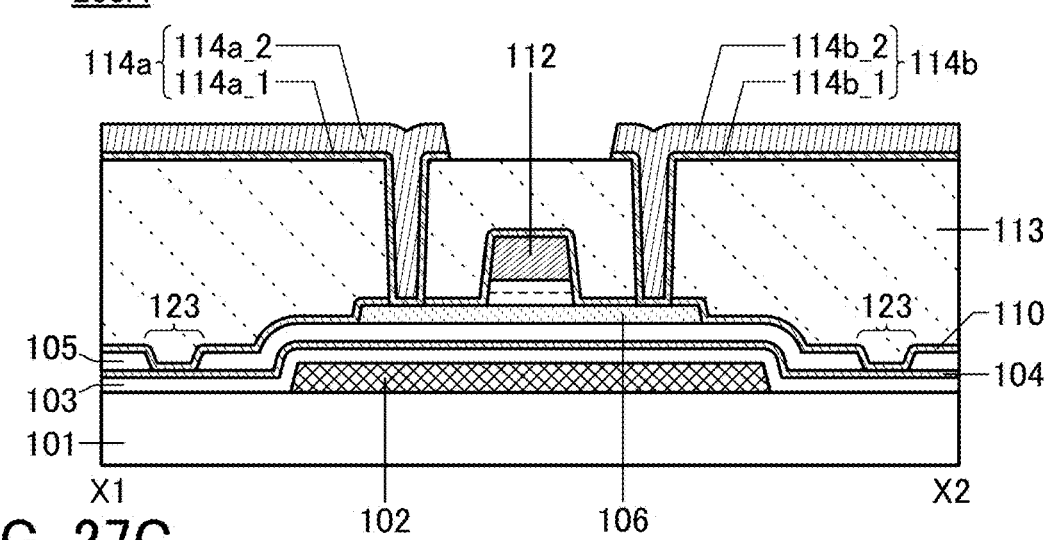
Figure 27C:
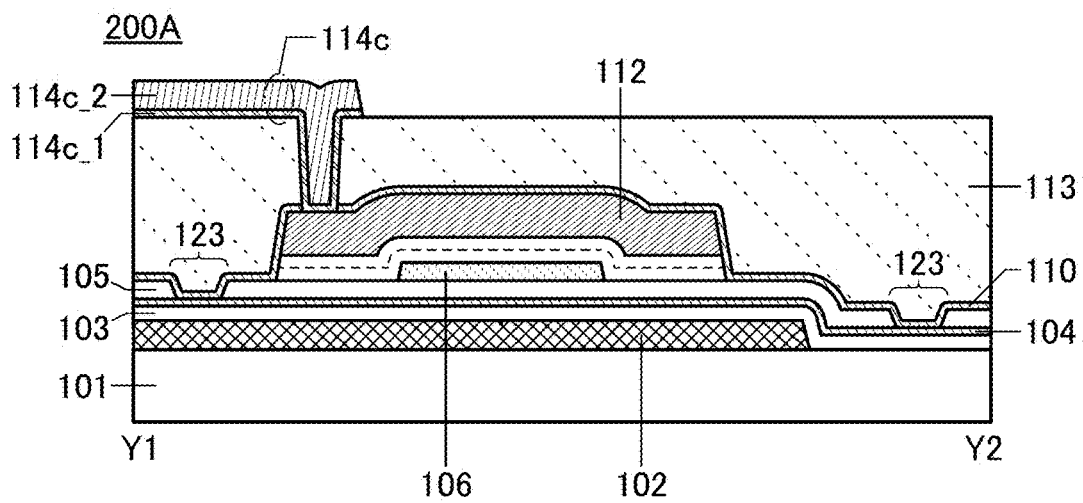

FIG. 27A is a plan view of a transistor 200A. FIG. 27B is a cross-sectional view of a portion indicated by the dashed-dotted line X1-X2 in FIG. 27A. FIG. 27C is a cross-sectional view of a portion indicated by the dashed-dotted line Y1-Y2 in FIG. 27A.

The transistor 200A is different from the transistor 200 in including an electrode 114c (an electrode 114c_1 and an electrode 114c_2) over the insulating layer 113. The electrode 114c can be formed in the same step as the electrodes 114a and 114b, using a material and a method similar to those for the electrodes 114a and 114b. The electrode 114c is electrically connected to the electrode 112 through an opening provided in the insulating layers 113 and 110.

In addition, the transistor 200A is different from the transistor 200 in including the region 123 that surrounds the outer side of the oxide semiconductor layer 106 when seen in the plan view. In the region 123, the insulating layer 105 is removed, and the insulating layer 104 is in contact with the insulating layer 110.

Providing the region 123 can enhance the effect of preventing entry of hydrogen, moisture, and the like from the outside and the effect of preventing diffusion of oxygen to the outside.

Modification Example 2

Figure 28A:
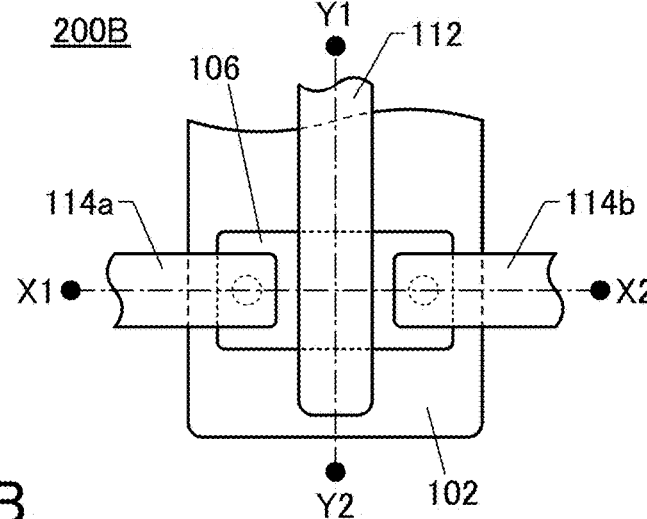
FIGS. 28A to 28C illustrate a transistor.
Figure 28B:
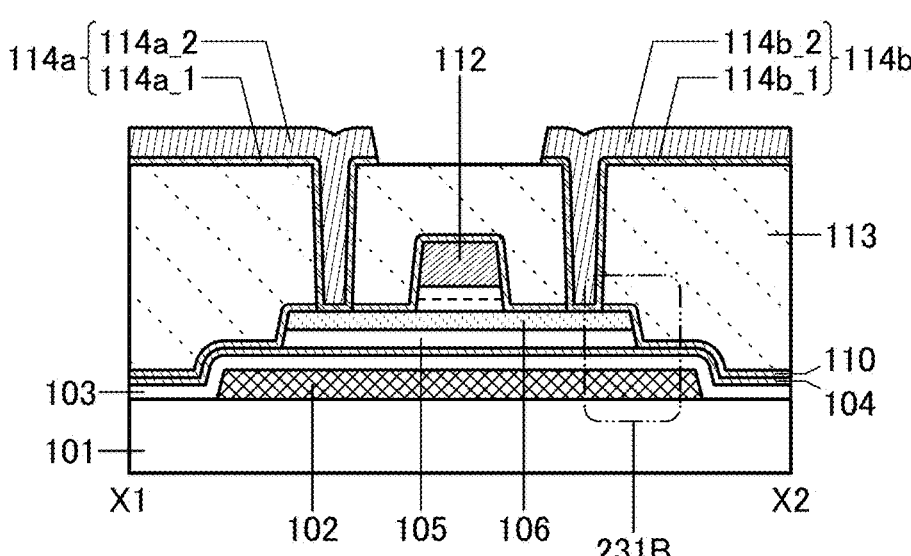
Figure 28C:
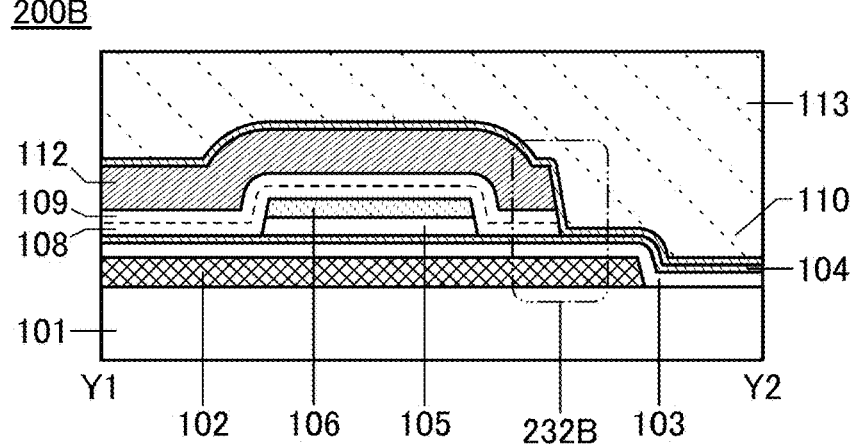
Figure 29A:
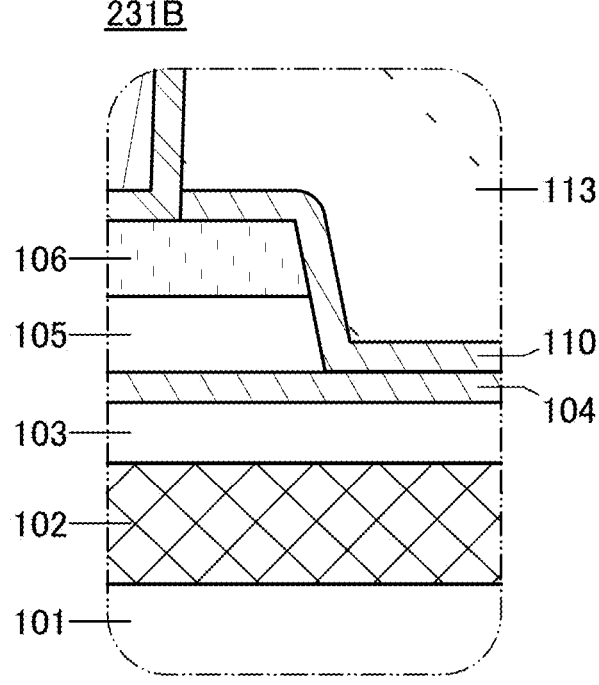
FIGS. 29A and 29B illustrate a transistor.
Figure 29B:
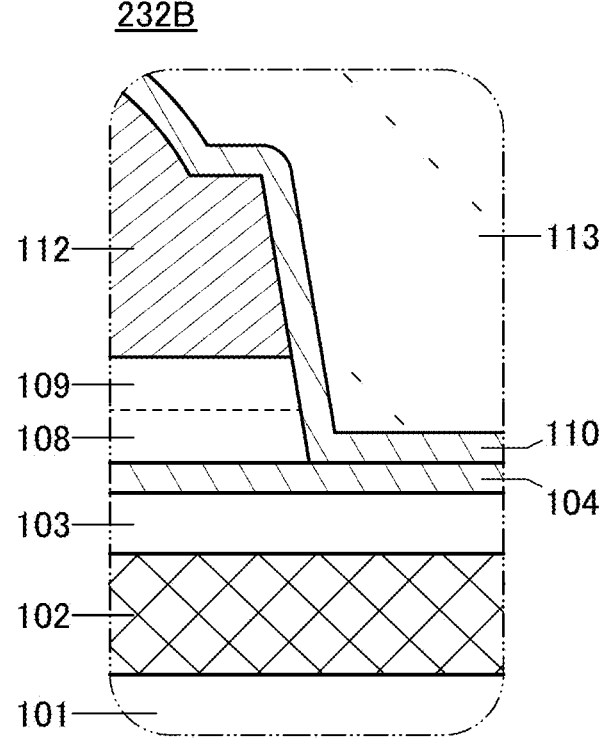

FIG. 28A is a plan view of a transistor 200B. FIG. 28B is a cross-sectional view of a portion indicated by the dashed-dotted line X1-X2 in FIG. 28A. FIG. 28C is a cross-sectional view of a portion indicated by the dashed-dotted line Y1-Y2 in FIG. 28A. FIG. 29A is an enlarged view of a portion 231B in FIG. 28B. FIG. 29B is an enlarged view of a portion 232B in FIG. 28C.

The transistor 200B differs from the transistor 200 in the shape of the insulating layer 105. The transistor 200B includes an island-shaped insulating layer 105 overlapped by the oxide semiconductor layer 106. The island-shaped insulating layer 105 can be formed by removing part of the exposed insulating layer 105 in formation of the oxide semiconductor layer 106 in Step 5.

In the transistor 200B, the insulating layer 110 and the insulating layer 104 extend beyond end portions of the oxide semiconductor layer 106 and end portions of the insulating layer 105 to have a region where they are in contact with each other. This structure can enhance the effect of preventing entry of hydrogen, moisture, and the like from the outside and the effect of preventing diffusion of oxygen to the outside.

Modification Example 3

Figure 30A:
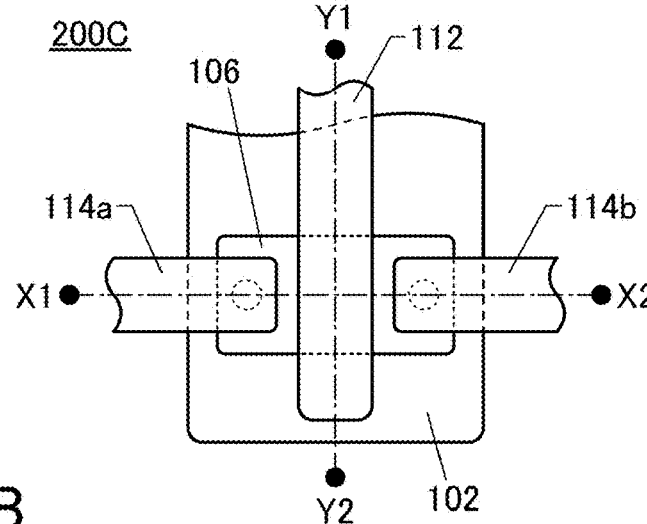
FIGS. 30A to 30C illustrate a transistor.
Figure 30B:
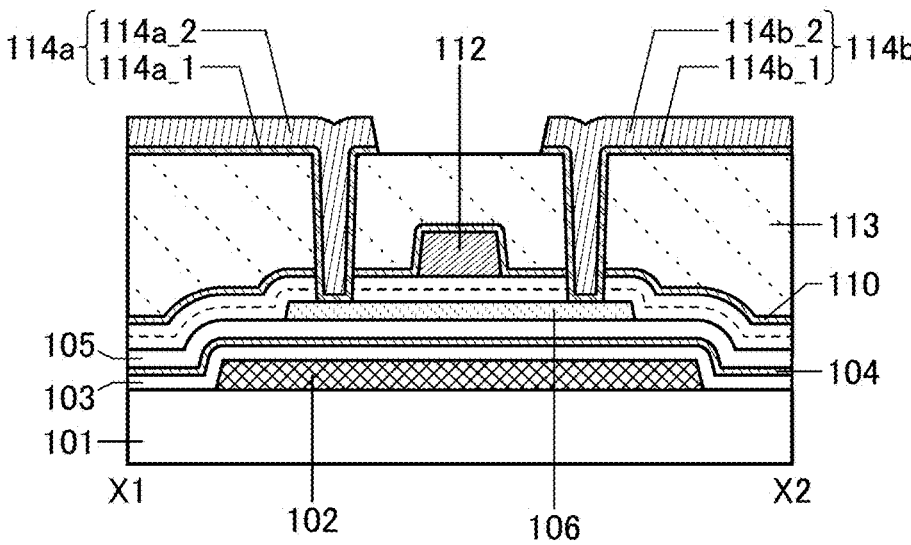
Figure 30C:
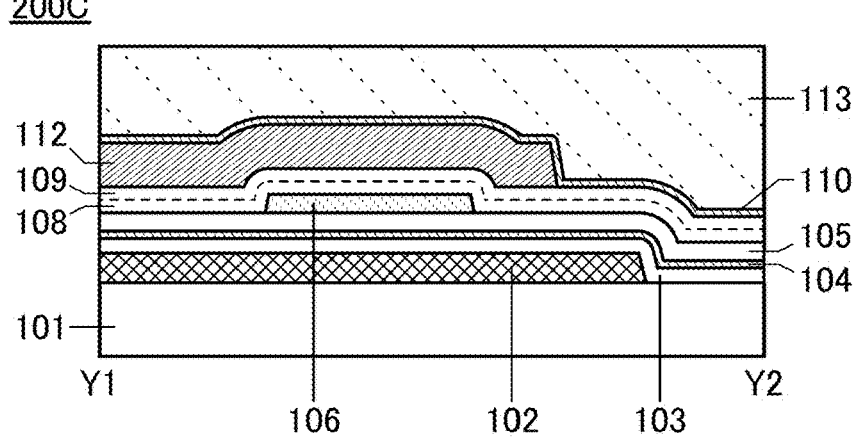

FIG. 30A is a plan view of a transistor 200C. FIG. 30B is a cross-sectional view of a portion indicated by the dashed-dotted line X1-X2 in FIG. 30A. FIG. 30C is a cross-sectional view of a portion indicated by the dashed-dotted line Y1-Y2 in FIG. 30A.

The transistor 200C differs from the transistor 200 in the shape of the insulating layer 108 and the insulating layer 109. In the transistor 200C, the insulating layers 108 and 109 cover the oxide semiconductor layer 106. In the transistor 200C, the insulating layers 108 and 109 are left without being etched when the electrode 112 is formed in Step 8.

Covering the oxide semiconductor layer 106 with the insulating layers 108 and 109 can increase the amount of oxygen supplied from the insulating layers 108 and 109 to the oxide semiconductor layer 106.

Modification Example 4

Figure 31A:
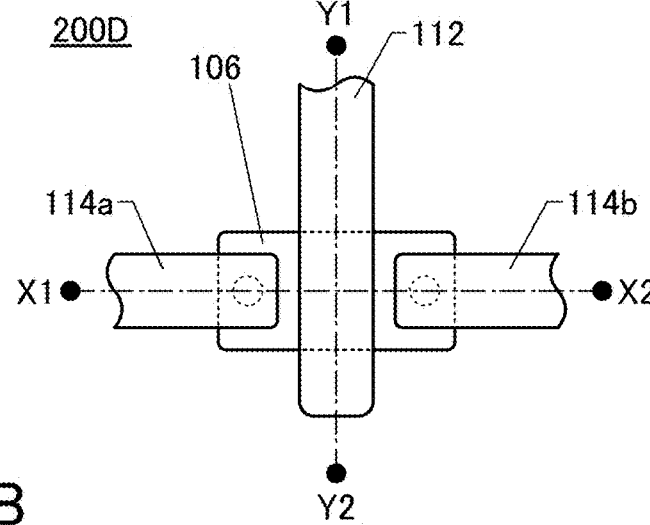
FIGS. 31A to 31C illustrate a transistor.
Figure 31B:
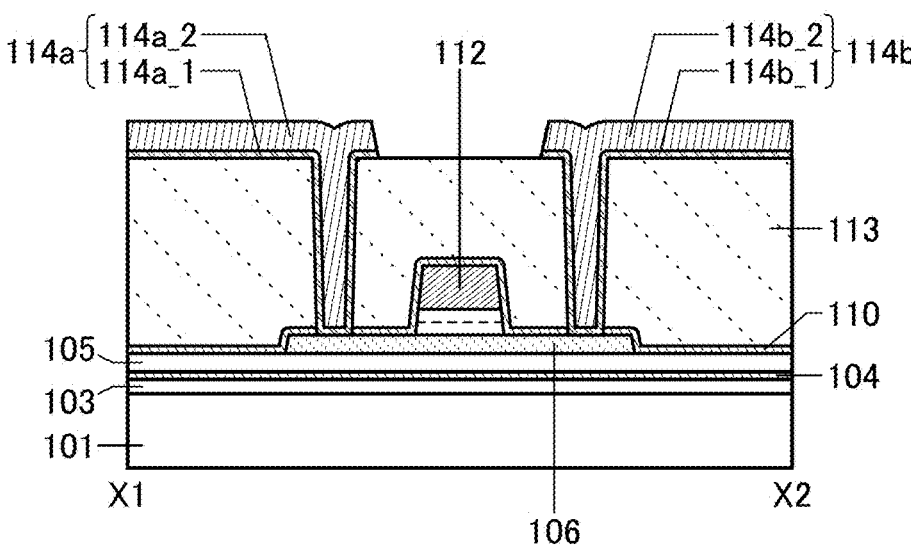
Figure 31C:
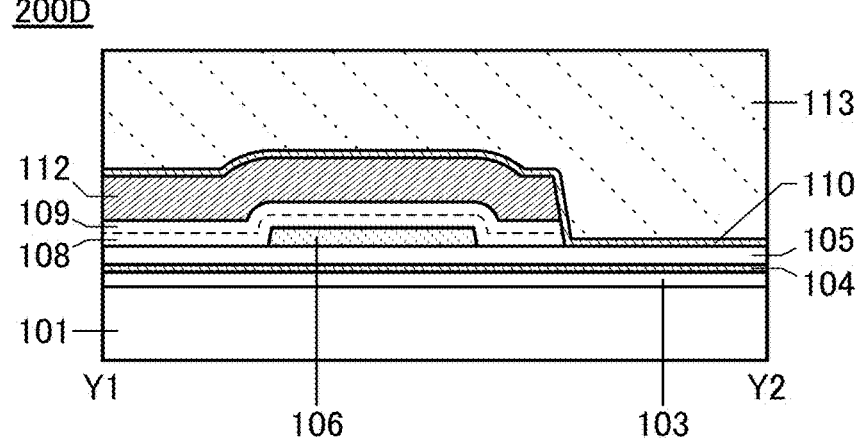

FIG. 31A is a plan view of a transistor 200D. FIG. 31B is a cross-sectional view of a portion indicated by the dashed-dotted line X1-X2 in FIG. 31A. FIG. 31C is a cross-sectional view of a portion indicated by the dashed-dotted line Y1-Y2 in FIG. 31A.

The transistor 200D has the structure of the transistor 200 without the electrode 102. The electrode 102 is not necessarily provided, as determined by required performance, purpose, or the like of the transistor. When the electrode 102 is not provided, the number of steps for manufacturing the transistor is reduced; thus, the manufacturing cost can be reduced. Moreover, the manufacturing yield of the transistor can be increased.

Modification Example 5

Figure 32A:
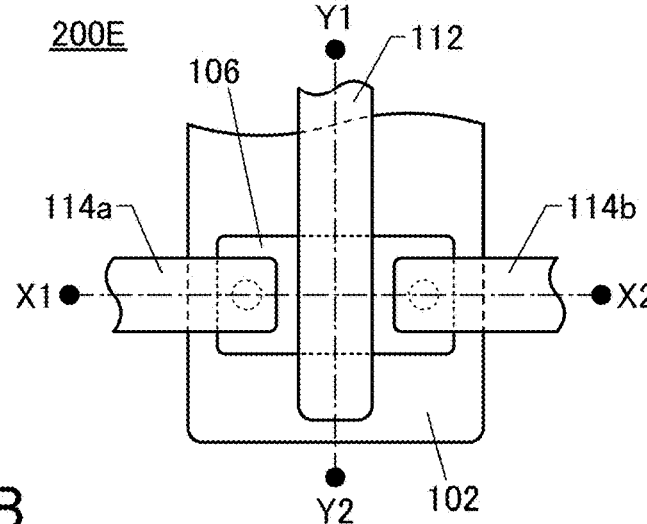
FIGS. 32A to 32C illustrate a transistor.
Figure 32B:
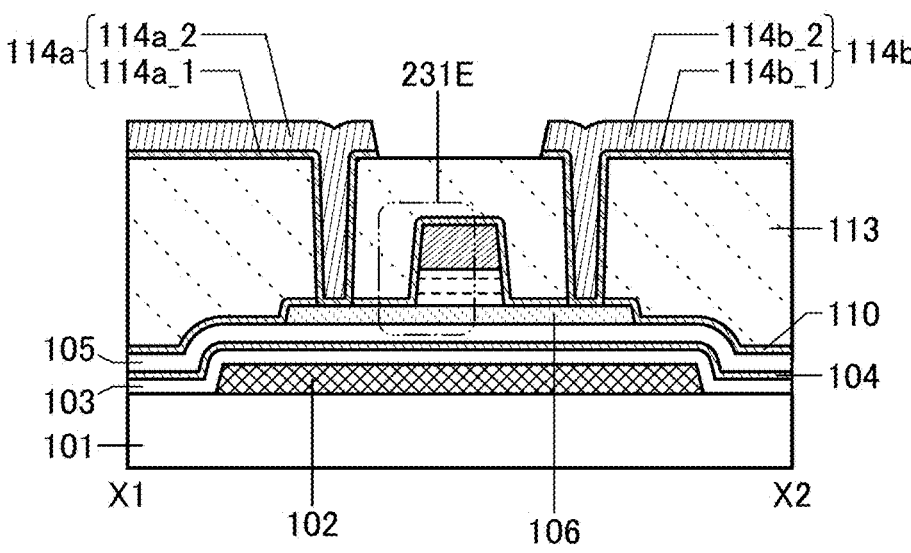
Figure 32C:
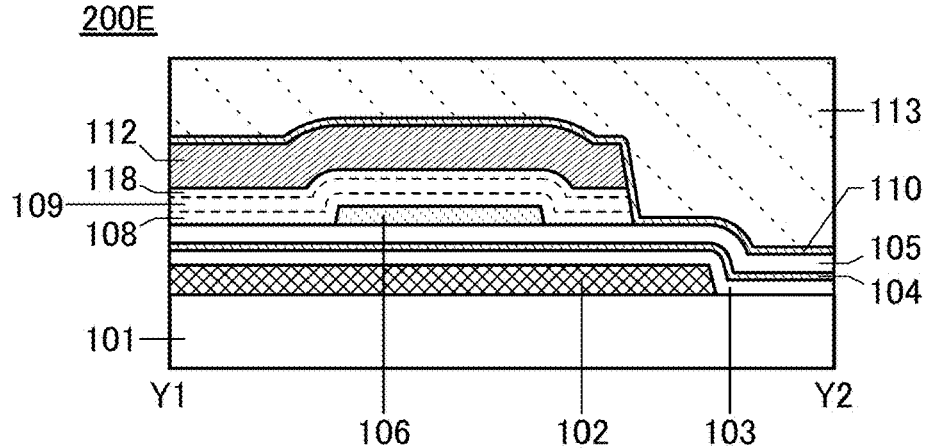
Figure 33:
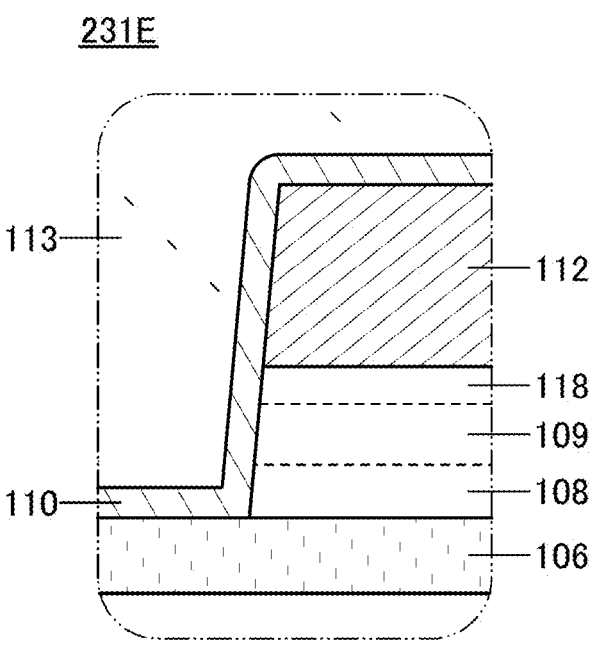
FIG. 33 illustrates a transistor.

FIG. 32A is a plan view of a transistor 200E. FIG. 32B is a cross-sectional view of a portion indicated by the dashed-dotted line X1-X2 in FIG. 32A. FIG. 32C is a cross-sectional view of a portion indicated by the dashed-dotted line Y1-Y2 in FIG. 32A. FIG. 33 is an enlarged view of a portion 231E in FIG. 32B.

The transistor 200E is different from the transistor 200 in including an insulating layer 118 between the insulating layer 109 and the electrode 112. The insulating layer 118 is formed using a material and a method similar to those for the insulating layer 108 or the insulating layer 109.

For example, a 20-nm-thick silicon oxynitride layer is formed as the insulating layer 118. Specifically, the silicon oxynitride layer is formed by a PECVD method under the conditions where the substrate temperature is 350° C., silane at a flow rate of 20 sccm and dinitrogen monoxide at a flow rate of 3000 sccm are used as source gasses, the pressure in the reaction chamber is 200 Pa, and a high-frequency power of 100 W at 13.56 MHz is supplied to a parallel-plate electrode.

When an insulating layer containing excess oxygen is used as the insulating layer 118, the amount of oxygen supplied to the oxide semiconductor layer 106 can be increased.

This embodiment can be implemented in appropriate combination with any of the structures described in the other embodiments and the like.

Embodiment 3

In this embodiment, a display device and display module will be described as examples of a semiconductor device including any of the transistors disclosed in this specification and the like.

<Display Device>

Figure 34A:
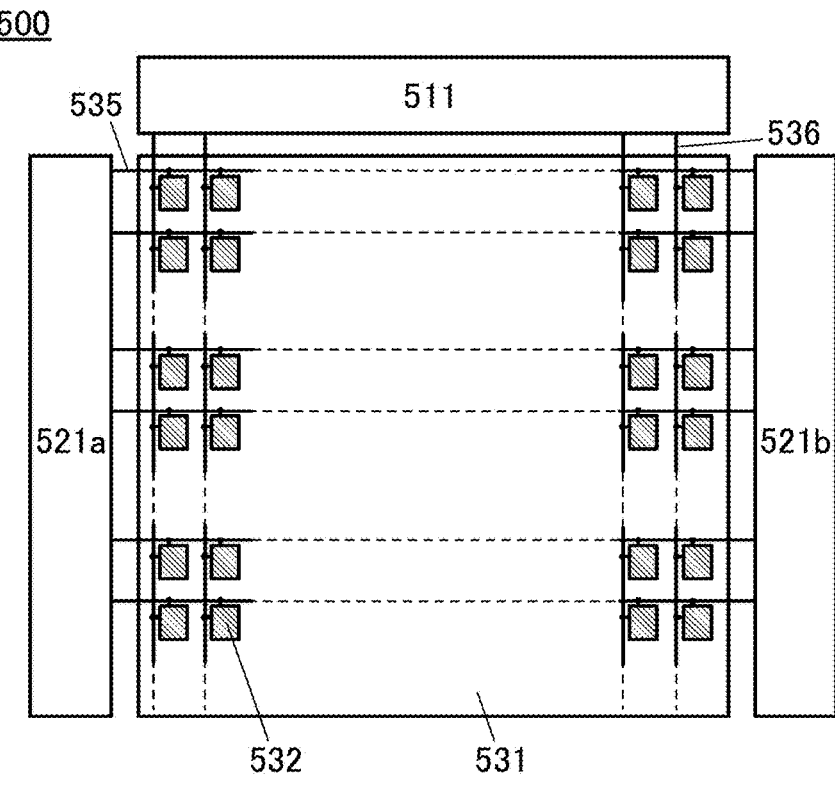
FIGS. 34A to 34C illustrate an example of a display device and circuit configuration examples of a pixel.

An example of a display device including any of the above transistors will be described. FIG. 34A is a block diagram showing a structure example of a display device 500.

The display device 500 in FIG. 34A includes driver circuits 511, 521a, and 521b and a display region 531. Note that the driver circuits 511, 521a, and 521b are collectively referred to as a driver circuit or a peripheral driver circuit in some cases.

The driver circuits 521a and 521b can function as scan line driver circuits, for example. The driver circuit 511 can function as a signal line driver circuit, for example. Note that one of the driver circuits 521a and 521b may be omitted. Some sort of circuit may be provided to face the driver circuit 511 with the display region 531 placed therebetween.

The display device 500 illustrated in FIG. 34A includes p wirings 535 that are arranged substantially parallel to each other and whose potentials are controlled by the driver circuit 521a and/or the driver circuit 521b, and q wirings 536 that are arranged substantially parallel to each other and whose potentials are controlled by the driver circuit 511. Note that p and q are each a natural number of 1 or more. The display region 531 includes a plurality of pixels 532 arranged in a matrix. The pixel 532 includes a pixel circuit 534 and a display element.

When three pixels 532 function as one pixel, full-color display can be achieved. The three pixels 532 each control the transmittance, reflectance, amount of emitted light, or the like of red light, green light, or blue light. The light colors controlled by the three pixels 532 are not limited to the combination of red, green, and blue and may be yellow, cyan, and magenta.

A pixel 532 that controls white light may be added to the pixels controlling red light, green light, and blue light so that the four pixels 532 can collectively serve as one pixel. The addition of the pixel 532 controlling white light can increase the luminance of the display region. When the number of the pixels 532 functioning as one pixel is increased to use red, green, blue, yellow, cyan, and magenta in appropriate combination, the range of color reproduction can be widened.

Using the pixels arranged in a matrix of 1920×1080, the display device 500 can display an image with full high-definition (Full HD, also referred to as 2K resolution, 2K1K, 2K, or the like) quality. Using the pixels arranged in a matrix of 3840×2160, the display device 500 can display an image with Ultra HD (also referred to as 4K resolution, 4K2K, 4K, or the like) quality. Using the pixels arranged in a matrix of 7680×4320, the display device 500 can display an image with "Super Hi-Vision" (also referred to as 8K resolution, 8K4K, 8K, or the like) quality. Using a larger number of pixels, the display device 500 can display an image with 16K or 32K resolution.

A wiring 535_g in the g-th row (g is a natural number of 1 to p) is electrically connected to q pixels 532 in the g-th row among the plurality of pixels 532 arranged in p rows and q columns in the display region 531. A wiring 536_h in the h-th column (h is a natural number of 1 to q) is electrically connected to p pixels 532 in the h-th column among the plurality of pixels 532 arranged in p rows and q columns.

[Display Element]

The display device 500 can employ various modes and include various display elements. Examples of display elements include display elements containing a display medium whose contrast, luminance, reflectance, transmittance, or the like is changed by electrical or magnetic effect, such as an electroluminescent (EL) element (e.g., an EL element containing organic and inorganic materials, and an EL element containing an organic or inorganic material), an LED (e.g., a white LED, a red LED, a green LED, and a blue LED), a transistor (a transistor that emits light depending on current), an electron emitter, a liquid crystal element, electronic ink, an electrophoretic element, a grating light valve (GLV), a display element using microelectromechanical systems (MEMS), a digital micromirror device (DMD), a digital micro shutter (DMS), MIRASOL (registered trademark), an interferometric modulation (IMOD) element, a MEMS shutter display element, an optical-interference-type MEMS display element, an electrowetting element, a piezoelectric ceramic display, and a display element using a carbon nanotube. Moreover, quantum dots may be used for the display element.

Examples of display devices including EL elements include an EL display. Examples of display devices including electron emitters are a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, and a projection liquid crystal display). Examples of display devices including electronic ink, electronic liquid powder (registered trademark), or electrophoretic elements include electronic paper. Other examples of display devices are a plasma display panel (PDP) and a retina scanning type projector.

In a transflective liquid crystal display and a reflective liquid crystal display, some or all of pixel electrodes function as reflective electrodes. For example, some or all of pixel electrodes are formed to contain aluminum, silver, or the like. In such a case, a memory circuit such as SRAM can be provided under the reflective electrodes. Thus, power consumption can be further reduced.

In the case of using an LED, graphene or graphite may be provided under an electrode or a nitride semiconductor of the LED. Graphene or graphite may be a multilayer film in which a plurality of layers are stacked. Providing graphene or graphite in the above manner facilitates formation of a nitride semiconductor thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when graphene is provided, the GaN semiconductor layers included in the LED can also be formed by a sputtering method.

FIGS. 34B and 34C and FIGS. 35A and 35B illustrate circuit configuration examples that can be used for the pixel 532.

Example of Pixel Circuit for Light-Emitting Display Device

Figure 34B:
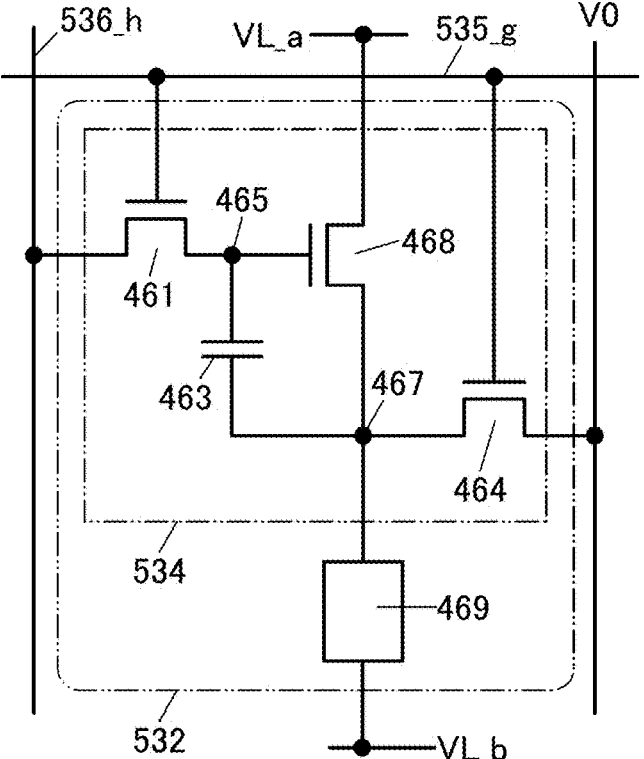

The pixel circuit 534 shown in FIG. 34B includes a transistor 461, a capacitor 463, a transistor 468, and a transistor 464. The pixel circuit 534 in FIG. 34B is electrically connected to a light-emitting element 469 that can function as a display element.

The transistors 461, 468, and 464 can be OS transistors. It is particularly preferable to use an OS transistor as the transistor 461.

One of a source electrode and a drain electrode of the transistor 461 is electrically connected to the wiring 536_h. A gate electrode of the transistor 461 is electrically connected to the wiring 535_g. The wiring 536_h supplies a video signal.

The transistor 461 has a function of controlling writing of a video signal to a node 465.

One of a pair of electrodes of the capacitor 463 is electrically connected to the node 465, and the other is electrically connected to a node 467. The other of the source electrode and the drain electrode of the transistor 461 is electrically connected to the node 465.

The capacitor 463 functions as a storage capacitor for storing data written to the node 465.

One of a source electrode and a drain electrode of the transistor 468 is electrically connected to a potential supply line VL_a, and the other is electrically connected to the node 467. A gate electrode of the transistor 468 is electrically connected to the node 465.

One of a source electrode and a drain electrode of the transistor 464 is electrically connected to a potential supply line VO, and the other is electrically connected to the node 467. A gate electrode of the transistor 464 is electrically connected to the wiring 535_g.

One of an anode and a cathode of the light-emitting element 469 is electrically connected to a potential supply line VL_b, and the other is electrically connected to the node 467.

As the light-emitting element 469, an organic electroluminescent element (organic EL element) can be used, for example. Note that the light-emitting element 469 is not limited thereto and may be an inorganic EL element containing an inorganic material, for example.

A high power supply potential VDD is supplied to one of the potential supply line VL_a and the potential supply line VL_b, and a low power supply potential VSS is supplied to the other, for example.

In the display device 500 including the pixel circuits 534 in FIG. 34B, the pixels 532 are sequentially selected row by row by the driver circuit 521a and/or the driver circuit 521b, so that the transistors 461 and 464 are turned on and a video signal is written to the node 465.

The pixel 532 in which the data has been written to the node 465 is brought into a holding state when the transistors 461 and 464 are turned off. The amount of current flowing between the source electrode and the drain electrode of the transistor 468 is controlled in accordance with the potential of the data written to the node 465. The light-emitting element 469 emits light with a luminance corresponding to the amount of flowing current. This operation is sequentially performed row by row; thus, an image can be displayed.

Figure 35A:
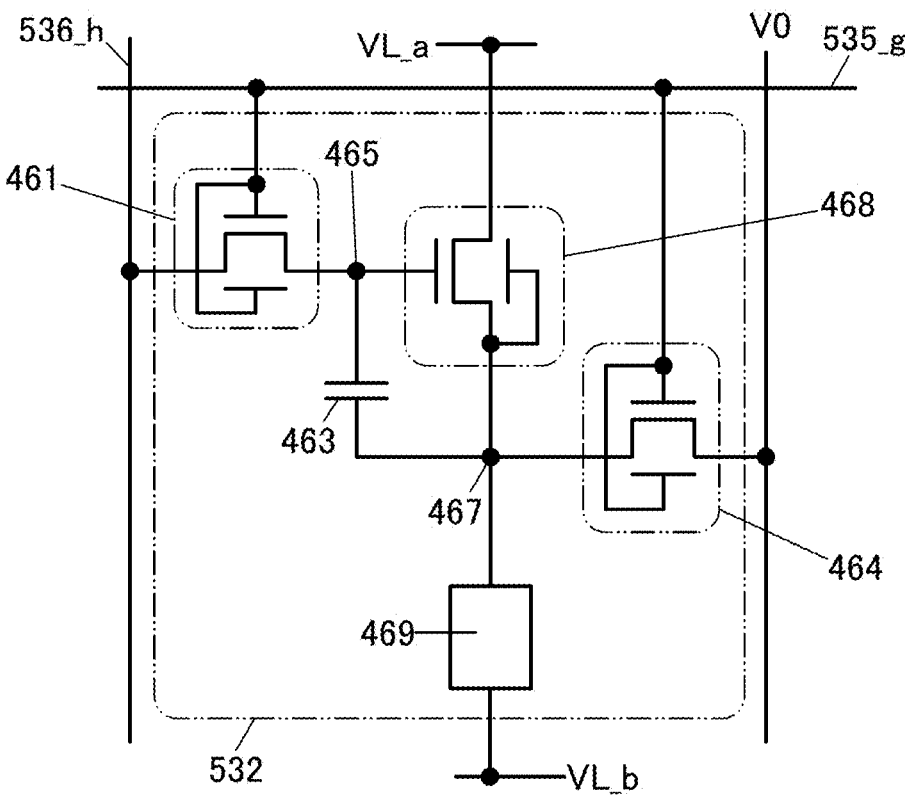
FIGS. 35A and 35B each illustrate a circuit configuration example of a pixel.

As shown in FIG. 35A, each of the transistors 461, 464, and 468 may be a transistor with a backgate. In each of the transistors 461 and 464 in FIG. 35A, the gate is electrically connected to the backgate; thus, the gate and the backgate always have the same potential. The backgate of the transistor 468 is electrically connected to the node 467; thus, the backgate always has the same potential as the node 467.

The transistor of one embodiment of the present invention can be used as at least one of the transistors 461, 468, and 464.

Example of Pixel Circuit for Liquid Crystal Display Device

Figure 34C:
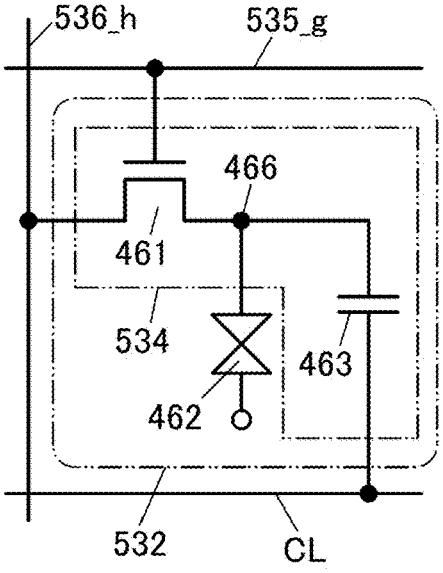

The pixel circuit 534 illustrated in FIG. 34C includes the transistor 461 and the capacitor 463. The pixel circuit 534 in FIG. 34C is electrically connected to a liquid crystal element 462 that can function as a display element. It is particularly preferable to use an OS transistor as the transistor 461.

The potential of one of a pair of electrodes of the liquid crystal element 462 is set as appropriate according to the specifications of the pixel circuit 534. For example, one of the pair of electrodes of the liquid crystal element 462 may be supplied with a common potential, or may have the same potential as a capacitor line CL. Alternatively, a potential supplied to one of the pair of electrodes of the liquid crystal element 462 may be different among the pixels 532. The other of the pair of electrodes of the liquid crystal element 462 is electrically connected to a node 466. The alignment state of the liquid crystal element 462 depends on data written to the node 466.

Examples of a method for driving the display device including the liquid crystal element 462 include a twisted nematic (TN) mode, a super-twisted nematic (STN) mode, a vertical alignment (VA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a multi-domain vertical alignment (MVA) mode, a patterned vertical alignment (PVA) mode, an in-plane switching (IPS) mode, a fringe field switching (FFS) mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Note that one embodiment of the present invention is not limited thereto, and various liquid crystal elements and driving methods can be employed.

When a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is not involved may be used. A blue phase is a liquid crystal phase that is generated just before a cholesteric phase changes into an isotropic phase while temperature of cholesteric liquid crystal is increased. Since the blue phase is only generated within a narrow range of temperatures, a liquid crystal composition containing a chiral material at 5 wt % or more is used for the liquid crystal layer in order to improve the temperature range. The liquid crystal composition that includes the liquid crystal exhibiting a blue phase and a chiral material has a short response time of 1 msec or less and has optical isotropy, which makes the alignment process unnecessary and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be increased.

It is also possible to use a method called domain multiplication or multi-domain design, in which a pixel is divided into several regions (subpixels) and molecules are aligned in different directions in their respective regions.

The specific resistance of the liquid crystal material is higher than or equal to $1 \times 10^9$ $\Omega$-cm, preferably higher than or equal to $1 \times 10^{11}$ $\Omega$-cm, further preferably higher than or equal to $1 \times 10^{12}$ $\Omega$-cm. Note that the specific resistance in this specification is measured at 20° C.

In the pixel circuit 534 in the g-th row and the h-th column, one of the source electrode and the drain electrode of the transistor 461 is electrically connected to the wiring 536_h, and the other is electrically connected to the node 466. The gate electrode of the transistor 461 is electrically connected to the wiring 535_g. The wiring 536_h supplies a video signal. The transistor 461 has a function of controlling writing of a video signal to the node 466.

One of a pair of electrodes of the capacitor 463 is electrically connected to a wiring to which a specific potential is supplied (hereinafter referred to as capacitor line CL), and the other is electrically connected to the node 466. The potential of the capacitor line CL is set as appropriate in accordance with the specifications of the pixel circuit 534. The capacitor 463 has a function as a storage capacitor for storing data written to the node 466.

For example, in the display device 500 including the pixel circuits 534 in FIG. 34C, the pixel circuits 534 are sequentially selected row by row by the driver circuit 521a and/or the driver circuit 521b, so that the transistor 461 is turned on and a video signal is written to the node 466.

The pixel circuit 534 in which the video signal has been written to the node 466 is brought into a holding state when the transistor 461 is turned off. This operation is sequentially performed row by row; thus, an image can be displayed on the display region 531.

Figure 35B:
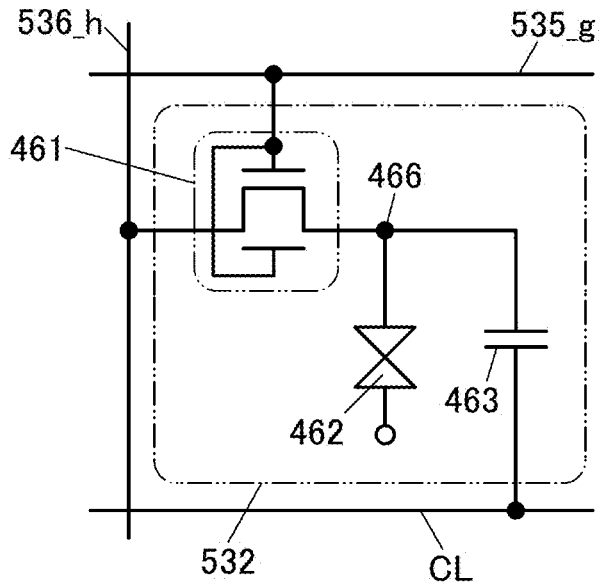

As shown in FIG. 35B, the transistor 461 may be a transistor with a backgate. In the transistor 461 in FIG. 35B, the gate is electrically connected to the backgate; thus, the gate and the backgate always have the same potential.

Structure Examples of Peripheral Circuits

Figure 36A:
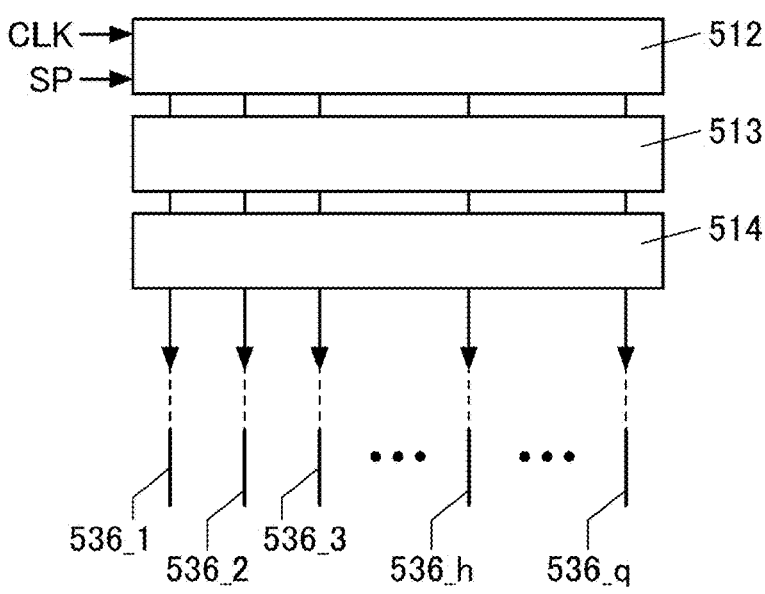
FIGS. 36A and 36B each illustrate a structure example of a driver circuit.
Figure 36B:
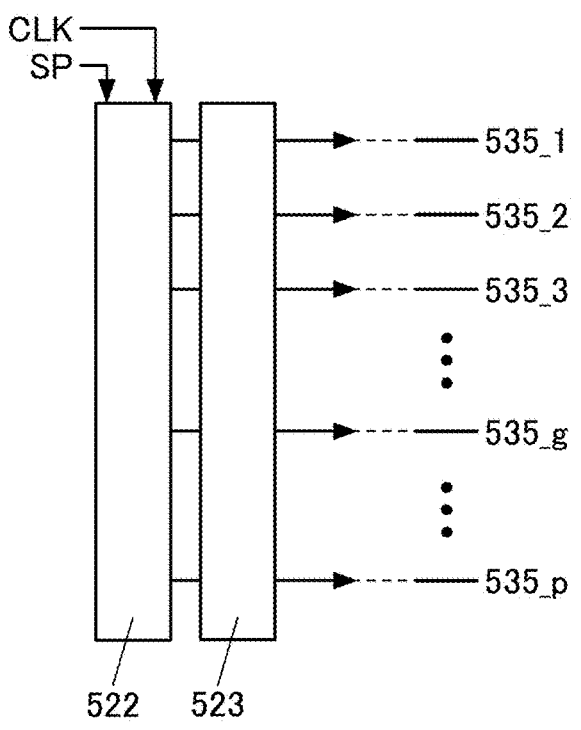

FIG. 36A shows a structure example of the driver circuit 511. The driver circuit 511 includes a shift register 512, a latch circuit 513, and a buffer 514. FIG. 36B shows a structure example of the driver circuit 521a. The driver circuit 521a includes a shift register 522 and a buffer 523. The structure of the driver circuit 521b can be similar to that of the driver circuit 521a.

A start pulse SP, a clock signal CLK, and the like are input to the shift register 512 and the shift register 522.

Structure Examples of Display Devices

With the use of any of the transistors described in the above embodiments, some or all of driver circuits that include shift registers can be formed over a substrate where a pixel portion is formed, whereby a system-on-panel can be obtained.

Figure 37A:
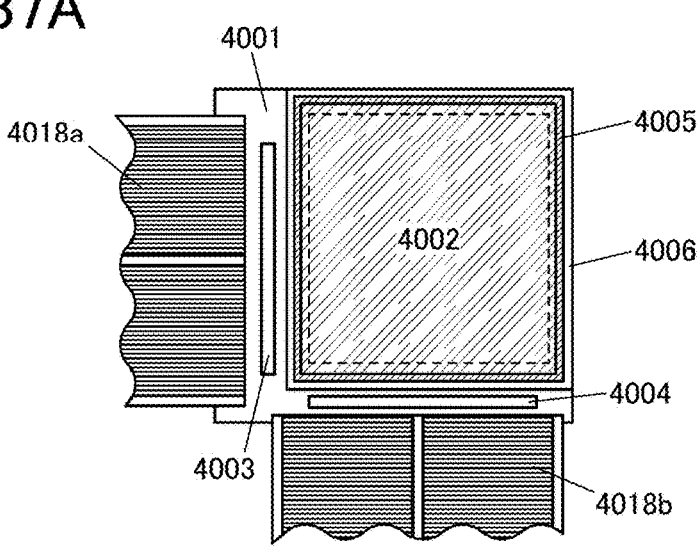
FIGS. 37A to 37C each illustrate an example of a display device.

In this embodiment, structure examples of a display device including a liquid crystal element and a display device including an EL element are described. In FIG. 37A, a sealant 4005 is provided so as to surround a pixel portion 4002 provided over a first substrate 4001, and the pixel portion 4002 is sealed by the sealant 4005 and a second substrate 4006. In FIG. 37A, a signal line driver circuit 4003 and a scan line driver circuit 4004 are formed using a single crystal semiconductor or a polycrystalline semiconductor over another substrate, and mounted in a region different from the region surrounded by the sealant 4005 over the first substrate 4001. Various signals and potentials are supplied to the signal line driver circuit 4003, the scan line driver circuit 4004, and the pixel portion 4002 through flexible printed circuits (FPCs) 4018a and 4018b.

Figure 37B:
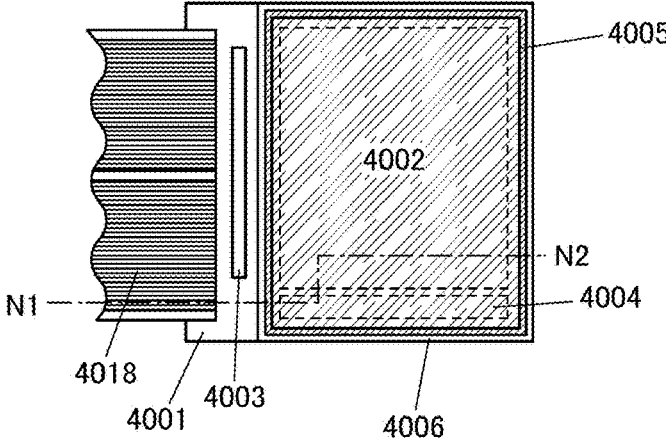
Figure 37C:
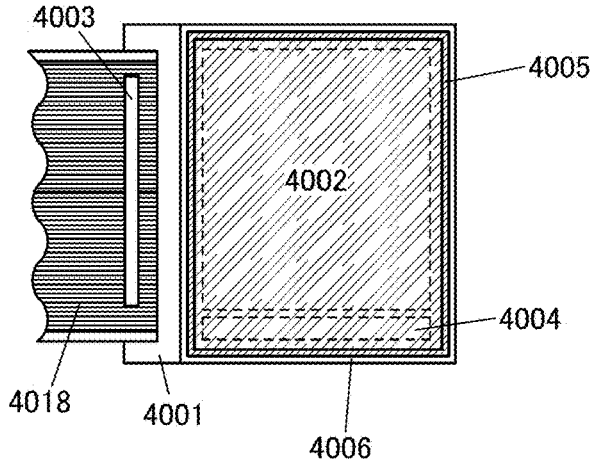

In FIGS. 37B and 37C, the sealant 4005 is provided so as to surround the pixel portion 4002 and the scan line driver circuit 4004 that are provided over the first substrate 4001. The second substrate 4006 is provided over the pixel portion 4002 and the scan line driver circuit 4004. Thus, the pixel portion 4002 and the scan line driver circuit 4004 are sealed together with a display element, by the first substrate 4001, the sealant 4005, and the second substrate 4006. Moreover, in FIGS. 37B and 37C, the signal line driver circuit 4003 that is formed using a single crystal semiconductor or a polycrystalline semiconductor over another substrate is mounted in a region that is different from the region surrounded by the sealant 4005 over the first substrate 4001. In FIGS. 37B and 37C, various signals and potentials are supplied through an FPC 4018 to the signal line driver circuit 4003, the scan line driver circuit 4004, and the pixel portion 4002.

Although FIGS. 37B and 37C each illustrate the example in which the signal line driver circuit 4003 is formed separately and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

There is no particular limitation on a method for connecting a separately formed driver circuit; wire bonding, a chip on glass (COG), a tape carrier package (TCP), a chip on film (COF), or the like can be used. FIG. 37A illustrates an example in which the signal line driver circuit 4003 and the scan line driver circuit 4004 are mounted by COG. FIG. 37B illustrates an example in which the signal line driver circuit 4003 is mounted by COG. FIG. 37C illustrates an example in which the signal line driver circuit 4003 is mounted by TCP.

In some cases, the display device encompasses a panel in which a display element is sealed, and a module in which an IC or the like including a controller is mounted on the panel.

The pixel portion and the scan line driver circuit provided over the first substrate include a plurality of transistors, and any of the transistors described in the above embodiments can be used.

Figures 38A, 38B:
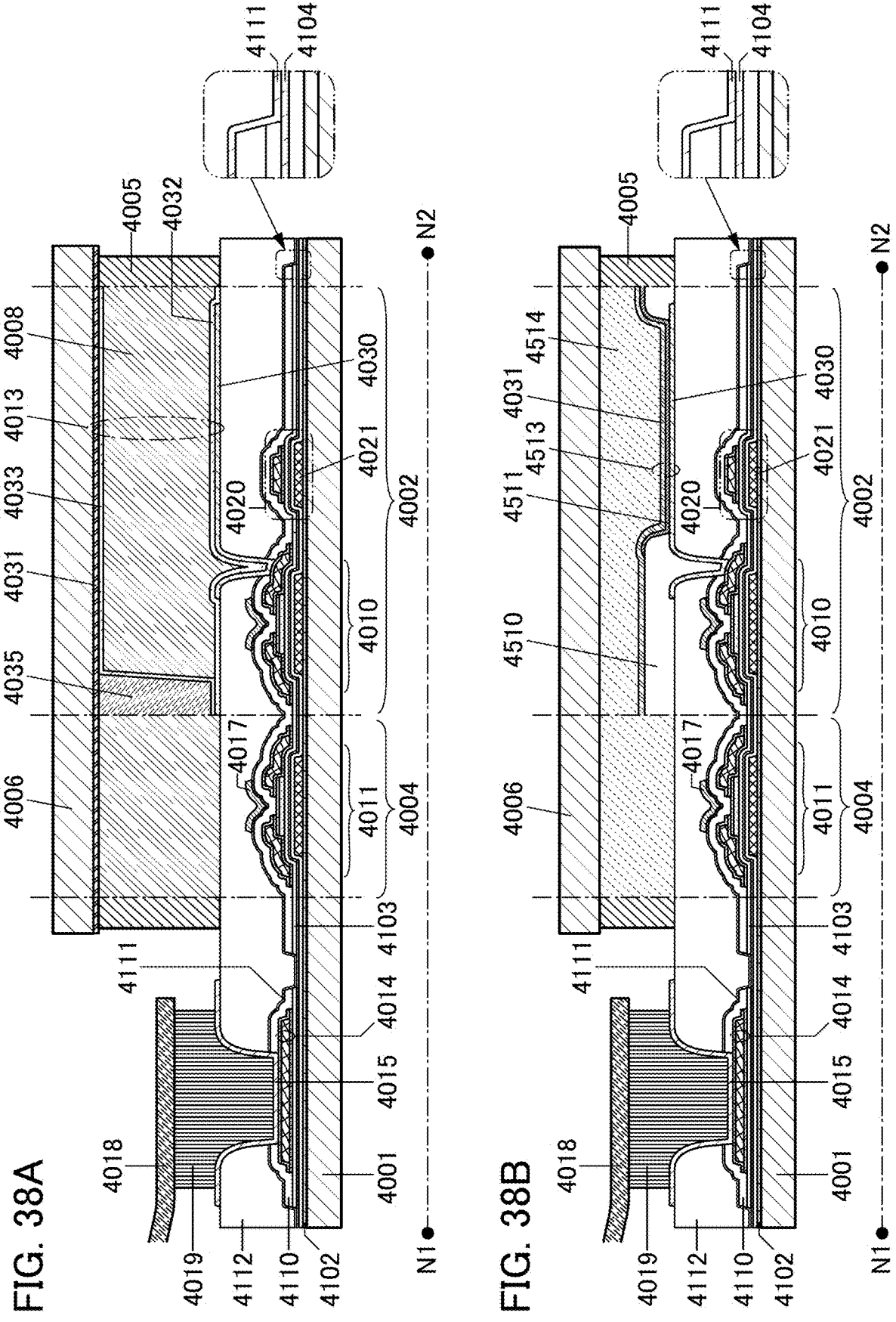
FIGS. 38A and 38B each illustrate an example of a display device.
Figures 39A, 39B:
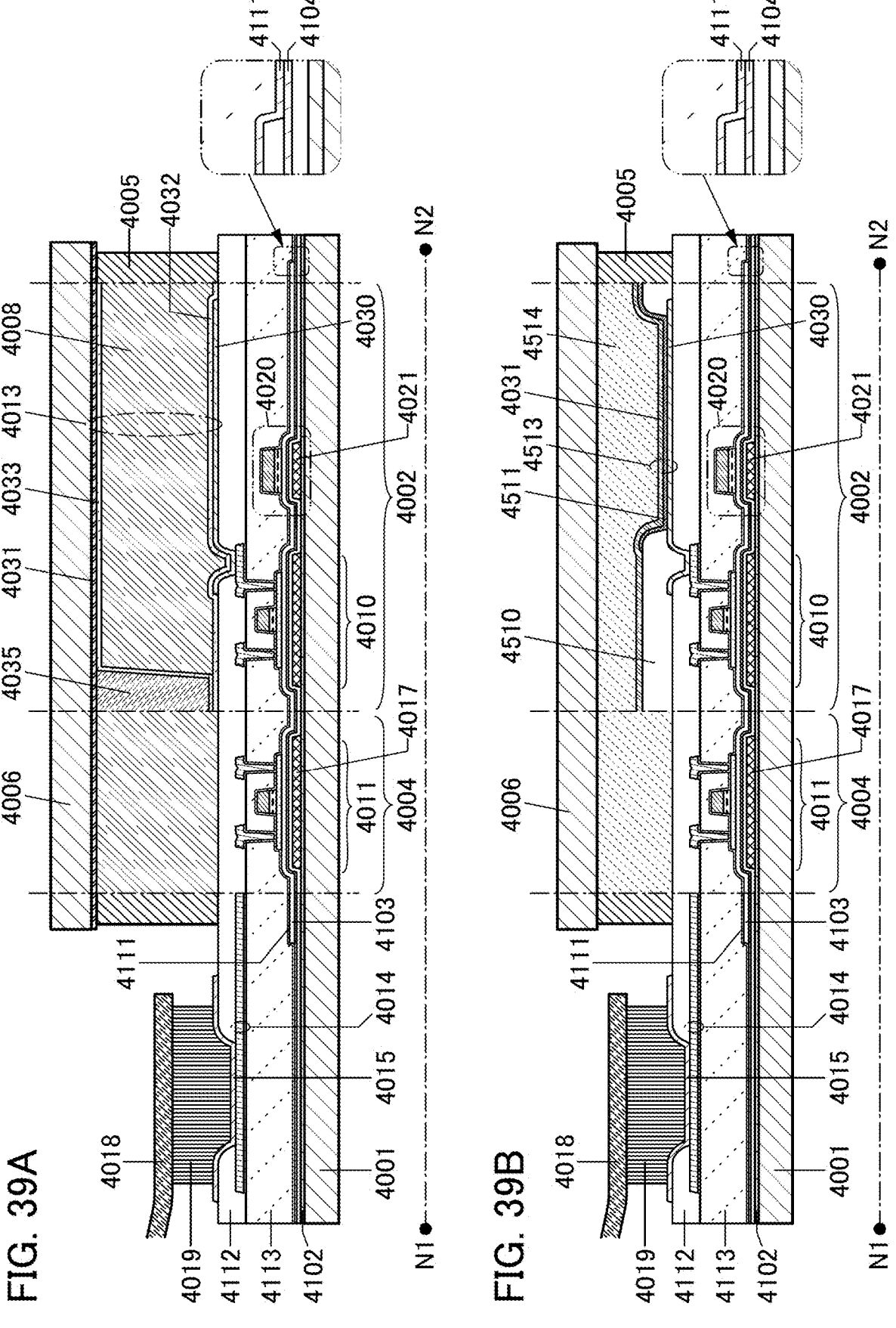
FIGS. 39A and 39B each illustrate an example of a display device.

FIGS. 38A and 38B and FIGS. 39A and 39B are cross-sectional views of a portion indicated by the chain line N1-N2 in FIG. 37B. As shown in FIGS. 38A and 38B and FIGS. 39A and 39B, the display device has an electrode 4015, and the electrode 4015 is electrically connected to a terminal included in the FPC 4018 through an anisotropic conductive layer 4019. In FIGS. 38A and 38B, the electrode 4015 is electrically connected to a wiring 4014 in an opening formed in insulating layers 4112, 4111, and 4110. In FIGS. 39A and 39B, the electrode 4015 is electrically connected to the wiring 4014 in an opening formed in the insulating layer 4112.

The electrode 4015 is formed of the same conductive layer as a first electrode layer 4030. The wiring 4014 is formed of the same conductive layer as source and drain electrodes of transistors 4010 and 4011.

The pixel portion 4002 and the scan line driver circuit 4004 provided over the first substrate 4001 include a plurality of transistors. In FIGS. 38A and 38B and FIGS. 39A and 39B, the transistor 4010 included in the pixel portion 4002 and the transistor 4011 included in the scan line driver circuit 4004 are shown as an example.

In the examples of FIGS. 38A and 38B, the transistors 4010 and 4011 are bottom-gate transistors. In the examples of FIGS. 39A and 39B, the transistors 4010 and 4011 are top-gate transistors.

In FIGS. 38A and 38B, the insulating layer 4112 is provided over the transistors 4010 and 4011. In FIG. 38B, a bank 4510 is formed over the insulating layer 4112. In FIGS. 39A and 39B, the insulating layer 4113 is provided over the transistors 4010 and 4011, and the insulating layer 4112 is provided over the insulating layer 4113. In FIG. 39B, the bank 4510 is formed over the insulating layer 4112.

The transistors 4010 and 4011 are provided over an insulating layer 4102. In FIGS. 38A and 38B, the transistors 4010 and 4011 include an electrode 4017 formed over the insulating layer 4111. In FIGS. 39A and 39B, the transistors 4010 and 4011 include the electrode 4017 formed over the insulating layer 4102. The electrode 4017 can serve as a backgate electrode.

Any of the transistors described in the above embodiments can be used as the transistors 4010 and 4011. An OS transistor is preferably used as the transistors 4010 and 4011. The OS transistor, which is unlikely to be changed in electrical characteristics, is electrically stable; accordingly, the display devices of this embodiment illustrated in FIGS. 38A and 38B can be highly reliable.

In the OS transistor, the current in an off state (off-state current) can be low. Accordingly, an electrical signal such as an image signal can be held for a longer period, and the interval between operations of writing an image signal or the like can be set longer. Thus, the frequency of refresh operation can be reduced, which leads to an effect of suppressing power consumption.

The OS transistor can have relatively high field-effect mobility and is thus capable of high-speed operation. Consequently, when the above transistor is used in a driver circuit portion or a pixel portion of a display device, high-quality images can be obtained. Moreover, the driver circuit portion and the pixel portion can be formed over one substrate with the use of OS transistors, so that the number of components of the display device can be reduced.

The display devices illustrated in FIGS. 38A and 38B and FIGS. 39A and 39B each include a capacitor 4020. The capacitor 4020 illustrated in each of FIGS. 38A and 38B includes an electrode 4021 formed in the same step as a gate electrode of the transistor 4010, and an electrode formed in the same step as a source electrode and a drain electrode of the transistor 4010. These electrodes overlap each other with an insulating layer 4103 placed therebetween. The capacitor 4020 illustrated in each of FIGS. 39A and 39B includes an electrode formed in the same step as the gate electrode of the transistor 4010, and the electrode 4021 formed in the same step as the electrode 4017. These electrodes overlap each other with the insulating layer 4103 placed therebetween.

In general, the capacitance of a capacitor provided in a pixel portion of a display device is set in consideration of leakage current or the like of a transistor provided in the pixel portion so that charges can be held for a predetermined period. The capacitance of the capacitor can be set in consideration of the off-state current of the transistor, or the like.

For example, when an OS transistor is used for a pixel portion of a liquid crystal display device, the capacitance of the capacitor can be one-third or smaller or one-fifth or smaller of the liquid crystal capacitance. Moreover, using an OS transistor can omit the formation of a capacitor.

The transistor 4010 included in the pixel portion 4002 is electrically connected to a display element. FIGS. 38A and 39A show examples of a liquid crystal display device using a liquid crystal element as a display element. In FIGS. 38A and 39A, a liquid crystal element 4013 that is the display element includes the first electrode layer 4030, a second electrode layer 4031, and a liquid crystal layer 4008. Insulating layers 4032 and 4033 serving as alignment films are provided so that the liquid crystal layer 4008 is placed therebetween. The second electrode layer 4031 is provided on the second substrate 4006 side, and the first electrode layer 4030 and the second electrode layer 4031 overlap each other with the liquid crystal layer 4008 placed therebetween.

A spacer 4035 is a columnar spacer obtained by selective etching of an insulating layer and is provided in order to control a distance between the first electrode layer 4030 and the second electrode layer 4031 (a cell gap). Alternatively, a spherical spacer may be used.

In the display device, a black matrix (a light-blocking layer), an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source.

The display device illustrated in each of FIGS. 38A and 38B and FIGS. 39A and 39B also includes the insulating layer 4111 and an insulating layer 4104. As the insulating layers 4104 and 4111, insulating layers through which an impurity element does not easily pass are used. A semiconductor layer of the transistor is sandwiched between the insulating layers 4104 and 4111, whereby entry of impurities from the outside can be prevented. Moreover, when the insulating layers 4104 and 4111 are in contact with each other outside the pixel portion 4002, the effect of preventing entry of impurities from the outside can be enhanced.

The insulating layer 4104 can be formed using a material and a method similar to those for the insulating layer 104, for example. The insulating layer 4111 can be formed using a material and a method similar to those for the insulating layer 110, for example.

As the display element included in the display device, a light-emitting element utilizing electroluminescence (EL element) can be used. An EL element includes a layer containing a light-emitting compound (also referred to as EL layer) between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, and a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. Then, carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

In addition to the light-emitting compound, the EL layer may also contain any of the following, for example: a substance with a high hole-injection property, a substance with a high hole-transport property, a hole-blocking material, a substance with a high electron-transport property, a substance with a high electron-injection property, and a substance with a bipolar property (a substance with a high electron- and hole-transport property).

The EL layer can be formed by an evaporation method (including a vacuum evaporation method), a transfer method, a printing method, an inkjet method, a coating method, or the like.

Inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions. An example of using an organic EL element as a light-emitting element is described here.

In order to extract light emitted from the light-emitting element, at least one of a pair of electrodes needs to be transparent. The light-emitting element can have a top-emission structure in which emitted light is extracted from the side opposite to a substrate where a transistor and the light-emitting element are formed, a bottom-emission structure in which emitted light is extracted from the substrate side, or a dual-emission structure in which emitted light is extracted from both the substrate side and the side opposite to the substrate.

FIGS. 38B and 39B illustrate examples of a light-emitting display device using a light-emitting element as a display element (such a device is also referred to as EL display device). A light-emitting element 4513 serving as a display element is electrically connected to the transistor 4010 provided in the pixel portion 4002. The structure of the light-emitting element 4513 is the stacked-layer structure including the first electrode layer 4030, a light-emitting layer 4511, and the second electrode layer 4031; however, this embodiment is not limited to this structure. The structure of the light-emitting element 4513 can be changed as appropriate depending on a direction in which light is extracted from the light-emitting element 4513, for example.

The bank 4510 is formed using an organic insulating material or an inorganic insulating material. It is particularly preferred that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. The protective layer can be formed using silicon nitride, silicon nitride oxide, aluminum oxide, aluminum nitride, aluminum oxynitride, aluminum nitride oxide, diamond like carbon (DLC), or the like. In a space that is formed with the first substrate 4001, the second substrate 4006, and the sealant 4005, a filler 4514 is provided for sealing. In this manner, the light-emitting element is preferably packaged (sealed) with a protective film (such as a laminate film or an ultraviolet curable resin film) or a cover member with high air-tightness and little degasification so that the light-emitting element is not exposed to the outside air.

As the filler 4514, an ultraviolet curable resin or a thermosetting resin can be used as well as an inert gas such as nitrogen or argon. For example, polyvinyl chloride (PVC), an acrylic-based resin, polyimide, an epoxy-based resin, a silicone-based resin, polyvinyl butyral (PVB), or ethylene vinyl acetate (EVA) can be used. A drying agent may be contained in the filler 4514.

For the sealant 4005, a glass material such as a glass frit, or a resin material such as a resin curable at room temperature (e.g., a two-component-mixture-type resin), a light curable resin, or a thermosetting resin can be used. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Furthermore, the polarizing plate or the circularly polarizing plate may be provided with an anti-reflection film. For example, it is possible to perform anti-glare treatment by which reflected light can be diffused by surface roughness to reduce glare.

When the light-emitting element has a microcavity structure, light with high color purity can be extracted. Furthermore, when a microcavity structure and a color filter are used in combination, glare can be reduced and visibility of a display image can be increased.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

The first electrode layer 4030 and the second electrode layer 4031 can also be formed using a conductive composition containing a conductive high molecule (also referred to as conductive polymer). As a conductive high molecule, a so-called 7C-electron conjugated conductive polymer can be used. Examples include polyaniline or a derivative thereof, polypyrrole or a derivative thereof, polythiophene or a derivative thereof, a copolymer of two or more of aniline, pyrrole, and thiophene or a derivative thereof.

Since the transistor is easily broken owing to static electricity or the like, a protective circuit for protecting the driver circuit is preferably provided. The protective circuit is preferably formed using a nonlinear element.

With the use of any of the transistors shown in the above embodiments, it is possible to provide a highly reliable display device; a display device that has a high resolution, a large size, and high display quality; and a display device with low power consumption.

<Display Module>

Figure 40:
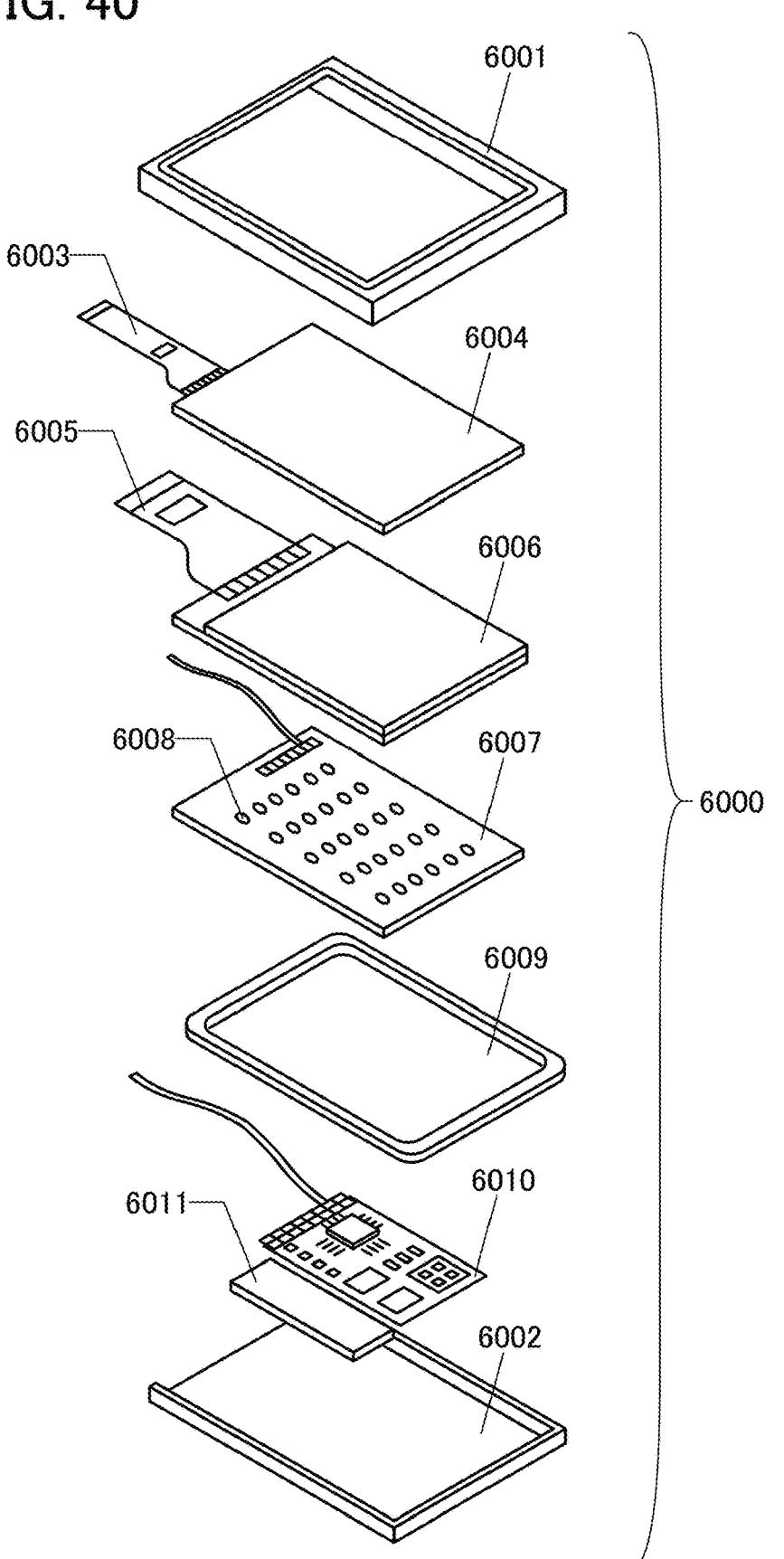
FIG. 40 illustrates an example of a display module.

A display module is described as an example of a semiconductor device using the above-described transistor. In a display module 6000 illustrated in FIG. 40, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

A semiconductor device of one embodiment of the present invention can be used, for example, for the touch sensor 6004, the display panel 6006, and an integrated circuit mounted on the printed circuit board 6010. For example, the above-described display device can be used for the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive touch panel or a capacitive touch panel and can overlap the display panel 6006. Moreover, the display panel 6006 can have a touch panel function. For example, an electrode for a touch sensor can be provided in each pixel of the display panel 6006 so that a capacitive touch panel function is added. Alternatively, a photosensor can be provided in each pixel of the display panel 6006 so that an optical touch sensor function is added. In the case where the touch sensor 6004 is not necessarily provided, the touch sensor 6004 can be omitted.

The backlight unit 6007 includes a light source 6008. The light source 6008 may be provided at an end portion of the backlight unit 6007, and a light diffusing plate may be used. When a light-emitting display device or the like is used for the display panel 6006, the backlight unit 6007 can be omitted.

The frame 6009 protects the display panel 6006 and functions as an electromagnetic shield for blocking electromagnetic waves generated from the printed circuit board 6010 side. The frame 6009 may also function as a radiator plate.

The printed circuit board 6010 includes a power supply circuit, a signal processing circuit for outputting a video signal and a clock signal, and the like. As a power source for supplying power to the power supply circuit, the battery 6011 or a commercial power source may be used. Note that the battery 6011 can be omitted when a commercial power source is used as the power source.

The display module 6000 can be additionally provided with a polarizing plate, a retardation plate, a prism sheet, or the like.

This embodiment can be implemented in appropriate combination with any of the structures described in the other embodiments and the like.

Embodiment 4

A transistor and/or a semiconductor device of one embodiment of the present invention can be used in a variety of electronic devices. FIGS. 41A to 41G and FIGS. 42A and 42B illustrate examples of electronic devices including the transistor and/or the semiconductor device of one embodiment of the present invention.

Examples of electronic devices including the semiconductor device of one embodiment of the present invention are display devices of televisions, monitors, and the like; lighting devices; desktop personal computers and laptop personal computers; word processors; image reproduction devices that reproduce still images and moving images stored in recording media such as digital versatile discs (DVD); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information appliances; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Other examples include industrial equipment such as guide lights, traffic lights, conveyor belts, elevators, escalators, industrial robots, power storage systems, and power storage devices for leveling the amount of power supply and smart grid.

In addition, moving objects driven by electric motors using electric power from the power storage devices are also included in the category of electronic devices. Examples of the moving objects include electric vehicles (EV), hybrid electric vehicles (HEV) that include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

Electronic devices illustrated in FIGS. 41A to 41G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 41A to 41G have a variety of functions. For example, the electronic devices in FIGS. 41A to 41G can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIGS. 41A to 41G are not limited to the above, and the electronic devices can have a variety of functions. Although not illustrated in FIGS. 41A to 41G, the electronic devices may have a plurality of display portions. The electronic devices may be provided with a camera or the like and have a function of taking a still image, a function of taking a moving image, a function of storing the taken image in a memory medium (an external memory medium or a memory medium incorporated in the camera), a function of displaying the taken image on the display portion, or the like.

Figure 41A:
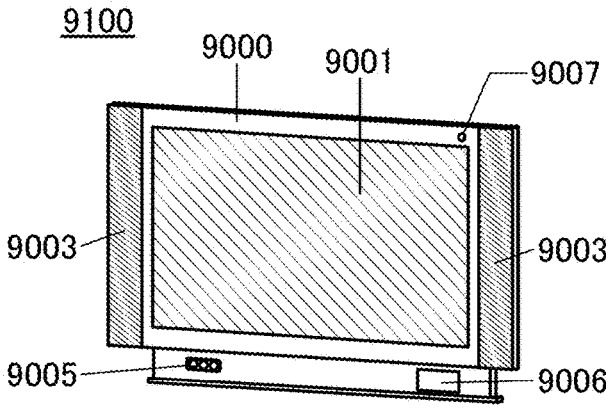
FIGS. 41A to 41G each illustrate an example of an electronic device.

FIG. 41A is a perspective view of a television device 9100. The television device 9100 can include the display portion 9001 having a large screen size of, for example, 50 inches or more, or 100 inches or more.

Figure 41D:
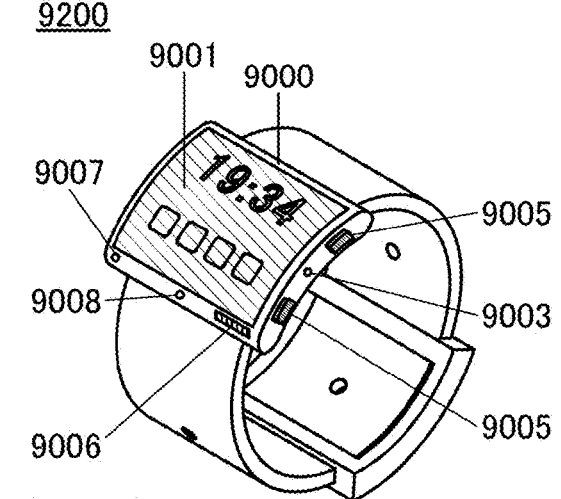
Figure 41B:
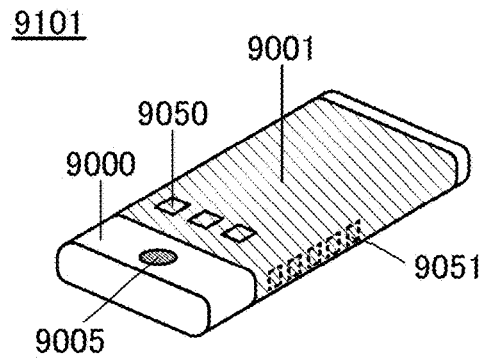

FIG. 41B is a perspective view of a portable information appliance 9101. The portable information appliance 9101 functions as, for example, one or more of a telephone set, a notebook, and an information browsing system. Specifically, the portable information appliance can be used as a smartphone. Note that the portable information appliance 9101 may include the speaker 9003, the connection terminal 9006, the sensor 9007, or the like. The portable information appliance 9101 can display letters and image information on its plurality of surfaces. For example, three operation buttons 9050 (also referred to as operation icons, or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 41E:
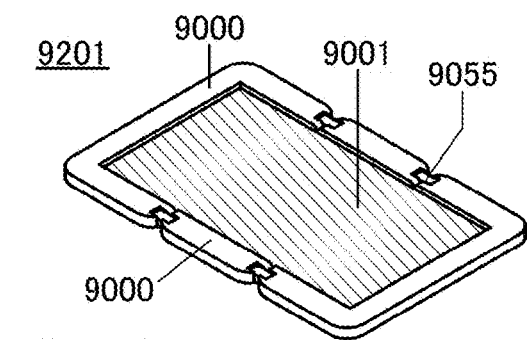
Figure 41C:
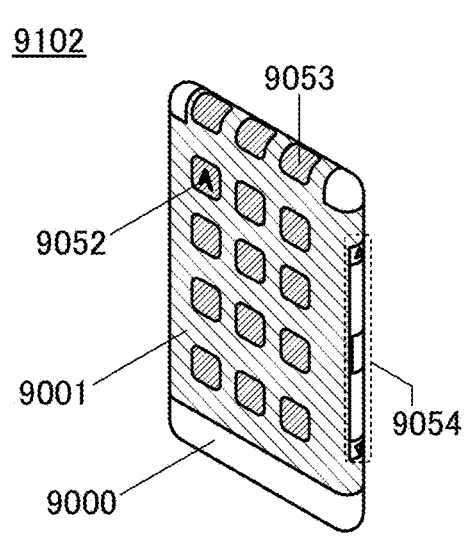

FIG. 41C is a perspective view of a portable information appliance 9102. The portable information appliance 9102 has a function of displaying information on three or more surfaces of the display portion 9001. Here, information 9052, information 9053, and information 9054 are displayed on different surfaces. For example, a user of the portable information appliance 9102 can see the display (here, the information 9053) with the portable information appliance 9102 put in a breast pocket of his/her clothes. Specifically, a caller's phone number, name, or the like of an incoming call is displayed in a position that can be seen from above the portable information appliance 9102. Thus, the user can see the display without taking out the portable information appliance 9102 from the pocket and decide whether to answer the call.

FIG. 41D is a perspective view of a watch-type portable information appliance 9200. The portable information appliance 9200 is capable of executing a variety of applications such as mobile phone calls, e-mailing, viewing and editing texts, music reproduction, Internet communication, and computer games. The display surface of the display portion 9001 is curved, and images can be displayed on the curved display surface. The portable information appliance 9200 can employ near field communication based on an existing communication standard. In that case, for example, mutual communication between the portable information appliance 9200 and a headset capable of wireless communication can be performed, and thus hands-free calling is possible. The portable information appliance 9200 includes the connection terminal 9006, and data can be directly transmitted to and received from another information appliance via a connector. Power charging through the connection terminal 9006 is possible. Note that the charging operation may be performed by wireless power feeding without using the connection terminal 9006.

Figure 41F:
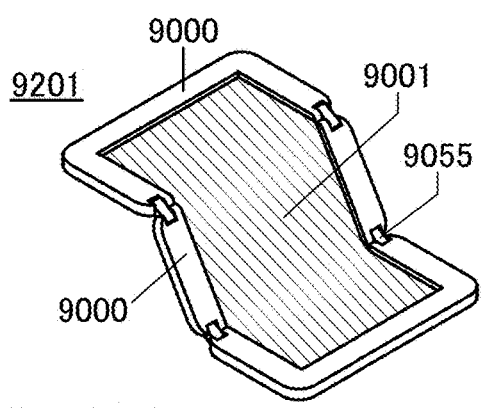
Figure 41G:
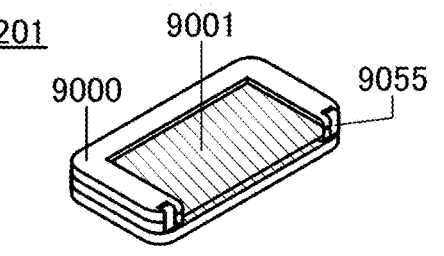

FIGS. 41E, 41F, and 41G are perspective views of a foldable portable information appliance 9201 that is opened, that is shifted from the opened state to the folded state or from the folded state to the opened state, and that is folded, respectively. The portable information appliance 9201 is highly portable when folded. When the portable information appliance 9201 is opened, a seamless large display region is highly browsable. The display portion 9001 of the portable information appliance 9201 is supported by three housings 9000 joined by hinges 9055. By folding the portable information appliance 9201 at a connection portion between two housings 9000 with the hinges 9055, the portable information appliance 9201 can be reversibly changed in shape from an opened state to a folded state. For example, the portable information appliance 9201 can be bent with a radius of curvature of greater than or equal to 1 mm and less than or equal to 150 mm.

Figures 42A, 42B:
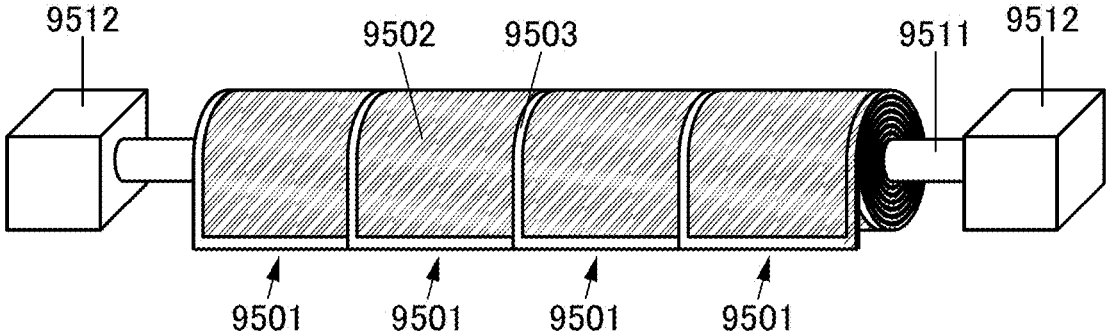
FIGS. 42A and 42B are perspective views illustrating an example of a display device.

FIGS. 42A and 42B show an example of an electronic device that is different from the electronic devices illustrated in FIGS. 41A to 41G. FIGS. 42A and 42B are perspective views of a display device including a plurality of display panels. The plurality of display panels are wound in the perspective view of FIG. 42A and are unwound in the perspective view of FIG. 42B.

A display device 9500 illustrated in FIGS. 42A and 42B includes a plurality of display panels 9501, a hinge 9511, and a bearing 9512. Each of the display panels 9501 includes a display region 9502 and a light-transmitting region 9503.

Each of the display panels 9501 is flexible. Two adjacent display panels 9501 are provided so as to partly overlap each other. For example, the light-transmitting regions 9503 of the two adjacent display panels 9501 can overlap each other. A display device having a large screen can be obtained with the plurality of display panels 9501. The display device is highly versatile because the display panels 9501 can be wound depending on its use.

The display regions 9502 of the adjacent display panels 9501 are separated from each other in FIGS. 42A and 42B. However, one embodiment of the present invention is not limited to this structure, and the display regions 9502 of the adjacent display panels 9501 may overlap each other without any space so that a continuous display region 9502 is obtained, for example.

The electronic devices described in this embodiment each include the display portion for displaying some sort of data. Note that the semiconductor device of one embodiment of the present invention can also be used for an electronic device that does not have a display portion.

This application is based on Japanese Patent Applications serial no. 2016-078286 and no. 2016-078347 filed with Japan Patent Office on Apr. 8, 2016, the entire contents of which are hereby incorporated by reference.

What is claimed is:

1. A semiconductor device comprising:
   a gate electrode over a substrate;
   a first insulating layer over the gate electrode;
   a second insulating layer over the first insulating layer;
   a third insulating layer over the second insulating layer;
   an oxide semiconductor layer over the third insulating layer;
   a source electrode and a drain electrode over the oxide semiconductor layer;
   a fourth insulating layer over the source electrode and the drain electrode;
   a fifth insulating layer over the fourth insulating layer; and
   a sixth insulating layer over the fifth insulating layer,
   wherein a portion of a top surface of the second insulating layer does not overlap with the third insulating layer, the fourth insulating layer, and the fifth insulating layer,
   wherein the sixth insulating layer is in contact with the portion of the top surface of the second insulating layer, and
   wherein a top surface of the fourth insulating layer in a region not overlapping with the oxide semiconductor layer, the source electrode, and the drain electrode is lower than a bottom surface of the oxide semiconductor layer.

2. The semiconductor device according to claim 1, wherein each of the second insulating layer and the sixth insulating layer includes one of aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

3. The semiconductor device according to claim 1, wherein the portion of the top surface of the second insulating layer surrounds an outer side of the oxide semiconductor layer in a plan view.

4. The semiconductor device according to claim 1, wherein the gate electrode extends beyond side edges of the oxide semiconductor layer in a channel length direction.

5. The semiconductor device according to claim 1, wherein the sixth insulating layer in a region overlapping with the gate electrode is in direct contact with a top surface of the fifth insulating layer.

6. The semiconductor device according to claim 1, wherein the third insulating layer comprises a first region having an island shape and a second region overlapping with any one of the gate electrode, the source electrode, and the drain electrode outside the first region.

7. The semiconductor device according to claim 1,
   wherein the gate electrode comprises copper, and
   wherein the first insulating layer is configured to inhibit diffusion of copper.

8. The semiconductor device according to claim 1,
   wherein each of the source electrode and the drain electrode comprises a first conductive layer and a second conductive layer comprising copper over the first conductive layer, wherein a side surface of the first conductive layer extends beyond a side surface of the second conductive layer in a channel length direction, and wherein the first conductive layer is configured to inhibit diffusion of copper.

9. A semiconductor device comprising:

a gate electrode over a substrate;

a first insulating layer over the gate electrode;

a second insulating layer over the first insulating layer;

a third insulating layer over the second insulating layer;

an oxide semiconductor layer over the third insulating layer;

a source electrode and a drain electrode over the oxide semiconductor layer;

a fourth insulating layer over the source electrode and the drain electrode;

a fifth insulating layer over the fourth insulating layer; and a sixth insulating layer over the fifth insulating layer, wherein an opening reaching a top surface of the second insulating layer is provided in the third insulating layer, the fourth insulating layer, and the fifth insulating layer, wherein the sixth insulating layer is in contact with the second insulating layer in the opening, and wherein a top surface of the fourth insulating layer in a region not overlapping with the oxide semiconductor layer, the source electrode, and the drain electrode is lower than a bottom surface of the oxide semiconductor layer.

10. The semiconductor device according to claim 9, wherein each of the second insulating layer and the sixth insulating layer includes one of aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

11. The semiconductor device according to claim 9, wherein the opening surrounds an outer side of the oxide semiconductor layer in a plan view.

12. The semiconductor device according to claim 9, wherein the gate electrode extends beyond side edges of the oxide semiconductor layer in a channel length direction.

13. The semiconductor device according to claim 9, wherein the sixth insulating layer in a region overlapping with the gate electrode is in direct contact with a top surface of the fifth insulating layer.

14. The semiconductor device according to claim 9, wherein the third insulating layer comprises a first region having an island shape and a second region overlapping with any one of the gate electrode, the source electrode, and the drain electrode outside the first region.

15. The semiconductor device according to claim 9, wherein the gate electrode comprises copper, and wherein the first insulating layer is configured to inhibit diffusion of copper.

16. The semiconductor device according to claim 9, wherein each of the source electrode and the drain electrode comprises a first conductive layer and a second conductive layer comprising copper over the first conductive layer, wherein a side surface of the first conductive layer extends beyond a side surface of the second conductive layer in a channel length direction, and wherein the first conductive layer is configured to inhibit diffusion of copper.

\* \* \* \* \*